US012677702B2

(12) United States Patent
Cok et al.

(10) Patent No.: US 12,677,702 B2
(45) Date of Patent: Jul. 7, 2026

(54) HYBRID DOCUMENTS

(71) Applicant: X-Celeprint Limited, Dublin (IE)

(72) Inventors: Ronald S. Cok, Rochester, NY (US);
António José Marques Trindade, Cork
(IE); Pierluigi Rubino, Cork (IE)

(73) Assignee: X-Celeprint Limited, Dublin (IE)

( * ) Notice: Subject to any disclaimer, the term of this
patent is extended or adjusted under 35
U.S.C. 154(b) by 361 days.

(21) Appl. No.: 18/094,276

(22) Filed: Jan. 6, 2023

(65) Prior Publication Data

US 2024/0153933 A1      May 9, 2024

Related U.S. Application Data

(60) Provisional application No. 63/422,422, filed on Nov.
3, 2022.

(51) Int. Cl.
H10W 90/00          (2026.01)
B42D 25/29          (2014.01)
          (Continued)
(52) U.S. Cl.
CPC ............ H10W 90/00 (2026.01); B42D 25/29
          (2014.10); B42D 25/305 (2014.10);
          (Continued)
(58) Field of Classification Search
CPC ....... H01L 25/167; H01L 25/16; H01L 24/82;
          H01L 23/00; H01L 2224/24137;
          (Continued)

(56) References Cited

U.S. PATENT DOCUMENTS 5,394,969 A      3/1995    Harbaugh
5,439,840 A      8/1995    Jones, Jr. et al.
          (Continued)

FOREIGN PATENT DOCUMENTS

KR      2009/0061862 A      6/2009
KR      2012/0074556 A      7/2012
WO      WO-2021/219833 A2    11/2021

OTHER PUBLICATIONS

Bower, C., Micro-Transfer Printing (µTP): Technology Overview,
X-Celeprint Ltd., 47 pages, (2014), http://ste.ieee.org/ocs-cpmt/files/
2013/06/CPMT_2014.02.11_V1iTP.pdf.
          (Continued)

*Primary Examiner* — Justin V Lewis
(74) *Attorney, Agent, or Firm* — Choate, Hall & Stewart
LLP; Michael D. Schmitt

(57)          ABSTRACT

A hybrid document includes a flexible document and a
component having a component substrate disposed in or on
the flexible document. One or more inorganic light-emitting
diodes, a controller electrically connected to the one or more
inorganic light-emitting diodes for controlling the one or
more inorganic light-emitting diodes, and a piezoelectric
power source are disposed on the component substrate. The
power source can include a plurality of electrically con-
nected individual piezoelectric power-source elements elec-
trically connected to the controller, the inorganic light-
emitting diodes, or both. Each of the one or more inorganic
light-emitting diodes, the controller, the component sub-
strate, or each of the individual piezoelectric power-source
elements can comprise a broken or separated tether. The
component substrate can be a flexible substrate that is more
flexible than any one of the inorganic light-emitting diodes,
the controller, and the individual piezoelectric power-source
elements.

21 Claims, 54 Drawing Sheets

(51) Int. Cl.

| | |
|---|---|
| *B42D 25/305* | (2014.01) |
| *B42D 25/355* | (2014.01) |
| *G06K 19/02* | (2006.01) |
| *G06K 19/07* | (2006.01) |
| *G06K 19/077* | (2006.01) |
| *H10N 39/00* | (2026.01) |
| *H10W 70/05* | (2026.01) |
| *H10W 90/10* | (2026.01) |

(52) U.S. Cl.
CPC ......... *B42D 25/355* (2014.10); *G06K 19/025* (2013.01); *G06K 19/0713* (2013.01); *G06K 19/07705* (2013.01); *H10N 39/00* (2023.02); *H10W 70/093* (2026.01); *H10W 90/10* (2026.01)

(58) Field of Classification Search
CPC ....... H01L 2224/82005; H01L 25/0753; H01L 25/075; B42D 25/29; B42D 25/305; B42D 25/355; G06K 19/025; G06K 19/02; G06K 19/0713; G06K 19/07; G06K 19/07705; G06K 19/077; H10N 39/00
USPC ....... 283/72, 83, 94, 98, 107, 109, 110, 117, 283/901
See application file for complete search history.

(56) References Cited

U.S. PATENT DOCUMENTS

| | | | |
|---|---|---|---|
| 5,633,552 A | 5/1997 | Lee et al. | |
| 5,636,270 A | 6/1997 | Davey | |
| 6,078,229 A | 6/2000 | Funada et al. | |
| 6,131,718 A | 10/2000 | Witschorik | |
| 6,535,407 B1 | 3/2003 | Zaitsu | |
| 6,547,151 B1 | 4/2003 | Baldi | |
| 6,566,981 B2 | 5/2003 | Urabe et al. | |
| 6,627,966 B2 | 9/2003 | Jeong et al. | |
| 6,911,708 B2 | 6/2005 | Park | |
| 7,463,117 B2 | 12/2008 | Ohara et al. | |
| 7,622,367 B1 | 11/2009 | Nuzzo et al. | |
| 7,799,699 B2 | 9/2010 | Nuzzo et al. | |
| 7,982,364 B2 | 7/2011 | Takayama et al. | |
| 8,056,820 B2 | 11/2011 | Camus et al. | |
| 8,253,536 B2 | 8/2012 | Kaminska et al. | |
| 8,387,886 B2 | 3/2013 | Tompkin et al. | |
| 8,391,688 B2 | 3/2013 | Zhang et al. | |
| 8,506,867 B2 | 8/2013 | Menard | |
| 8,618,721 B2 | 12/2013 | Ichikawa et al. | |
| 8,722,458 B2 | 5/2014 | Rogers et al. | |
| 8,791,822 B2 | 7/2014 | Delia et al. | |
| 8,889,485 B2 | 11/2014 | Bower | |
| 8,901,802 B1 | 12/2014 | Que | |
| 9,013,272 B2 | 4/2015 | Kaminska et al. | |
| 9,691,873 B2 | 6/2017 | Rogers et al. | |
| 9,997,102 B2 | 6/2018 | Rotzoll et al. | |
| 10,008,483 B2 | 6/2018 | Cok et al. | |
| 10,037,985 B2 | 7/2018 | De Winter et al. | |
| 10,109,753 B2 | 10/2018 | Bower et al. | |
| 10,150,325 B2 | 12/2018 | Cok et al. | |
| 10,150,326 B2 | 12/2018 | Cok et al. | |
| 10,193,025 B2 | 1/2019 | Bower et al. | |
| 10,198,890 B2 | 2/2019 | Rotzoll et al. | |
| 10,200,013 B2 | 2/2019 | Bower et al. | |
| 10,217,730 B2 | 2/2019 | Bower et al. | |
| 10,294,131 B2 | 5/2019 | Andelman | |
| 10,339,434 B2 | 7/2019 | Cox | |
| 10,361,677 B2 | 7/2019 | Bower et al. | |
| 10,804,880 B2 | 10/2020 | Cok | |
| 10,839,280 B2 | 11/2020 | Cox | |
| 11,274,035 B2 | 3/2022 | Gul et al. | |
| 2002/0197844 A1 | 12/2002 | Johnson et al. | |
| 2005/0150740 A1 | 7/2005 | Finkenzeller et al. | |
| 2005/0240778 A1 | 10/2005 | Saito | |
| 2007/0103666 A1 | 5/2007 | Ottens et al. | |
| 2008/0079333 A1 | 4/2008 | Ulm et al. | |
| 2008/0094775 A1 | 4/2008 | Sneh et al. | |
| 2008/0108171 A1 | 5/2008 | Rogers et al. | |
| 2008/0157235 A1 | 7/2008 | Rogers et al. | |
| 2009/0002199 A1 | 1/2009 | Lainonen et al. | |
| 2009/0009244 A1 | 1/2009 | Banba | |
| 2009/0243278 A1 | 10/2009 | Camus et al. | |
| 2010/0123268 A1 | 5/2010 | Menard | |
| 2010/0271174 A1* | 10/2010 | Kaminska | B42D 25/29 235/491 |
| 2010/0317132 A1 | 12/2010 | Rogers et al. | |
| 2011/0062826 A1 | 3/2011 | Umeki et al. | |
| 2011/0140578 A1 | 6/2011 | Ko et al. | |
| 2011/0221569 A1 | 9/2011 | Hamel et al. | |
| 2012/0038463 A1 | 2/2012 | Kaminska et al. | |
| 2012/0212101 A1 | 8/2012 | Tabata et al. | |
| 2012/0250002 A1 | 10/2012 | Cronin et al. | |
| 2012/0320581 A1 | 12/2012 | Rogers et al. | |
| 2013/0043767 A1 | 2/2013 | Yamamoto et al. | |
| 2013/0065564 A1 | 3/2013 | Conner et al. | |
| 2013/0082569 A1 | 4/2013 | Hirabayashi et al. | |
| 2013/0140649 A1 | 6/2013 | Rogers et al. | |
| 2013/0185201 A1 | 7/2013 | Jain et al. | |
| 2014/0062389 A1 | 3/2014 | Ide et al. | |
| 2014/0097944 A1 | 4/2014 | Fastert et al. | |
| 2014/0300095 A1 | 10/2014 | Tompkin et al. | |
| 2015/0125829 A1 | 5/2015 | Hyman | |
| 2015/0141767 A1 | 5/2015 | Rogers et al. | |
| 2015/0255701 A1 | 9/2015 | Kobayashi | |
| 2015/0372053 A1 | 12/2015 | Bower et al. | |
| 2015/0373793 A1 | 12/2015 | Bower et al. | |
| 2016/0093600 A1 | 3/2016 | Bower et al. | |
| 2016/0107472 A1 | 4/2016 | Garcia Juez et al. | |
| 2016/0108581 A1 | 4/2016 | Olmos et al. | |
| 2016/0149555 A1 | 5/2016 | Sarata et al. | |
| 2017/0038408 A1 | 2/2017 | Ha et al. | |
| 2017/0141115 A1 | 5/2017 | Bower et al. | |
| 2017/0246899 A1 | 8/2017 | Cok et al. | |
| 2017/0249983 A1 | 8/2017 | Park et al. | |
| 2017/0301282 A1 | 10/2017 | Rotzoll et al. | |
| 2017/0302336 A1 | 10/2017 | Rotzoll et al. | |
| 2017/0313119 A1 | 11/2017 | Cok et al. | |
| 2017/0345243 A1 | 11/2017 | Rotzoll et al. | |
| 2018/0013211 A1 | 1/2018 | Ricci | |
| 2018/0199127 A1 | 7/2018 | Hosoi et al. | |
| 2018/0276678 A1 | 9/2018 | Leobandung | |
| 2019/0058242 A1 | 2/2019 | Tabe | |
| 2019/0143737 A1* | 5/2019 | Willner | H01L 25/165 283/83 |
| 2019/0236427 A1 | 8/2019 | Micali | |
| 2020/0076372 A1 | 3/2020 | Schroegendorfer | |
| 2020/0296825 A1 | 9/2020 | Ozdoganlar et al. | |
| 2021/0002128 A1 | 1/2021 | Cok et al. | |
| 2021/0120650 A1* | 4/2021 | Meitl | H01L 23/52 |
| 2021/0135648 A1 | 5/2021 | Trindade et al. | |
| 2021/0135649 A1 | 5/2021 | Trindade et al. | |
| 2021/0169417 A1 | 6/2021 | Burton | |
| 2021/0336114 A1* | 10/2021 | Bower | H01L 21/6835 |
| 2021/0339552 A1 | 11/2021 | Cok et al. | |
| 2021/0342659 A1 | 11/2021 | Cok et al. | |
| 2022/0001192 A1 | 1/2022 | Kim | |
| 2022/0005919 A1 | 1/2022 | Li et al. | |
| 2022/0112078 A1 | 4/2022 | Rubino | |
| 2022/0115582 A1 | 4/2022 | Tsuruoka | |
| 2022/0131519 A1 | 4/2022 | Ohnishi et al. | |
| 2022/0146076 A1 | 5/2022 | Bourke, Jr. et al. | |
| 2022/0223781 A1 | 7/2022 | Sadr | |
| 2022/0238790 A1 | 7/2022 | Rotzoll et al. | |
| 2022/0285291 A1 | 9/2022 | Trindade et al. | |
| 2022/0344970 A1 | 10/2022 | Affleck et al. | |
| 2023/0055056 A1 | 2/2023 | Suzuki | |
| 2023/0168138 A1 | 6/2023 | Hou et al. | |
| 2023/0351235 A1 | 11/2023 | Clark et al. | |
| 2024/0006674 A1 | 1/2024 | Osada et al. | |

(56)                References Cited

U.S. PATENT DOCUMENTS

| | | |
|---|---|---|
| 2024/0152718 A1 | 5/2024 | Yee et al. |
| 2024/0348228 A1 | 10/2024 | Stolt et al. |

OTHER PUBLICATIONS

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335-341, (2011).

International Search Report, International Application No. PCT/EP2021/061358, 6 pages, (mailed Nov. 18, 2021).

Written Opinion, International Application No. PCT/EP2021/061358, 9 pages, (mailed Nov. 18, 2021).

* cited by examiner

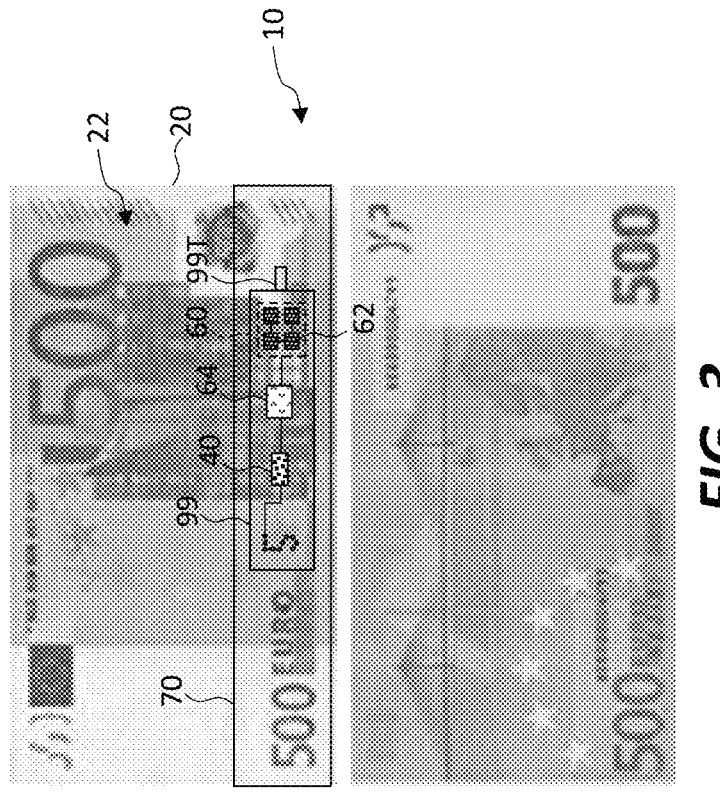
*FIG. 3*
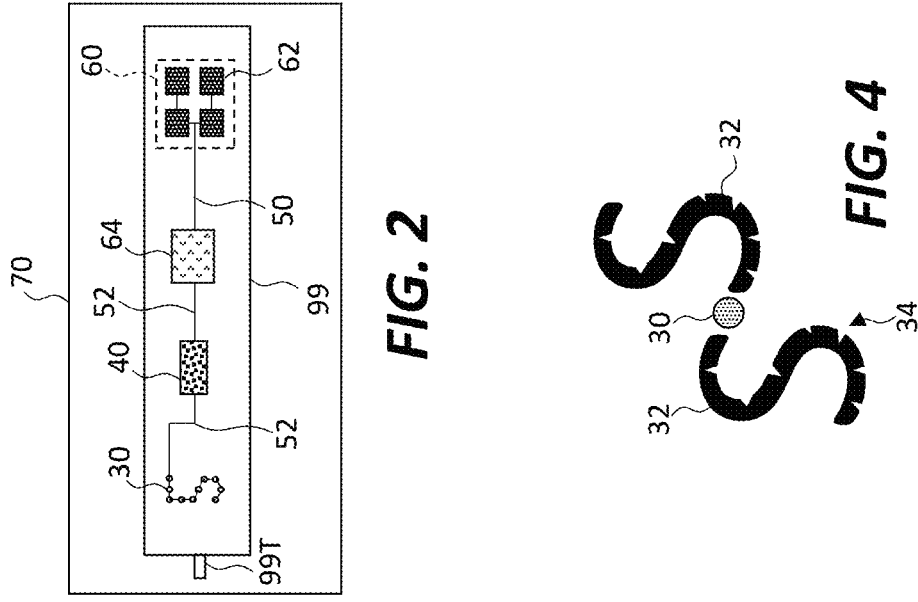
*FIG. 2*
*FIG. 4*

HYBRID DOCUMENTS

PRIORITY APPLICATION

This application claims the benefit of U.S. Provisional Patent No. 63/422,422 filed on Nov. 3, 2022, the disclosure of which is hereby incorporated by reference herein in its entirety.

CROSS REFERENCE TO RELATED APPLICATIONS

Reference is made to U.S. Pat. No. 10,150,325 filed Feb. 15, 2017, entitled "Hybrid Banknote with Electronic Indicia" by Cok et al., to U.S. Pat. No. 10,198,890 filed May 18, 2016, entitled "Hybrid Banknote with Electronic Indicia Using Near-Field Communications" by Rotzoll et al, to U.S. patent application Ser. No. 16/865,257 filed May 1, 2020 entitled "Hybrid Documents with Electronic Indicia" by Cok et al, and to U.S. patent application Ser. No. 17/588,888 filed Jan. 11, 2022, entitled "Printable Component Modules with Flexible, Polymer, or Organic Component Substrates" by Trindade et al, the disclosures of each of which is incorporated by reference herein in its entirety.

FIELD

The present disclosure relates generally to printable and flexible modules disposed in a flexible document such as a banknote.

BACKGROUND

Monetary instruments issued by governments such as money or currency are used throughout the world today. Government-issued currency typically includes banknotes (also known as paper currency or bills) having visible markings printed on high-quality paper, plastic, or paper impregnated with other materials, such as plastic. The visible markings indicate the denomination (value) of the banknote, includes a serial number, and has decorations such as images, and anti-counterfeiting structures such as special threads, ribbons, and holograms. Currency circulates within an economic system as a medium of monetary exchange having a fixed value until it is physically worn out. Worn out banknotes are generally returned by banks or other financial institutions and then replaced.

Other privately issued monetary instruments are also used, such as credit cards and gift cards. These cards typically include an electronically accessible value (e.g., stored in a magnetic stripe or in a chip in the card) or an electronically accessible account that can be used to make purchases. However, the value of the card is not readily viewed by a user without special equipment, such as a reader.

In the past, banknotes have not been electronically enabled. However, more recently there have been proposals to use RFID (radio-frequency identification device) in banknotes to validate the banknote and avoid counterfeiting. For example, U.S. Pat. Nos. 8,391,688 and 8,791,822 disclose systems for currency validation. U.S. Pat. No. 5,394,969 describes a capacitance-based verification device for a security thread embedded within currency paper to defeat counterfeiting. Security systems for scanning a paper banknote and checking identification information in the banknote (e.g., the serial number) with a network-accessible database have been proposed, for example in U.S. Pat. No. 6,131,718.

In all of these systems, however, there is no way to visibly test a banknote without using a separate electronic or optical reader.

Substrates with components such as electronically active devices or other structures distributed over the extent of the substrate can be used in a variety of electronic systems. A variety of methods may be used to distribute components over a substrate, including forming the components on the substrate, for example forming thin-film transistors made using photolithographic methods and materials on the substrate, and forming the components on separate wafers using integrated circuit techniques and transferring the components to a substrate, for example using vacuum grippers, pick-and-place tools, or micro-transfer printing.

One exemplary micro-transfer printing method for transferring active devices from a source wafer to a target substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947 and in *Inorganic light-emitting diode displays using micro-transfer printing* published in the Journal of the Society for Information Display 25/10, 2017, 1071-0922/17/2510-06, DOI #10.1002/jsid.610, p. 589. In this approach, small integrated circuits are formed over a patterned sacrificial layer on the process side of a crystalline wafer. The small integrated circuits, or chiplets, are released from the wafer by etching the patterned sacrificial layer beneath the circuits. A PDMS stamp is pressed against the wafer and the process side of the chiplets is adhered to the stamp. The chiplets are removed from the wafer by the stamp and are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

Small transfer-printed components can be micro-assembled into modules and the modules can be micro-assembled into systems. For example, U.S. Pat. No. 10,217,730 discloses providing a source wafer with source devices, micro-assembling the source devices onto an intermediate support of an intermediate wafer to make an intermediate device, and then micro-assembling the intermediate device from the intermediate wafer to a destination substrate. In this way, a large variety of heterogeneous source components can be micro-assembled and interconnected in a common module (e.g., a micro-module) and the module can be employed in an electronic or optoelectronic system comprising a variety of materials.

There remains a need therefore, for currency that is electronically accessible with visible indicia without using a separate electronic or optical reader.

SUMMARY

In some embodiments, inter alia, the present disclosure provides a hybrid currency banknote, one or more light-controlling elements, for example inorganic light-emitting diodes (iLEDs) such as micro-light-emitting diodes, and a controller disposed in or on the banknote and electrically connected to control the light-controlling elements to emit light. The hybrid currency banknote can have visible markings. A power source such as a piezoelectric device with or without a power convertor is electrically connected to the controller, to one or more light-controlling elements, or to both. The power source can comprise one or more individual power-source elements, for example piezoelectric individual power-source elements. In various embodiments, the visible markings include printed images or value indicators. The light-controlling elements can form a graphic indicator such as a number, letter, or pictogram or can highlight a visible marking on the banknote. The light-controlling elements can form a display, for example a monochrome or full-color display.

In some embodiments, any one or more of the light-controlling elements, power source, a power convertor, and a controller are disposed in a component (e.g., electrically with wires or directly optically connected or optically connected with light pipes in the component). The component can be printed on the pre-printed banknote or printed on a ribbon or thread that is subsequently woven or otherwise incorporated into the banknote. When operated by applying pressure to the piezoelectric power source, the controller controls the light-controlling elements to emit light, for example in a spatial pattern defining a graphic element, or in a temporal pattern (for example with flashing lights or sequentially flashing lights), or both. Different light-controlling elements can be activated in response to sequential squeezes of the piezoelectric power source or sequential squeezes can be used to generate sufficient power to emit light. Each of the one or more light-controlling elements, power source, power converter, and controller are component elements of the component. The power source can itself include multiple individual component elements, referred to as power-source elements. The currency can also include light pipes (optical waveguides), or diffusers arranged in association with the light-controlling elements. The light pipes can conduct light to desired locations on the banknote or can form patterns such as graphic indicators. The light pipes can include light-emitting portions, for example diffusers, along the length of the light pipes to emit light at locations along the length of the light pipe as well as at the end of the light pipe. The controller can include a memory, for example a read-only memory or a write-once memory storing one or more values and the light-controlling elements can be controlled to display numerals corresponding to the values.

A method of making a hybrid currency banknote includes providing a banknote having visible markings, a wafer having a plurality of micro-transfer printable light-controlling elements, a wafer having a plurality of controllers, a wafer having individual power-source elements, and a wafer having component substrates. One or more of the light-controlling elements, at least one controller, optionally a power converter, and one or more individual power-source elements of a power source are disposed on the component substrate, for example by micro-transfer printing from respective source wafers, to make a component and the component is subsequently embedded in the banknote, for example by micro-transfer printing onto the banknote or onto a thread or ribbon that is subsequently incorporated into the banknote. The controller can be electrically connected to the one or more light-controlling elements and to a piezo-electric power source, for example by micro-transfer printing the piezoelectric power source (e.g., the individual power-source elements) onto the component substrate.

Hybrid currency banknotes of the present disclosure can be used by receiving the banknote and squeezing (e.g., pressing) the piezoelectric power source. Upon squeezing the power source, the controller controls the light-controlling elements to emit light that is viewed by a user of the banknote to validate the banknote.

An issuer of the hybrid currency banknote can provide a memory with a value or write the value to a memory in the banknote (e.g., in the controller) to provide the banknote with an electronically recorded value. In some embodiments, the memory can be programmed with a sequence of power-source activations matching a predetermined code, for example temporally successive squeezes or presses of the power source. Alternatively, the temporally successive squeezes can be detected by the controller to undertake an action, such as a particular pattern (temporal or spatial) of light emission.

In some embodiments, inter alia, a hybrid high-security document comprises one or more light-emitting components disposed on or embedded in a document with or without visible markings. The hybrid high-security document or one or more light-emitting components can comprise an electronic circuit. The electronic circuit can include a memory storing information relevant to the hybrid high-security document or its use, for example a read-only memory or a write-once memory storing one or more values. The document can be a conventional printed document such as a label, a commercial document such as a certificate, a stock certificate, a bond, or a bearer bond or a government-issued document such as a passport, a monetary instrument, or a license and can include additional anti-counterfeiting features such as are found in high-security documents. In some embodiments, and as described herein, a banknote is a high-security document. Other high-security documents include passports and identification cards such as driver's licenses or other government-issued identification. In some embodiments, a multi-element light-emitting system comprises a plurality of independent light-emitting components. The independent light-emitting components can be disposed in a pattern to form a visible indicator.

A method of making a hybrid high-security document includes providing a document having visible markings, providing a source having a plurality of printable light-emitting components, and printing one or more of the light-emitting components onto the document or onto a flexible substrate, ribbon, film, or thread subsequently incorporated in, laminated to, or woven into the document.

According to some embodiments of the present disclosure, a hybrid document comprises a flexible document having visible markings and a component embedded in or on the flexible document or in or on a ribbon or thread incorporated into the flexible document. The component can comprise a component substrate, one or more relatively rigid inorganic light-emitting diodes disposed on the component substrate, a controller disposed on the component substrate and electrically connected to the one or more inorganic light-emitting diodes for controlling the one or more inorganic light-emitting diodes, and a power source electrically connected to (i) the controller, (ii) the one or more inorganic light-emitting diodes, or (iii) both (i) and (ii).

According to some embodiments, the component comprises a power convertor disposed on the component substrate connected to the power source and the controller or the one or more inorganic light-emitting diodes to convert the power provided from the power source to a form that is used by the controller or the inorganic light-emitting diodes. In some embodiments, the power convertor is the controller, or the controller is the power convertor in a single device or electrical circuit. Either the power convertor or controller can comprise multiple circuit elements. The power convertor can comprise (but is not limited to) a unitary capacitor, a disaggregated capacitor comprising multiple capacitors electrically connected in parallel, a diode, or any one or combination of these.

The one or more inorganic light-emitting diodes can each comprise a fractured or separated tether, the controller (or power convertor) can comprise a fractured or separated tether, each of the individual power-source elements can comprise a fractured or separated tether, the component or component substrate can comprise a fractured or separated tether, or any one or combination of these. Fractured or separated tethers can be a consequence of micro-transfer printing, for example by fracturing or separating each light-emitting diode tether that connected the one or more of the plurality of inorganic light-emitting diodes to a light-emitting diode source wafer, by fracturing or separating each controller tether that connected the at least one of the plurality of controllers to a controller source wafer, by fracturing or separating each individual power-source tether that connected the at least one of the plurality of individual power-source elements to an individual power-source wafer, and by fracturing or separating each power convertor tether that connected the at least one of the plurality of power convertors to the power convertor source wafer to provide a component.

In some embodiments, the power source is provided in the component, for example on the component substrate. The power source or component can be indicated by the visible markings, the power source or component can form a part of the visible markings, or the power source or component can be obscured by the visible markings. In some embodiments, the component is disposed in a location corresponding to a portion of the visible markings to indicate (e.g., highlight) the portion of the visible markings. The controller can control the one or more inorganic light-emitting diodes to flash or flash sequentially.

In some embodiments, the power source comprises a plurality of electrically connected individual power-source elements. In some embodiments, the power convertor comprises a plurality of electrically connected individual power-convertor elements.

The flexible document can be a government-issued banknote (e.g., a high-security document) indicated by the visible markings. In some embodiments, the hybrid document is a banknote, a bond, a stock certificate, a commercial certificate, a printed value-bearing document, an identification document, or a government-issued document. The flexible document can include a flexible substrate that includes paper, plastic, or impregnated paper, and the component and component substrate can be printed (e.g., micro-transfer printed) on the flexible substrate. In some embodiments, the flexible document comprises a ribbon or thread woven into the flexible document and the component is disposed on the ribbon or thread.

According to some embodiments, a plurality of components is disposed on the flexible document in a random arrangement, in a regular array, or in a desired arrangement.

In some embodiments, methods of the present disclosure comprise providing a component source wafer having relatively rigid component substrates (compared to the flexible document). The relatively rigid component substrates can be connected by component tethers to the component source wafer and the method can comprise printing the components after printing the at least one of the plurality of controllers, the one or more of the plurality of inorganic light-emitting diodes, and the one or more individual power-source elements to the component substrate.

In some embodiments, the at least one of the plurality of controllers is electrically connected to the one or more of the plurality of light-emitting diodes, the individual power-source elements, or the power converter before the component is printed in or on the flexible banknote or the ribbon or thread. In some embodiments, the at least one of the plurality of controllers is electrically connected to the one or more of the plurality of light-emitting diodes, the individual power-source elements, or the power converter after the component is printed in or on the flexible banknote or the ribbon or thread.

According to some embodiments of the present disclosure, a hybrid document comprises a document and a component. The component can comprise a power source disposed on or in the document, a controller disposed in or on the document and electrically connected to the individual power-source element, and a light-emitting diode (LED) (e.g., an inorganic light-emitting diode (iLED)) disposed in or on the document. The controller can be an integrated circuit or can be a simple circuit comprising a diode, rectifier, or bridge circuit with or without capacitors. In some embodiments, the power source, the controller, and the inorganic light-emitting diode are comprised in a circuit that emits light from the inorganic light-emitting diode in response to power received from the power source. According to some embodiments, the document has a document surface and any one or combination of the circuit, the power source, the controller, and the inorganic light-emitting diode can comprise a component that is disposed on the document surface or on the surface of a structure provided in or on the document.

According to some embodiments, the hybrid document or component comprises a component substrate disposed on the document and the individual power-source element, the controller, the power source, and the inorganic light-emitting diode are each disposed on or in the component substrate. A plurality of individual power-source elements can be disposed on the component substrate, for example by micro-transfer printing. In some embodiments, the document is flexible or is more flexible than the component substrate. The component substrate can be more flexible than any one or more of the individual power-source elements, the controller, and the inorganic light-emitting diode (e.g., the component elements). In some embodiments, the component substrate comprises a fractured or separated component tether.

In some embodiments of the present disclosure, the hybrid document comprises a plurality of components disposed on the document. Each component can comprise a respective component substrate and a respective circuit comprising component elements. The component elements of each circuit can comprise at least a respective light-emitting diode, a respective controller, and a respective power source. Each circuit can be disposed on a different component substrate and each component substrate can be independent and separate from any other component substrate of any other component and is disposed on the document surface or structure (or structure surface) disposed in or on the document.

According to some embodiments, the circuit comprises a capacitor electrically connected to the power source such that power transmitted from the power source is stored in the capacitor and subsequently discharged to cause the light-emitting diode to emit the light. In some embodiments, the hybrid document comprises a plurality of inorganic light-emitting diodes connected to the circuit and disposed on the document.

According to embodiments of the present disclosure, methods comprise providing the component substrate on a component source wafer, releasing the component substrate from the component source wafer, and disposing the component substrate on a document.

In some examples of the present disclosure, a component comprises a component substrate, component elements disposed on the component substrate, and at least a portion of a component tether in contact with or a part of the component substrate. Component elements comprise can any one or more of inorganic light-emitting diodes, a controller, a power converter, and a power source (e.g., individual power-source elements). The component substrate can be flexible and can comprise an organic material, a polymer, or a polyimide. The component tether can be more brittle than the component substrate. The component substrate can have a first flexibility that is more flexible than a second flexibility of any one or all of the component elements. In some embodiments, the component tether comprises an organic material, a polymer, a photoresist, an inorganic material, a crystalline inorganic material, an amorphous inorganic material, silicon oxide, or silicon nitride. According to some embodiments, the component is disposed, for example by micro-transfer printing, from a component source wafer to a target system substrate. The system substrate can be more flexible than the component substrate. The system substrate can be a document substrate or substrate of a structure incorporated into the document, such as a ribbon or thread.

In some embodiments, an encapsulation layer is disposed over one or more of the component elements and the component substrate, or both. Some or all of the component elements can be at least partly disposed in a mechanically neutral stress plane of the component. The encapsulation layer can comprise an organic material, the encapsulation layer can comprise a layer of organic material and a layer of inorganic material, the encapsulation layer can comprise a layer of inorganic material and a layer of organic material that is thicker than the layer of inorganic material, the encapsulation layer can comprise a layer of inorganic material disposed between layers of organic material, the encapsulation layer can comprise alternating layers of inorganic material and layers of organic material, the encapsulation layer can comprise a same material as the component substrate, or any combination of these. The encapsulation layer can have a non-planar topography or define or comprise an anti-stiction structure, for example on a side of the component opposite the component substrate. An anti-stiction structure can be disposed on the encapsulation layer or the component substrate. The encapsulation layer can comprise a lower encapsulation sublayer disposed on, over, or in contact with the component substrate and component elements and can comprise an upper encapsulation sublayer disposed on the lower encapsulation sublayer. The component substrate and the encapsulation together can entirely encapsulate the component. The component substrate can comprise spikes that protrude from the component substrate in a direction opposite the component elements. The spikes can be an anti-stiction structure. The spikes and the component substrate can comprise a common material.

According to some embodiments of the present disclosure, component-element interconnections (e.g., electrical or optical connections) are connected to the component elements and disposed on or between layers of the encapsulation layer. In some embodiments, component-element interconnections are connected to the component elements and disposed within the encapsulation layer and the encapsulation layer comprises component-element interconnection vias. In some embodiments, the component-element interconnections are disposed on the lower encapsulation sublayer and the upper encapsulation sublayer is disposed over, on, or in contact with the component-element interconnections. Interconnections can be wavy or serpentine interconnections.

According to some embodiments, the component substrate comprises any one or combination of an organic material, a layer of organic material and a layer of inorganic material, a layer of inorganic material and a layer of organic material that is thicker than the layer of inorganic material, a layer of inorganic material disposed between layers of organic material, or alternating layers of inorganic material and layers of organic material.

According to some embodiments, the component or any of the component elements is an integrated circuit, is an electronic, optical, electromagnetic, or optoelectronic device, is a semiconductor device, is a piezoelectric device, is an acoustic filter, is a bare die, is a color converter, or comprises multiple devices. The component can comprise a component tether or be connected to or in contact with a component tether. The component tether can extend from an edge of the component substrate, for example in a direction substantially parallel to a surface of the component substrate on which the component elements are disposed. The component tether can be disposed in a layer that extends over the component substrate or can be disposed in or a portion of an encapsulating layer. The component tether can be disposed in a common layer with the component substrate or can be a part of the component substrate or comprise common materials or be formed in a common step with the component substrate. A portion of each of a plurality of component tethers can be in contact with the component substrate or encapsulation layer. According to some embodiments, at least a portion of a component encapsulating layer can be at least a portion of a component tether. According to some embodiments, the component substrate comprises at least a portion of a component tether. According to some embodiments, a component element comprises at least a portion of a component tether. According to some embodiments, the at least a portion of a component tether extends laterally from the component substrate. According to some embodiments, the at least a portion of a component tether is a broken or separated tether. According to some embodiments, the at least a portion of a component tether physically connects the component substrate to a component source wafer.

In some embodiments of the present disclosure, the component substrate has a length or width greater than 200 microns (e.g., no smaller than 400 microns, no smaller than 500 microns, no smaller than 700 microns, or no smaller than 1000 microns). In some embodiments of the present disclosure, the component or any of the component elements has a length or width no greater than 200 microns (e.g., no greater than 100 microns, no greater than 50 microns, no greater than 20 microns, no greater than 10 microns, or no greater than 5 microns) and, optionally, a thickness no greater than 100 microns (e.g., no greater than 50 microns, no greater than 20 microns, no greater than 10 microns, or no greater than 5 microns).

A component element, for example a passive electrical component such as a resistor, capacitor, inductor, conductor, or an antenna, can be formed on or in the component substrate. The component element can be connected to other component elements, for example with a component-element interconnection such as a wire or light pipe. Multiple component elements can be interconnected with component-element interconnections. Devices or controllers external to the component can be connected to the component-element interconnections.

According to some embodiments of the present disclosure, a component comprises a component substrate comprising an internal component cavity surrounded by the component substrate, and a component element disposed on the component substrate or in the component cavity. The component substrate can be flexible, the component substrate can comprise an organic material, the component tether can be more brittle than the component substrate, the component element can have a component flexibility less than a component substrate flexibility, or at least a portion of a component tether can contact the component substrate.

According to some embodiments of the present disclosure, a component system comprises a system substrate and one or more components, e.g., a document comprising a document substrate and one or more components disposed on the document substrate. Each component can comprise a flexible component substrate and a component element disposed on the component substrate. According to some embodiments, the system (e.g., document) substrate is more flexible than the component substrate, the system substrate is a security paper, the system substrate is a banknote, the system substrate is paper, polymer, or a combination of paper and polymer, the system substrate comprises any one or combination of a security strip, Mylar", a holographic structure, a foil, a metalized surface, or an aluminized surface, or any combination of these.

According to some embodiments of the present disclosure, a component source wafer comprises a wafer, a sacrificial layer comprising sacrificial portions laterally separated by anchors disposed on the wafer or forming a layer of the wafer, and a component disposed entirely on and directly over each sacrificial portion, wherein the component comprises a flexible component substrate and one or more component elements disposed on the flexible component substrate.

According to embodiments of the present disclosure, a component source wafer comprises a wafer, a sacrificial layer comprising sacrificial portions laterally separated by anchors disposed on the wafer or forming a layer of the wafer, a component disposed entirely on and directly over each sacrificial portion, and a component tether connecting each component to an anchor.

According to embodiments of the present disclosure, a method of making a component source wafer, comprises providing a wafer comprising a sacrificial layer comprising sacrificial portions laterally separated by anchors, disposing a component substrate exclusively on and directly over each sacrificial portion, disposing one or more component element(s) on each component substrate, the component substrate more flexible than one or more of the component element(s), and providing a component tether connecting the component substrate to an anchor. Methods of the present disclosure can comprise disposing an encapsulation layer over the component elements. Methods of the present disclosure can comprise etching the sacrificial portions. Methods of the present disclosure can comprise transfer printing the component to a system substrate, e.g., a document substrate. In some embodiments the system substrate is no less flexible or is more flexible than the component substrate.

According to some embodiments of the present disclosure, a component source wafer comprises a wafer, a sacrificial layer comprising sacrificial portions laterally separated by anchors disposed on the wafer or forming a layer of the wafer and internal anchors, and a component disposed entirely on and directly over each of the sacrificial portions. The component comprises (i) a component substrate comprising an internal component cavity through and surrounded by the component substrate that is aligned with one or more of the internal anchors and (ii) component element(s) disposed on the component substrate and the component is physically connected to each of the one or more internal anchors by an internal component tether. According to some embodiments, the component is connected to one of the anchors by a component tether. The internal component tether can be smaller than the component tether (e.g., by at least 25%, at least 30%, at least 40%, or at least 50%), each of the internal anchors can be smaller than the anchors, or both.

According to some embodiments, one or more anti-stiction structures protrude from the component substrate toward the wafer through the sacrificial portion. The anti-stiction structures can comprise a dielectric, can consist exclusively of one or more dielectric materials, or can be non-electrically conductive. The component substrate can have at least one of a width and a length greater than 200 microns (e.g., no smaller than 400 microns, no smaller than 500 microns, no smaller than 700 microns, or no smaller than 1000 microns). The component substrate can be disposed at least partially in a same plane relative to a surface of the wafer as the internal anchors. The internal component tether can laterally extend from the component substrate into the internal component cavity.

According to some embodiments of the present disclosure, a method of making a component source wafer comprises providing a component source wafer comprising a sacrificial layer comprising sacrificial portions laterally separated by anchors, providing internal anchors in the sacrificial layer, disposing a component substrate entirely on and directly over each of the sacrificial portions, wherein the component substrate comprises an internal component cavity through and surrounded by the component substrate and the internal component cavity is aligned with one or more of the internal anchors, forming an internal component tether that physically connects the component substrate to one of the internal anchors, and providing a component on the component substrate to form a component. The component substrate can be flexible. The component substrate can comprise an organic material, a polymer, or a polyimide. The component substrate can have at least one of a width and a length greater than 200 microns (e.g., no smaller than 400 microns, no smaller than 500 microns, no smaller than 700 microns, or no smaller than 1000 microns).

Some embodiments of the present disclosure comprise forming the internal anchors before disposing the component substrate. Some embodiments of the present disclosure comprise patterning the internal component cavity and subsequently forming the internal anchors.

Some embodiments of the present disclosure can comprise etching the sacrificial portions at least in part by etching through the internal component cavity. Some embodiments can comprise disposing the component substrate entirely on and directly over each of the sacrificial portions and subsequently patterning the internal component cavity. Some embodiments can comprise patterning the sacrificial portions to form the internal anchors. Some embodiments can comprise forming the internal anchors and subsequently disposing the sacrificial portions such that the sacrificial portions are laterally separated by the anchors. Some embodiments can comprise printing one or more components from the component source wafer thereby breaking or separating any internal tether that had physically connected the one or more components to the component source wafer.

According to some embodiments of the present disclosure, a component system comprises a system substrate and one or more components disposed on the system substrate. The system substrate can be flexible and can be more flexible than the component substrate.

According to embodiments of the present disclosure, a component comprises a component substrate having a top side and an opposing bottom side, wherein the component substrate is flexible, a component disposed on the top side of the component substrate, and a component tether. The component tether (i) extends beyond the component substrate and (ii) extends beneath only a portion of the bottom side of the component substrate, within only a portion of the component substrate, or both. Thus, at least a portion of the component tether extends and is disposed beyond the component substrate, e.g., extends from an edge or side of the component substrate, and at least a portion of the component tether extends and is disposed in contact with only a portion of the bottom side of the component substrate or within (inside) the component substrate, or both. In some embodiments, the component tether extends beneath only a portion of the bottom side of the component substrate. In some embodiments, the component tether extends only within a portion of the component substrate, e.g., a portion of the component substrate is disposed above a portion of the component tether and a portion of the component substrate is disposed beneath the component tether. In some embodiments, the component tether further extends on only a portion of the top side of the component substrate.

According to some embodiments, the component tether is more rigid than the component substrate. The component substrate can be organic, and the component tether can be inorganic. The component substrate can be polyimide, the component tether can be an oxide or a nitride, or both. The component tether can comprise or be made of silicon dioxide or silicon nitride. According to some embodiments, the component tether is broken (e.g., fractured).

In some embodiments, a component comprises a second component tether wherein the second component tether extends (i) beyond the component substrate and (ii) beneath only a portion of the bottom side of the component substrate, within only a portion of the component substrate, or both.

Some embodiments comprise an encapsulation layer disposed on the component substrate and the component element(s), and the component tether extends on only a portion of the encapsulation layer. Some embodiments comprise an encapsulation layer disposed on the component substrate and the component element(s), and the encapsulation layer extends over only a portion of the component tether. The encapsulation layer can comprise (e.g., is or includes) a same material as the component substrate.

According to embodiments of the present disclosure, a component source wafer comprises a wafer and a component comprising a component tether suspended over the wafer by one or more component tethers defining a gap between the component and the wafer. The component substrate can be curved and, in some embodiments, is not in contact with the wafer other than by the component tether(s).

According to embodiments of the present disclosure, a component source wafer comprises a wafer, a sacrificial layer comprising sacrificial portions laterally separated by anchors disposed on the wafer or forming a layer of the wafer, and a component comprising a component tether disposed directly on and entirely over each of the sacrificial portions such that the component tether is connected to one of the anchors. Each of the sacrificial portions can comprise a low-adhesion surface on which the component is at least partially disposed.

According to embodiments of the present disclosure, a method of making a component comprises providing a component source wafer and removing the component from the wafer with a stamp, thereby breaking (e.g., fracturing) the component tether.

According to embodiments of the present disclosure, a method of making a component comprises providing a component source wafer, the component source wafer comprising: (i) a peeling layer comprising peeling portions laterally separated by anchors disposed on the wafer or forming a layer of the wafer and (ii) a respective component comprising a component tether disposed directly on and entirely over each of the peeling portions, wherein the component tether of the component is connected to one of the anchors, and removing the respective component from the wafer with a stamp by peeling the component substrate of the component off of the peeling portion from a corner or edge of the component substrate of the component. Removing the component from the wafer with the stamp can comprise moving the stamp laterally in a direction away from the corner or edge.

Certain embodiments of the present disclosure provide components with flexible component substrates micro-transfer printed onto a more-flexible system substrate.

In some examples of the present disclosure, a component (e.g., a micro-component) comprises a component substrate (e.g., a module), component element(s) disposed on the component substrate, and at least a portion of a component tether in contact with the component substrate. The component substrate can be flexible and can comprise an organic material, a polymer, or a polyimide. The component tether can be more brittle than the component substrate. The component substrate can have a first flexibility that is more flexible than a second flexibility of the component element(s). In some embodiments, the component tether comprises an organic material, a polymer, a photoresist, an inorganic material, a crystalline inorganic material, an amorphous inorganic material, silicon oxide, or silicon nitride. According to some embodiments, the component is disposed, for example by micro-transfer printing, from a component source wafer to a target system substrate. The system substrate can be more flexible than the component substrate.

In some embodiments, an encapsulation layer is disposed over the component element(s), the component substrate, or both. The component element(s) can be at least partly disposed in a mechanically neutral stress plane of the component. The encapsulation layer can comprise an organic material, the encapsulation layer can comprise a layer of organic material and a layer of inorganic material, the encapsulation layer can comprise a layer of inorganic material and a layer of organic material that is thicker than the layer of inorganic material, the encapsulation layer can comprise a layer of inorganic material disposed between layers of organic material, the encapsulation layer can comprise alternating layers of inorganic material and layers of organic material, the encapsulation layer can comprise a same material as the component substrate, or any combination of these. The encapsulation layer can have a non-planar topography or define an anti-stiction structure, for example on a side of the component opposite the component substrate or protruding from the component substrate. The encapsulation layer can comprise a lower encapsulation sublayer disposed on, over, or in contact with the component substrate and component element(s) and can comprise an upper encapsulation sublayer disposed on the lower encapsulation sublayer. The component substrate and the encapsulation layer together can entirely encapsulate the component. The component substrate can comprise spikes that protrude from the component substrate in a direction opposite the component element(s). The spikes can be an anti-stiction structure and can be non-conducting (e.g., be or comprise a dielectric), unlike connection posts. The spike and the component substrate can comprise a common material.

According to some embodiments of the present disclosure, component-element interconnections are connected to the component element(s) and are disposed on the encapsulation layer. In some embodiments, component-element interconnections are connected to the component element(s) and are disposed within the encapsulation layer and the encapsulation layer comprises component-element interconnection vias. In some embodiments, the component-element interconnections are disposed on the lower encapsulation sublayer and the upper encapsulation sublayer is disposed over, on, or in contact with the component-element interconnections. Interconnections can be wavy or serpentine interconnections such as wires or light pipes.

According to some embodiments, the component substrate comprises any one or combination of an organic material, a layer of organic material and a layer of inorganic material, a layer of inorganic material and a layer of organic material that is thicker than the layer of inorganic material, a layer of inorganic material disposed between layers of organic material, or alternating layers of inorganic material and layers of organic material.

According to some embodiments, the component or component element(s) is an integrated circuit, is an electronic, optical, electromagnetic, or optoelectronic device, is a semiconductor device, is a piezoelectric device, is an acoustic filter, is a bare die, is a color converter, is a light emitter such as an inorganic light-emitting diode or comprises multiple devices. The component can comprise a component tether or be connected to or in contact with a component tether. The component tether can extend from an edge of the component substrate, for example in a direction substantially parallel to a surface of the component substrate on which the component is disposed. The component tether can be disposed in a layer that extends over the component substrate or can be disposed in or a portion of an encapsulating layer. A portion of each of a plurality of component tethers can be contact with the component substrate or encapsulation layer.

According to some embodiments, at least a portion of a component tether can be at least a portion of a component tether. According to some embodiments, the component substrate comprises at least a portion of a component tether. According to some embodiments, the component comprises at least a portion of a component tether. According to some embodiments, the at least a portion of a component tether extends laterally from the component substrate. According to some embodiments, the at least a portion of a component tether is a broken or separated tether. According to some embodiments, the at least a portion of a component tether physically connects the component to a source wafer.

A component element, for example a passive electrical component such as a resistor, capacitor, inductor, conductor, or an antenna, can be formed on or in the component substrate. The component element can be connected to the component, for example with a component-element interconnection. Multiple components can be interconnected with component-element interconnections. Devices or controllers external to the component can be connected to component-element interconnections.

According to some embodiments of the present disclosure, a component comprises a component substrate comprising an internal component cavity surrounded by the component substrate and a component disposed on the component substrate. The component substrate can be flexible, the component substrate can comprise an organic material, the component tether can be more brittle than the component substrate, the component can have a component flexibility less than a component substrate flexibility, or at least a portion of a component tether can contact the component substrate.

According to some embodiments of the present disclosure, a component system comprises a system substrate and one or more components. Each component can comprise a flexible component substrate and a component element disposed on the component substrate. According to some embodiments, the system substrate is more flexible than the component substrate, the system substrate is a security paper, the system substrate is a banknote, the system substrate is paper, polymer, or a combination of paper and polymer, the system substrate comprises any one or combination of a security strip, Mylar, a holographic structure, a foil, a metalized surface, or an aluminized surface, or any combination of these.

According to some embodiments of the present disclosure, a component source wafer comprises a wafer, a sacrificial layer comprising sacrificial portions laterally separated by anchors disposed on the wafer or forming a layer of the wafer, and a component disposed entirely on and directly over each sacrificial portion, wherein the component comprises a flexible component substrate and one or more component element(s) disposed on the flexible component substrate.

According to embodiments of the present disclosure, a component source wafer comprises a wafer, a sacrificial layer comprising sacrificial portions laterally separated by anchors disposed on the wafer or forming a layer of the wafer, a component disposed entirely on and directly over each sacrificial portion, and a component tether connecting each component to an anchor.

According to embodiments of the present disclosure, a method of making a component source wafer comprises providing a component source wafer comprising a sacrificial layer comprising sacrificial portions laterally separated by anchors, disposing a component substrate exclusively on and directly over each sacrificial portion, disposing one or more component element(s) on each component substrate, the component substrate more flexible than the component element(s), and providing a component tether connecting the component substrate to an anchor. Methods of the present disclosure can comprise disposing an encapsulation layer over the component element(s). Methods of the present disclosure can comprise etching the sacrificial portions. Methods of the present disclosure can comprise transfer printing the component to a system substrate. In some embodiments the system substrate is no less flexible or is more flexible than the component substrate.

According to some embodiments of the present disclosure, a component source wafer, comprises a wafer, a sacrificial layer comprising sacrificial portions laterally separated by anchors disposed on the wafer or forming a layer of the wafer and internal anchors, and a component disposed entirely on and directly over each of the sacrificial portions. The component comprises (i) a component substrate comprising an internal component cavity through and surrounded by the component substrate that is aligned with one or more of the internal anchors and (ii) one or more component element(s) disposed on the component substrate and the component element(s) are physically connected to each of the one or more internal anchors by an internal component tether. According to some embodiments, the component element(s) are connected to one of the anchors by a component tether. The internal component tether can be smaller than the component tether (e.g., by at least 25%, at least 30%, at least 40%, or at least 50%), each of the internal anchors can be smaller than the anchors, or both.

According to some embodiments, one or more anti-stiction structures protrude from the component substrate toward the wafer into or through the sacrificial portion, e.g., the one or more anti-stiction structures are on a bottom side of the component substrate. In some embodiments, one or more anti-stiction structure can protrude from the component substrate away from the wafer, e.g., the one or more anti-stiction structures are on a top side of the component substrate. The component substrate can be disposed at least partially in a same plane relative to a surface of the wafer as the internal anchors. The internal component tether can laterally extend from the component substrate into the internal component cavity.

According to some embodiments of the present disclosure, a method of making a component source wafer comprises providing a component source wafer comprising a sacrificial layer comprising sacrificial portions laterally separated by anchors, providing internal anchors in the sacrificial layer, disposing a component substrate entirely on and directly over each of the sacrificial portions, wherein the component substrate comprises an internal component cavity through and surrounded by the component substrate and the internal component cavity is aligned with one or more of the internal anchors, forming an internal component tether that physically connects the component substrate to one of the internal anchors, and providing (e.g., disposing or forming) a component element on the component substrate to make a component. The component substrate can be flexible. The component substrate can comprise an organic material, a polymer, or a polyimide.

Some embodiments of the present disclosure comprise forming the internal anchors before disposing the component substrate. Some embodiments of the present disclosure comprise patterning the internal component cavity and subsequently forming the internal anchors.

Some embodiments of the present disclosure can comprise etching the sacrificial portions at least in part by etching through the internal component cavity. Some embodiments can comprise disposing the component substrate entirely on and directly over each of the sacrificial portions and subsequently patterning the internal component cavity. Some embodiments can comprise patterning the sacrificial portions to form the internal anchors. Some embodiments can comprise forming the internal anchors and subsequently disposing the sacrificial portions such that the sacrificial portions are laterally separated by the anchors. Some embodiments can comprise printing one or more components from the component source wafer thereby breaking or separating any internal tether that had physically connected the one or more components to the component source wafer.

According to some embodiments of the present disclosure, a component system comprises a system substrate and one or more components disposed on the system substrate. The system substrate can be flexible and can be more flexible than the component substrate.

According to embodiments of the present disclosure, a component comprises a component substrate having a top side and an opposing bottom side, wherein the component substrate is flexible, a component element disposed on the top side of the component substrate, and a component tether. The component tether extends (i) beyond the component substrate and (ii) beneath only a portion of the bottom side of the component substrate, within only a portion of the component substrate, or both. Thus, at least a portion of the component tether extends and is disposed beyond the component substrate, e.g., extends from an edge or side of the component substrate, and at least a portion of the component tether extends and is disposed in contact with only a portion of the bottom side of the component substrate or within (inside) the component substrate, or both. In some embodiments, the component tether extends beneath only a portion of the bottom side of the component substrate. In some embodiments, the component tether extends only within a portion of the component substrate, e.g., a portion of the component substrate is disposed above a portion of the component tether and a portion of the component substrate is disposed beneath the component tether. In some embodiments, the component tether further extends on only a portion of the top side of the component substrate.

According to some embodiments, the component tether is more rigid than the component substrate. The component substrate can be organic, and the component tether can be inorganic or comprise inorganic material. The component substrate can be polyimide, the component tether can comprise or be an oxide or a nitride, or both. The component tether can be made of or comprise silicon dioxide or silicon nitride. According to some embodiments, the component tether is broken (e.g., fractured) or separated.

In some embodiments, a component comprises a second component tether wherein the second component tether extends (i) beyond the component substrate and (ii) beneath only a portion of the bottom side of the component substrate, within only a portion of the component substrate, or both.

Some embodiments comprise an encapsulation layer disposed on the component substrate and the component element(s), and the component tether extends on only a portion of the encapsulation layer. Some embodiments comprise an encapsulation layer disposed on the component substrate and the component element(s), and the encapsulation layer extends over only a portion of the component tether. The encapsulation layer can comprise (e.g., is or includes) a same material as the component substrate.

According to embodiments of the present disclosure, a component source wafer comprises a wafer and a component suspended over the wafer by one or more component tethers defining a gap between the component and the wafer. The component substrate can be curved and, in some embodiments, is not in contact with the wafer other than by the component tether(s).

According to embodiments of the present disclosure, a component source wafer comprises a wafer, a sacrificial layer comprising sacrificial portions laterally separated by anchors disposed on the wafer or forming a layer of the wafer, and a component comprising a component tether disposed directly on and entirely over each of the sacrificial portions such that the component tether is connected to one of the anchors. Each of the sacrificial portions can comprise a low-adhesion surface on which the component is at least partially disposed.

According to embodiments of the present disclosure, a method of making a component comprises providing a component source wafer and removing the component from the wafer with a stamp, thereby breaking (e.g., fracturing) the component tether.

According to embodiments of the present disclosure, a method of making a component comprises providing a component source wafer, the component source wafer comprising: (i) a peeling layer comprising peeling portions laterally separated by anchors disposed on the wafer or forming a layer of the wafer and (ii) a respective component disposed directly on and entirely over each of the peeling portions, wherein the component tether of the component is connected to one of the anchors, and removing the respective component from the wafer with a stamp by peeling the component substrate of the component off of the peeling portion from a corner or edge of the component substrate of the component. Removing the component from the wafer with the stamp can comprise moving the stamp laterally in a direction away from the corner or edge.

In some embodiments, the present disclosure provides, inter alia, components that include a flexible component substrate for use in hybrid sheets. The hybrid sheets can be documents, such as, for example, banknotes, or other sheets, such as, for example, packaging sheets or security sheets. A sheet can be polymer, paper, metal (e.g., foil), or other material. A component can include one or more light controlling components, such as, for example light-emitting diode(s) such as inorganic micro-light-emitting diodes. A component can include a power source, such as a piezoelectric power source. A power source can include a plurality of individual power-source elements. Each individual power-source element can be spatially separated from other individual power-source elements and can be operable to generate power, for example be a piezoelectric power-source element. Power-source elements can be electrically connected (e.g., in series, in parallel, or in a combination of in series and in parallel) on a component substrate (e.g., with one or more wires) to form a power source. Power from a power source can be used to power one or more light-controlling components. A component can include a controller operable to control one or more light-controlling components. A power source can be electrically connected to a controller to provide power to the controller. A power source can be electrically connected to one or more light-controlling components through a controller. A component can act as a security feature for the hybrid sheet, for example a security feature on a banknote to secure against counterfeiting. A hybrid sheet [e.g., document (e.g., banknote)] can include multiple components.

In some aspects, the present disclosure is directed to a hybrid document, including: a flexible document having visible markings; and a component embedded in or on the flexible document, the component including: a component substrate; one or more inorganic light-emitting diodes disposed on the component substrate; a controller disposed on the component substrate and electrically connected to the one or more inorganic light-emitting diodes for controlling the one or more inorganic light-emitting diodes; a piezoelectric power source disposed on the component substrate comprising a plurality of electrically connected individual piezoelectric power sources (e.g., individual piezoelectric power-source elements), wherein the piezoelectric power source is electrically connected to the controller, the inorganic light-emitting diodes, or both; wherein (i) each of the one or more inorganic light-emitting diodes comprises a broken (e.g., fractured) or separated tether, (ii) the controller comprises a broken (e.g., fractured) or separated tether, (iii) the component substrate comprises a broken (e.g., fractured)

or separated tether, (iv) the individual piezoelectric power sources comprise a broken (e.g., fractured) or separated tether, or (v) any one or combination of (i), (ii), (iii), and (iv); and wherein the component substrate is a flexible substrate that is more flexible than any one of the inorganic light-emitting diodes, controller, and individual piezoelectric power-source elements.

In some embodiments, the flexible document is more flexible than the component substrate.

In some embodiments, the hybrid document further includes electrically conductive wires disposed at least partly on or within the component substrate or encapsulation layer that electrically connect the piezoelectric power source to one or more of the inorganic light-emitting diodes and the controller.

In some embodiments, the electrically conductive wires are disposed exclusively on the component substrate and any one combination of the piezoelectric power source, the inorganic light-emitting diodes, and the controller.

In some embodiments, the power source is indicated by the visible markings, the power source forms a part of the visible markings, or the power source is obscured by the visible markings.

In some embodiments, the component is disposed in a location corresponding to a portion of the visible markings to indicate (e.g., highlight) the portion of the visible markings.

In some embodiments, the controller is operable to cause the inorganic light-emitting diodes to blink or emit light after a delay in response to power provided by the piezoelectric power source.

In some embodiments, the component includes a power converter disposed on the component substrate connected to the piezoelectric power source and connected to at least one of the controllers and the one or more inorganic light-emitting diodes, wherein the power converter converts the power provided from the piezoelectric power source to a form that is used by at least one of the controller and the inorganic light-emitting diodes.

In some embodiments, the power converter includes (i) a unitary capacitor, (ii) a disaggregated capacitor comprising multiple separate and individual capacitors electrically connected in parallel, (iii) a diode, or (iv) any one or combination of (i), (ii), and (iii).

In some embodiments, the flexible document is a government-issued currency banknote indicated by the visible markings.

In some embodiments, the flexible document includes a flexible substrate that comprises paper, plastic, or impregnated paper, and the component substrate is printed on the flexible substrate.

In some embodiments, the flexible document includes a ribbon or thread woven into the flexible document and the component is disposed on the ribbon or thread.

In some embodiments, the individual piezoelectric power sources are adjacent to each other on the component substrate.

In some embodiments, the individual piezoelectric power sources are disposed on the component substrate within an area of from 0.1 cm 2 to 4.0 cm 2, from 0.1 cm 2 to 2.0 cm 2, from 0.25 cm 2 to 1.5 cm 2, or from 0.5 cm 2 to 1.0 cm 2.

In some embodiments, the hybrid document further includes one or more light pipes located in association with the one or more inorganic light-emitting diodes to transmit light emitted by the inorganic light-emitting diode into one end of each of the one or more light pipes and emit the transmitted light from the opposite end of each of the one or more light pipes.

In some embodiments, the one or more inorganic light-emitting diodes forms a display or a two-dimensional array.

In some embodiments, the component substrate includes polyimide.

In some embodiments, the hybrid document further includes a plurality of components. In some embodiments, each of the components comprises a respective component substrate; one or more respective inorganic light-emitting diodes disposed on the component substrate; a respective controller disposed on or in the respective component substrate and electrically connected to the one or more respective inorganic light-emitting diodes for controlling the one or more respective inorganic light-emitting diodes; a respective piezoelectric power source disposed on the component substrate comprising a plurality of electrically connected respective individual piezoelectric power-source elements (e.g., electrically connected in series, in parallel, or in a combination of in series and in parallel), wherein the respective piezoelectric power source is electrically connected to the respective controller, the respective inorganic light-emitting diodes, or both. In some embodiments, (i) each of the one or more respective inorganic light-emitting diodes comprises a broken (e.g., fractured) or separated tether, (ii) the respective controller comprises a broken (e.g., fractured) or separated tether, (iii) the respective component substrate comprises a broken (e.g., fractured) or separated tether, (iv) the respective individual piezoelectric power-source elements comprise a broken (e.g., fractured) or separated tether, or (v) any one or combination of (i), (ii), (iii), and (iv). In some embodiments, the respective component substrate is a flexible substrate that is more flexible than any one of the respective inorganic light-emitting diodes, the respective controller, and the respective individual piezoelectric power-source elements. In some embodiments, the components of a plurality of components are arranged to form a pattern or graphic, e.g., a graphic element.

According to embodiments of the present disclosure, the one or more light-emitting diodes comprises a plurality of light-emitting diodes that are arranged to form a pattern or graphic or wherein the one or more light-emitting diodes are in optical communication with a plurality of light pipes that are arranged to form a pattern or graphic.

The component can comprise a protective layer (e.g., a sprayed-on protective layer) disposed over the one or more inorganic light-emitting diodes, the controller, and the power source. In some embodiments, an adhesive (e.g., a sprayed-on adhesive) is disposed on the protective layer, and the adhesive adheres the component to the flexible document. The one or more light-emitting diodes can be disposed to emit light through the protective layer (e.g., via one or more light pipes). The one or more light-emitting diodes can be disposed to emit light through the component substrate (e.g., via one or more light pipes). At least the one or more light-emitting diodes can be disposed between the flexible document and the component substrate (e.g., and the power source, the controller, or both).

In some aspects, the present disclosure is directed to a method of making a hybrid document, including: providing a flexible document having visible markings; providing a light-emitting diode source wafer having a plurality of relatively rigid printable inorganic light-emitting diodes connected by light-emitting diode tethers to the light-emitting diode source wafer; providing a controller source wafer having a plurality of controllers connected by controller tethers to the controller source wafer; providing a piezoelectric power source wafer having a plurality of individual piezoelectric power sources connected by power-source tethers to the piezoelectric power source wafer; providing a component substrate; printing at least a portion of at least one of the plurality of controllers, one or more of the plurality of inorganic light-emitting diodes, and individual piezoelectric power sources from the controller source wafer, the light-emitting diode source wafer, and the piezoelectric power source wafer, respectively, to the component substrate, thereby breaking (e.g., fracturing) or separating each light-emitting diode tether that connected the one or more of the plurality of inorganic light-emitting diodes to the light-emitting diode source wafer, each controller tether that connected the at least one of the plurality of controllers to the controller source wafer, and each power-source tether that connects the at least one of the individual piezoelectric power sources to the piezoelectric power source wafer to provide the component; electrically connecting the at least one of the plurality of controllers to the one or more of the plurality of inorganic light-emitting diodes or to the power source on the component substrate; and printing the component in or on the flexible document or in or on a ribbon or thread (e.g., thereby embedding the component in or on the flexible document or in or on the ribbon or thread).

In some aspects the present disclosure is directed to a method of operating a hybrid document, including providing a hybrid document and squeezing the piezoelectric power source to generate power.

In some aspects, the present disclosure is directed to a hybrid sheet [e.g., document (e.g., banknote)], comprising: a flexible substrate (e.g., a paper or polymer substrate); and a non-native component disposed (e.g., embedded) in or on the flexible substrate, the component comprising: a flexible component substrate, one or more active component elements [e.g., one or more light controlling (e.g., emitting and/or reflecting) components (e.g., light-emitting diodes)] disposed (e.g., embedded) on or in the component substrate, and individual power-source elements, wherein the power-source elements are (i) disposed (e.g., embedded) on or in the component substrate, (ii) electrically connected together (e.g., in series, in parallel, or in a combination of in series and in parallel) and (iii) electrically connected to together provide power [e.g., directly or indirectly (e.g., through a controller)] to the one or more active component element(s).

In some embodiments, the one or more active component elements and the power-source elements are rigid.

In some embodiments, the one or more active component elements, the power-source elements, or both the one or more active component elements and the power-source elements (e.g., the individual piezoelectric power-source elements) are non-native to the component substrate [e.g., comprises/comprise a broken (e.g., fractured) or separated tether].

In some embodiments, the flexible substrate comprises visible marks (e.g., denoting a denomination of currency) (e.g., made of ink). In some embodiments, (i) the component is disposed in, obscured by, and/or covered by the visible marks [e.g., wherein the component is operable to control (e.g., emit) light through the visible marks] or (ii) the component is disposed (e.g., embedded) on or in the flexible substrate away from the visible marks.

In some embodiments, the individual power-source elements are piezoelectric power-source elements.

In some embodiments, the component comprises a controller disposed (e.g., embedded) on or in the component substrate and electrically connected to the power-source elements and to the one or more active component elements (e.g., electrically connected to the component elements), wherein the controller is operable to cause the one or more active component elements to perform a function [e.g., control (e.g., emit and/or reflect) light]. In some embodiments, the controller or component elements are non-native to the component substrate.

In some embodiments, the component substrate is a ribbon or thread. In some embodiments, the flexible substrate is more flexible than the component substrate. In some embodiments, the flexible substrate, the component substrate, or both the flexible substrate and the component substrate comprise polymer.

In some embodiments, the hybrid sheet can be any hybrid document disclosed herein.

In some aspects, the present disclosure is directed to a method of making a hybrid sheet, the method comprising forming a component comprising the component substrate, one or more active component elements, and power-source elements (e.g., component elements electrically connected in series, in parallel, or in a combination of in series and in parallel), wherein forming the component comprises (i) printing the one or more active component elements onto or in the component substrate, (ii) printing the power-source elements (e.g., piezoelectric power-source elements) onto or in the component substrate, or (iii) both (i) and (ii). In some embodiments, the method comprises providing a flexible substrate [e.g., document (e.g., banknote)]; and printing the component to the flexible substrate. The hybrid sheet can be any hybrid sheet disclosed herein.

According to embodiments of the present disclosure, a method of preparing components to form a hybrid sheet comprises providing a film (e.g., in a roll); printing (e.g., micro-transfer printing) components to the film; disposing (e.g., spraying) surface of the film with a protective layer such that the protective layer covers the components; disposing (e.g., spraying) adhesive on the protective layer; and separating the film into individual tapes, each of the tapes comprising one or more of the components. Some embodiments comprise disposing a portion of one of the tapes on a flexible substrate (e.g., flexible document) (e.g., wherein disposing the portion comprises cutting the portion off of the one of the tapes), wherein the portion of the one of the tapes comprises one or more of the components (e.g., arranged in a one-dimensional or two-dimensional array). Disposing the portion of the one of the tapes can comprise contacting the portion of one of the tapes to the flexible substrate and subsequently heating the adhesive.

Some embodiments comprise providing one or more source wafers comprising the components and printing the components from the source wafer to the film. Some embodiments comprise forming the components on the one or more source wafers (e.g., using photolithography).

According to embodiments of the present disclosure, each of the components comprises one or more active component elements [e.g., light controlling (e.g., emitting and/or reflecting) components (e.g., light-emitting diodes)], and individual power-source elements, wherein the power-source elements are electrically connected together (e.g., in series, in parallel, or in a combination of in series and in parallel) and electrically connected to together provide power [e.g., directly or indirectly (e.g., through a controller included in the component)] to the one or more active component elements. Each of the components can comprise a (e.g., flexible) component substrate on or in which the one or more active component elements and the power-source elements are disposed and printing the components to the film comprises adhering (e.g., with adhesive) the component substrate of each of the components to the film. The component substrate can be less flexible than the film [e.g., and the film can be no more flexible than a flexible substrate (e.g., flexible document) of the hybrid sheet]. Any two or more of the features described in this specification, including in this summary section, can be combined to form implementations of the disclosure, whether specifically expressly described as a separate combination in this specification or not.

At least part of the methods, systems, and techniques described in this specification can be controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the methods, systems, and techniques described in this specification can be controlled using a computing system comprised of one or more processing devices and memory storing instructions that are executable by the one or more processing devices to perform various control operations.

In embodiments, the present disclosure provides an anonymous, government-issued currency with anti-counterfeiting light emitters whose validity, value, or indicia can be visibly ascertained, for example by a user without requiring specialized equipment. Certain embodiments of the present disclosure provide components with flexible component substrates micro-transfer printed onto a flexible system substrate.

As used herein, "a component element" is a generic term for both an active component element and a power-source element (and therefore, unless otherwise clear from context, "component elements" can refer to, for example, active component elements, power-source elements, or a combination of one or more active component elements and one or more power-source elements). That is, in some embodiments a component element is an active component element and in some embodiments a component element is a power-source element.

BRIEF DESCRIPTION OF THE DRAWINGS

The present teachings described herein will be more fully understood from the following description of various illustrative embodiments, when read together with the accompanying drawings. It should be understood that the drawing described below is for illustration purposes only and is not intended to limit the scope of the present teachings in any way. The foregoing and other objects, aspects, features, and advantages of the disclosure will become more apparent and can be better understood by referring to the following description taken in conjunction with the accompanying drawings, in which:

FIG. 2 is a schematic diagram of a component on a ribbon according to illustrative embodiments of the present disclosure;

FIG. 3 is a plan view of the front and back sides of a hybrid currency document according to illustrative embodiments of the present disclosure;

FIG. 4 is an illustration of a light pipe according to embodiments of the present disclosure;

23

Figures 5, 6, 7:
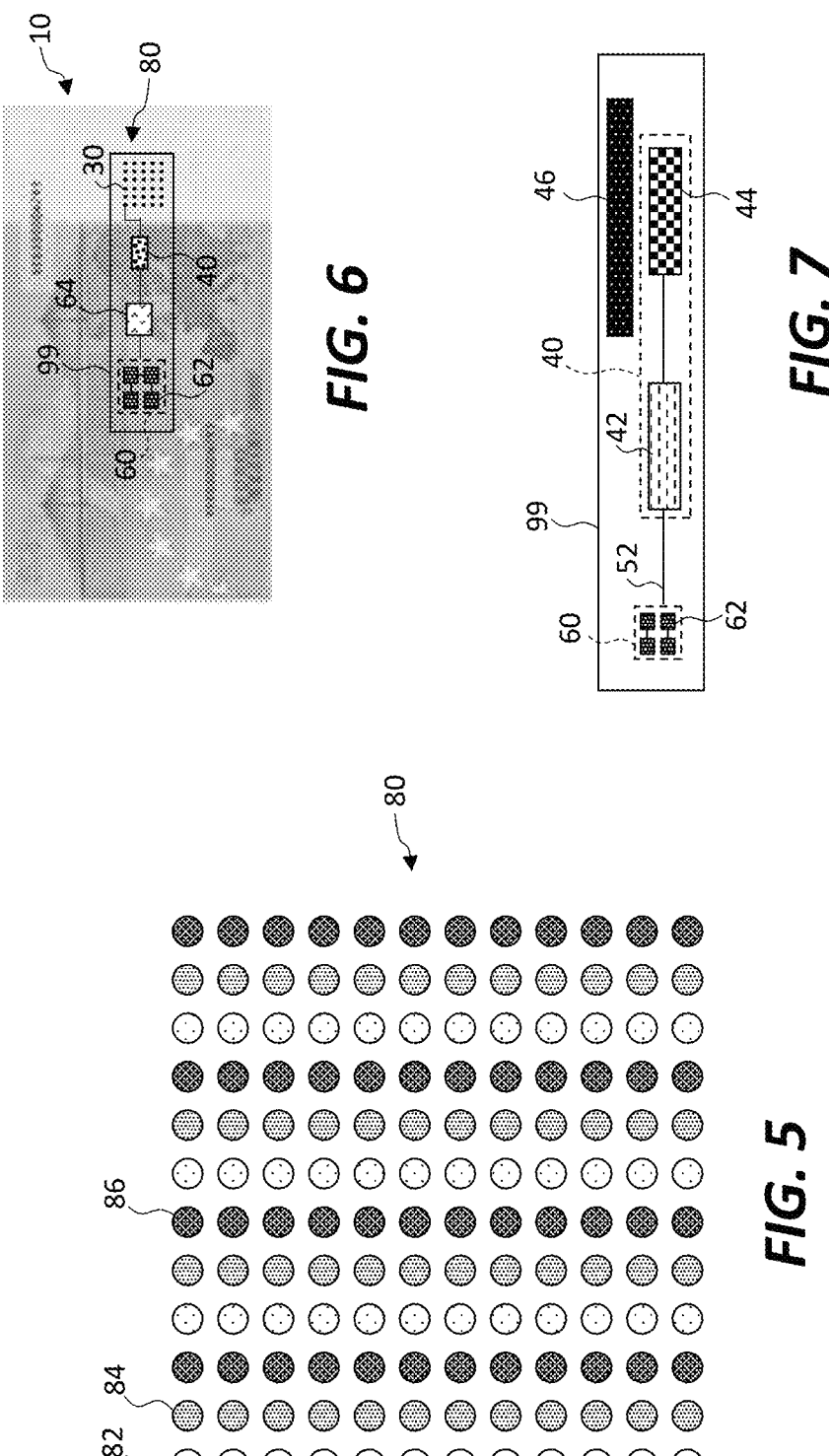
FIG. 5 is a schematic illustration of a display according to illustrative embodiments of the present disclosure.
Figure 8:
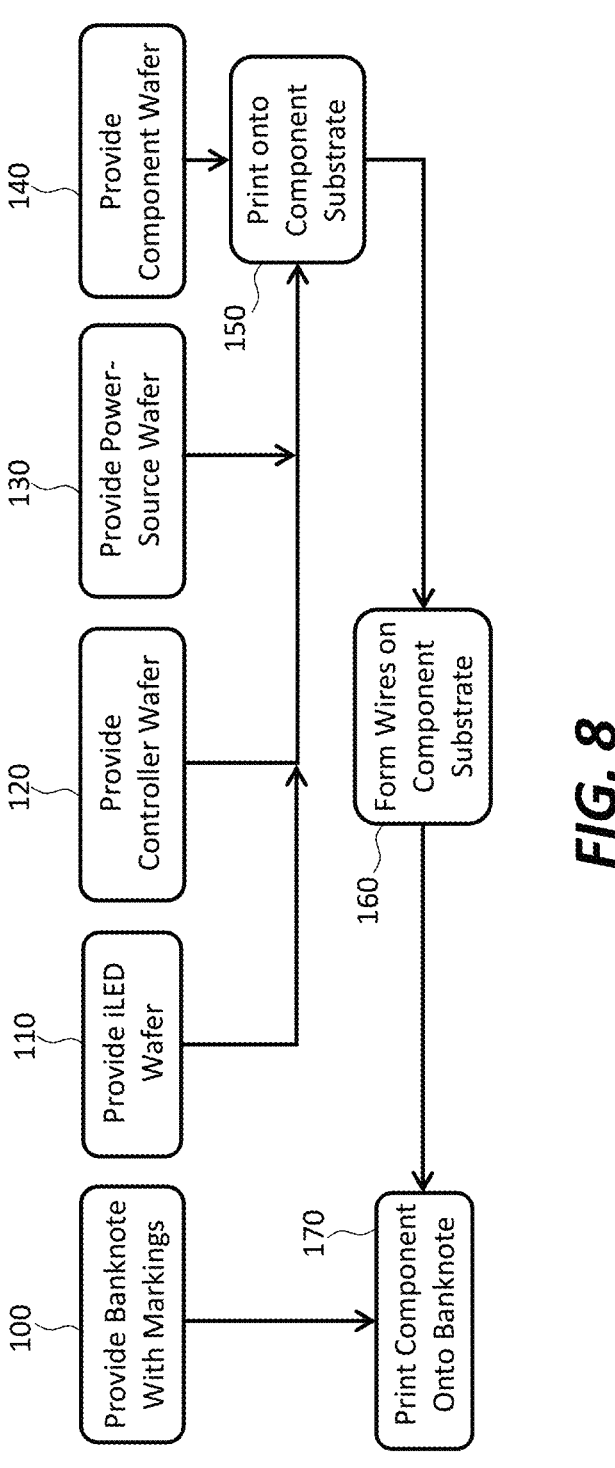
Figure 9:
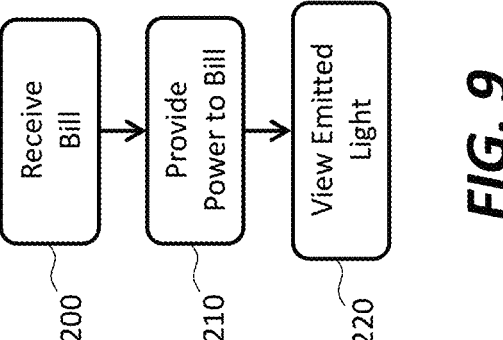
Figure 10:
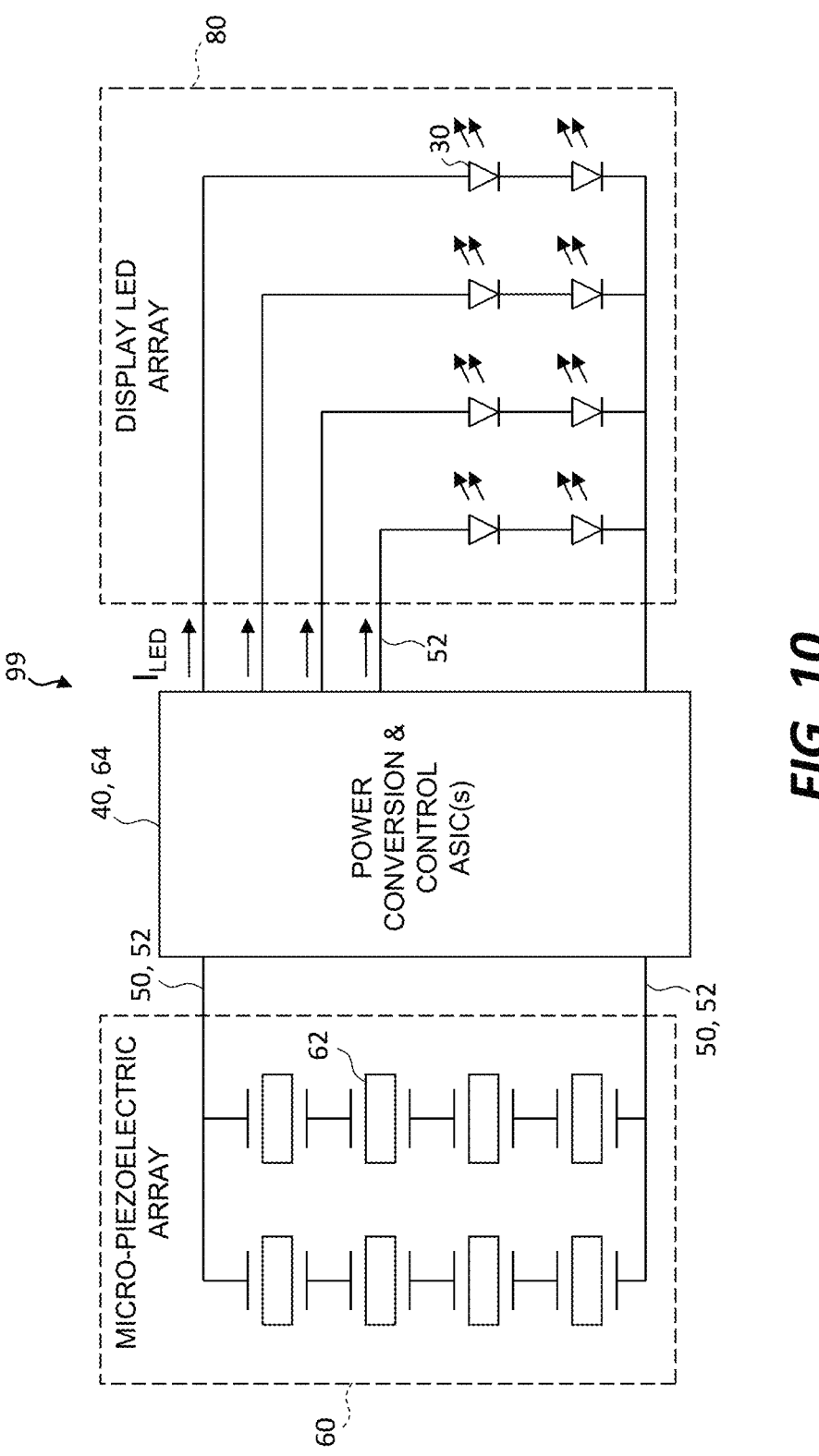
Figure 11:
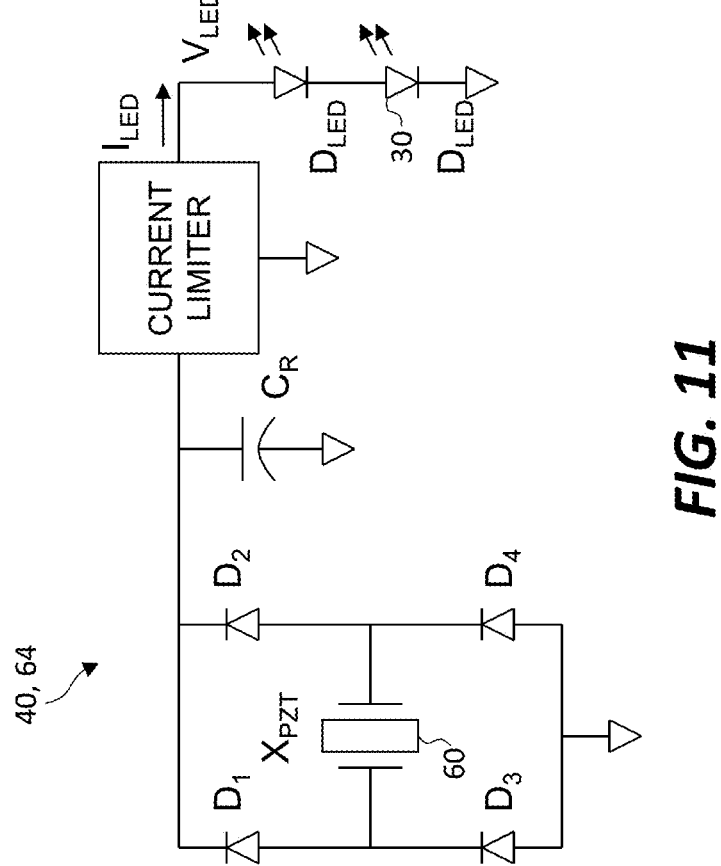
Figure 12:
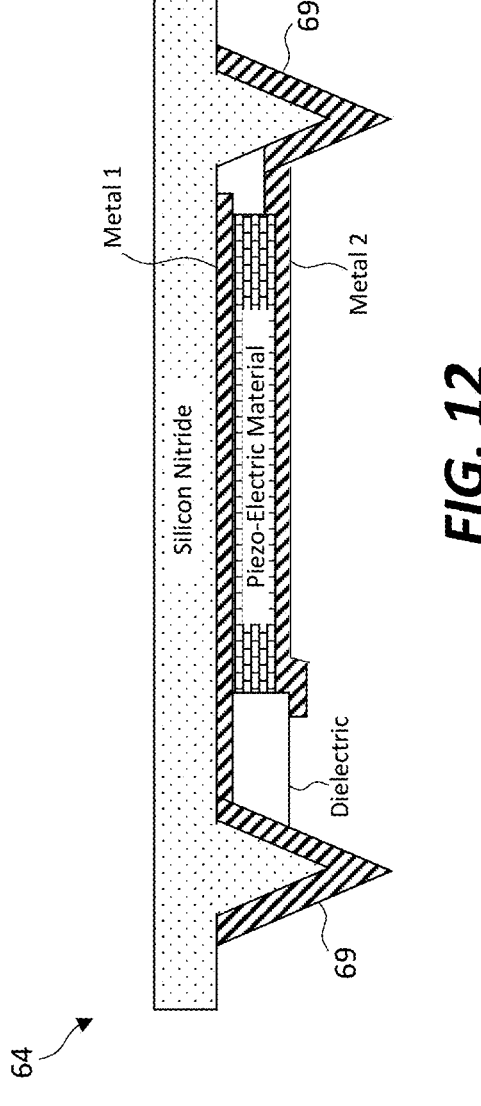
Figure 13:
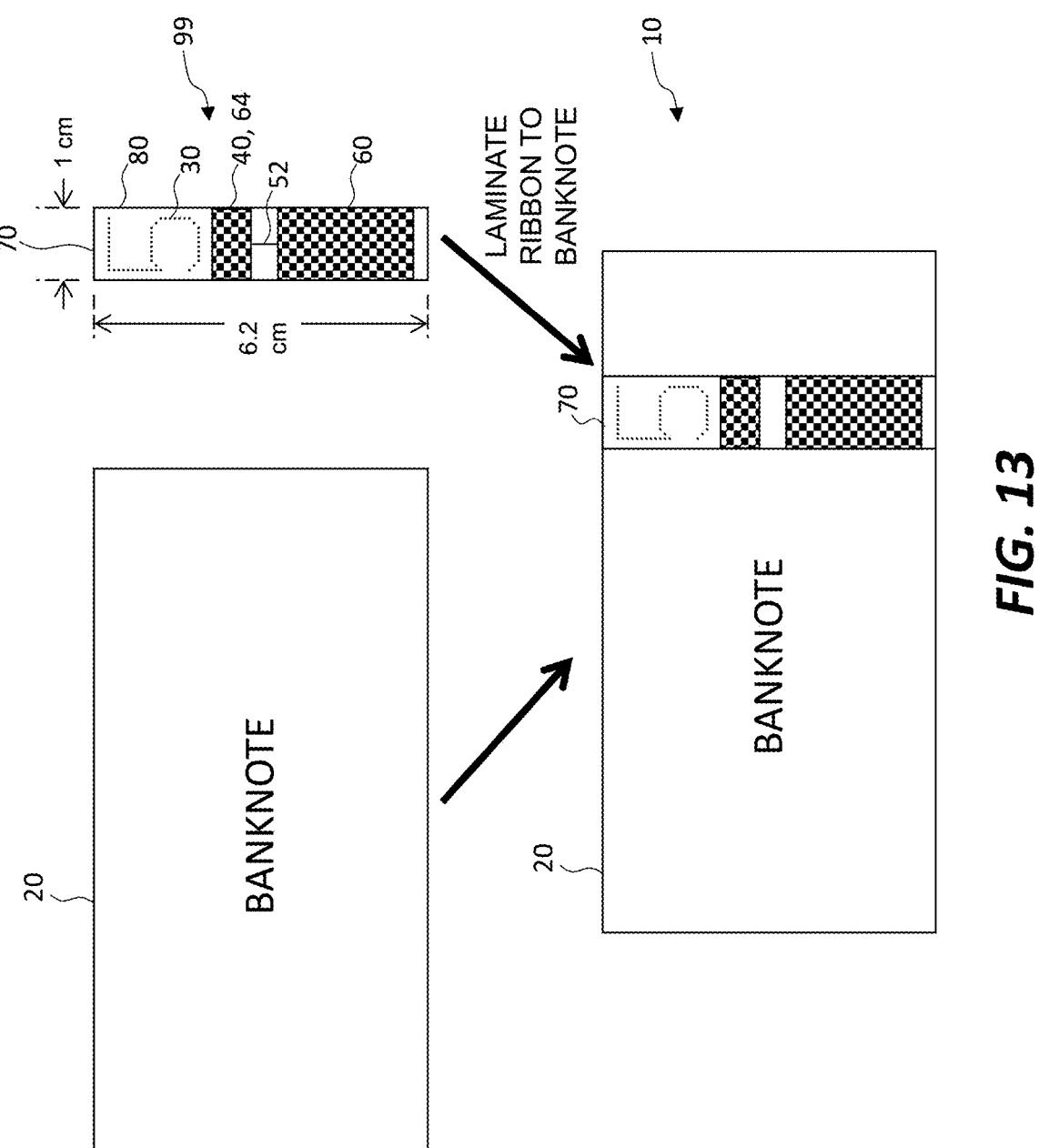
Figure 14:
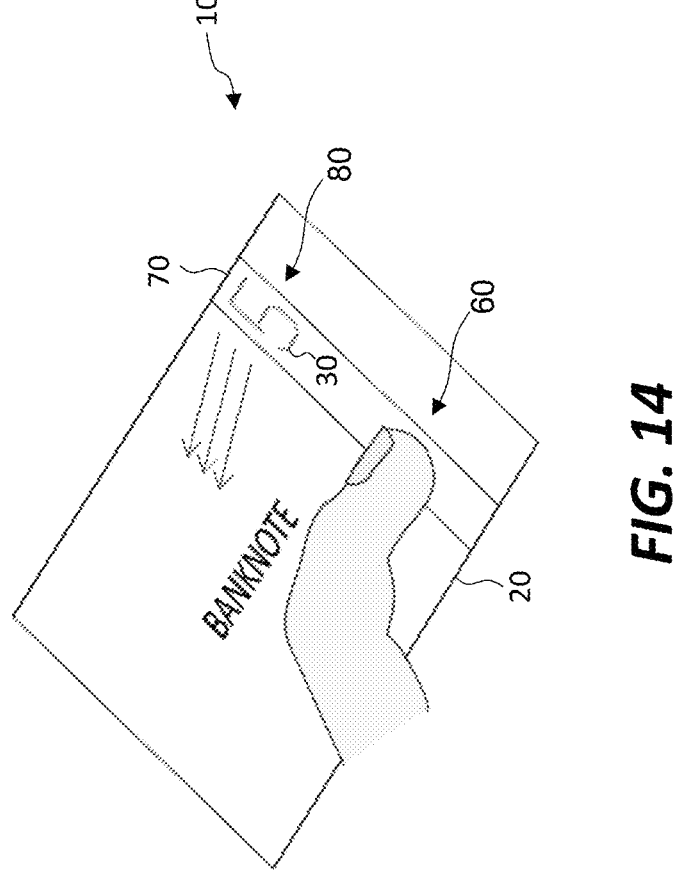
Figures 15, 16, 17:
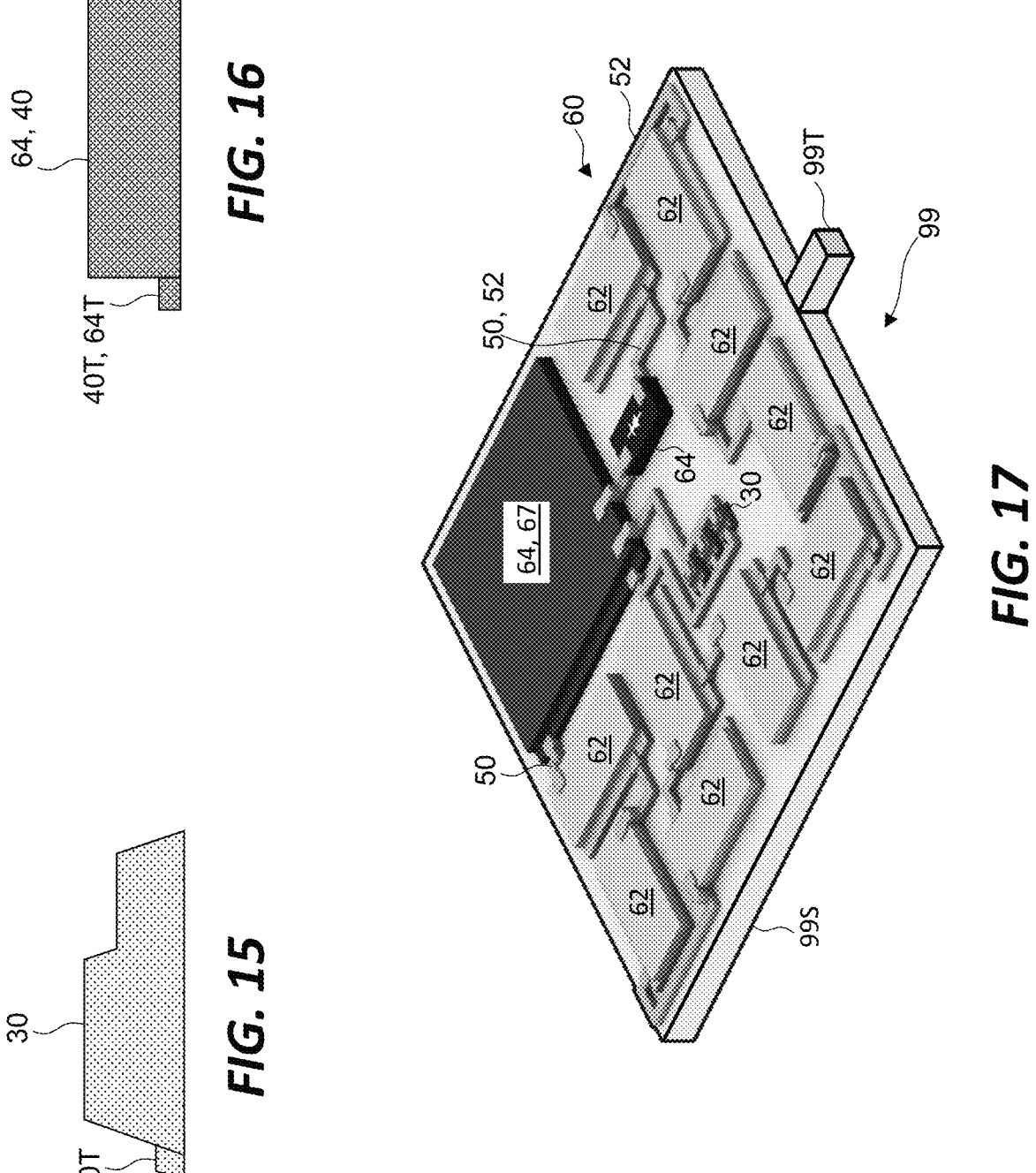
Figure 18:
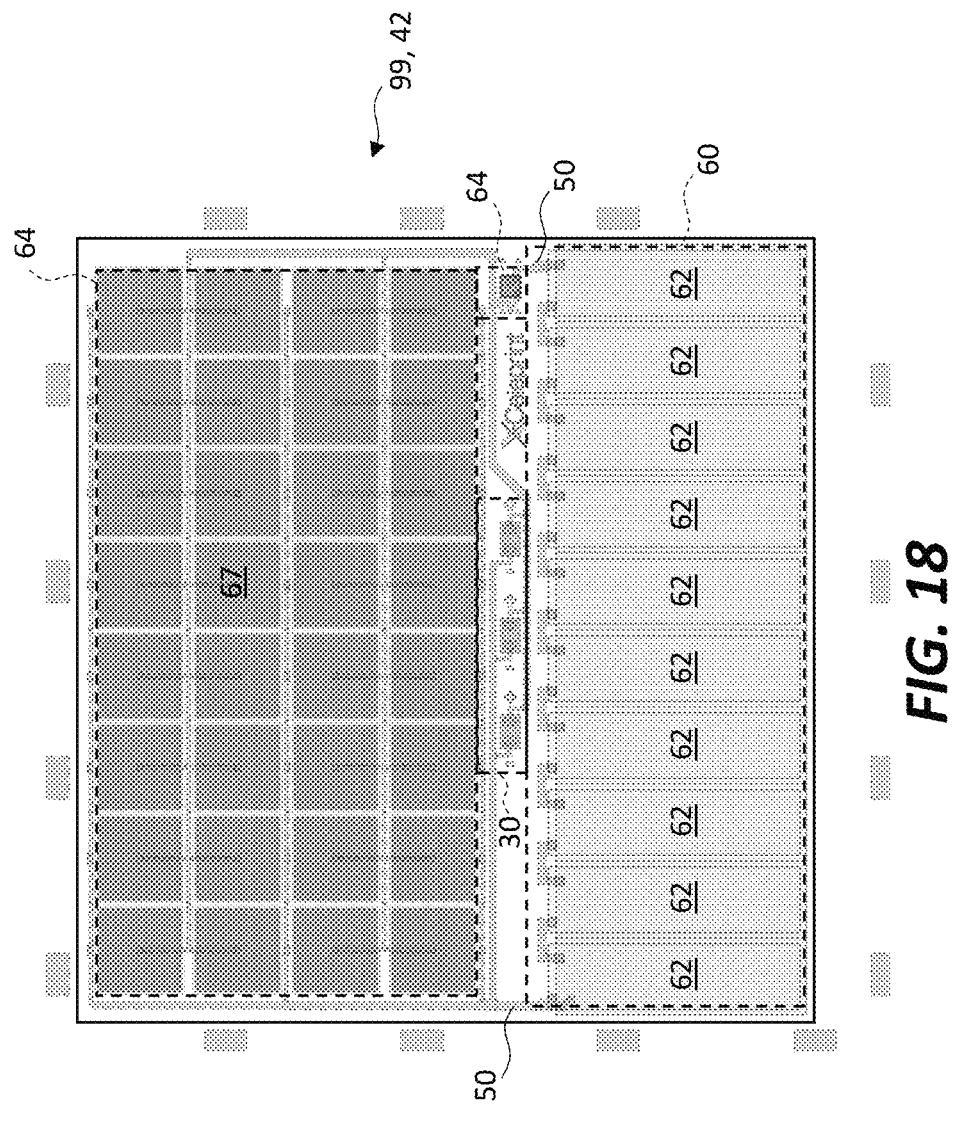
Figures 19, 20:
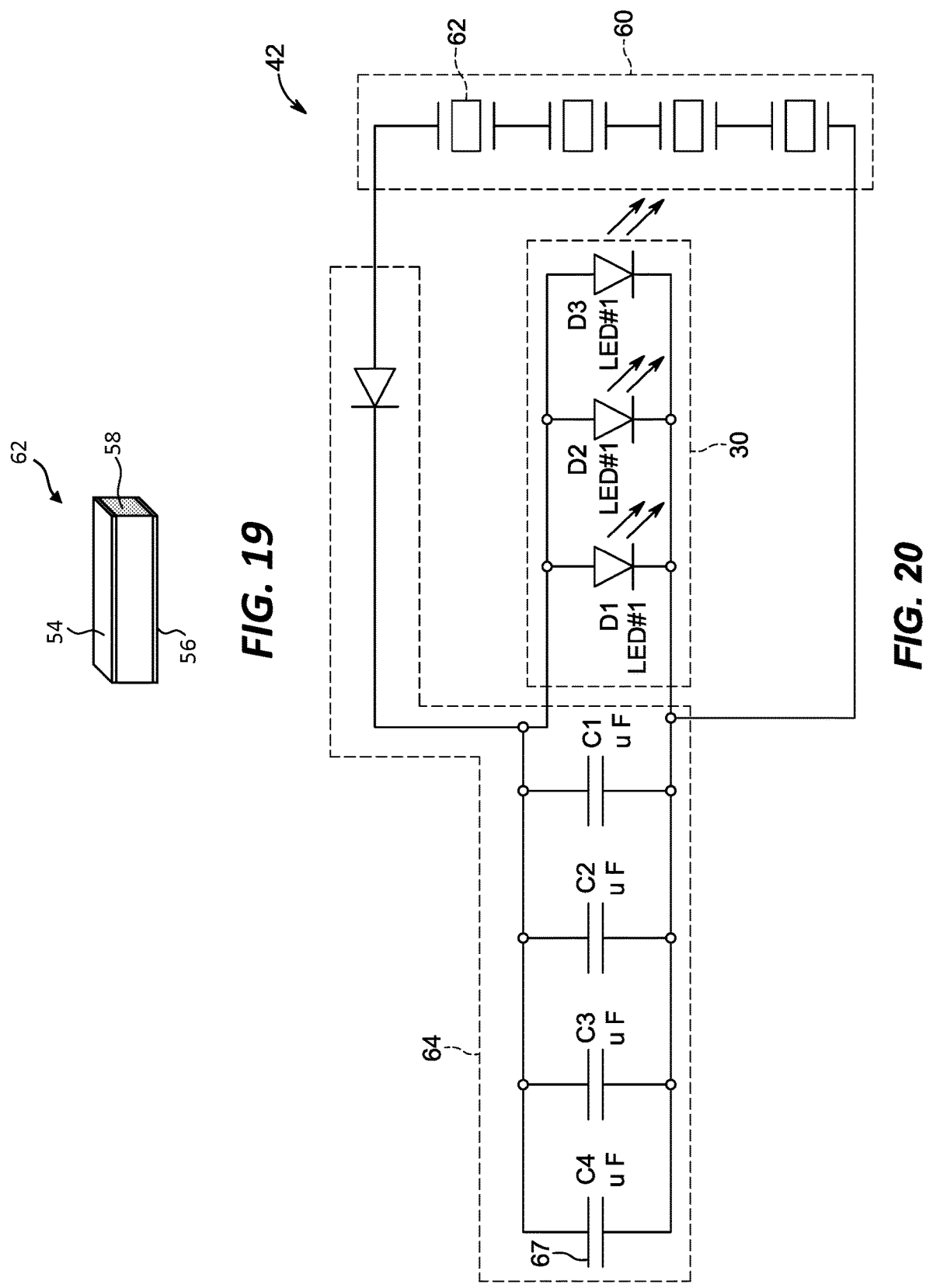
Figures 21, 22:
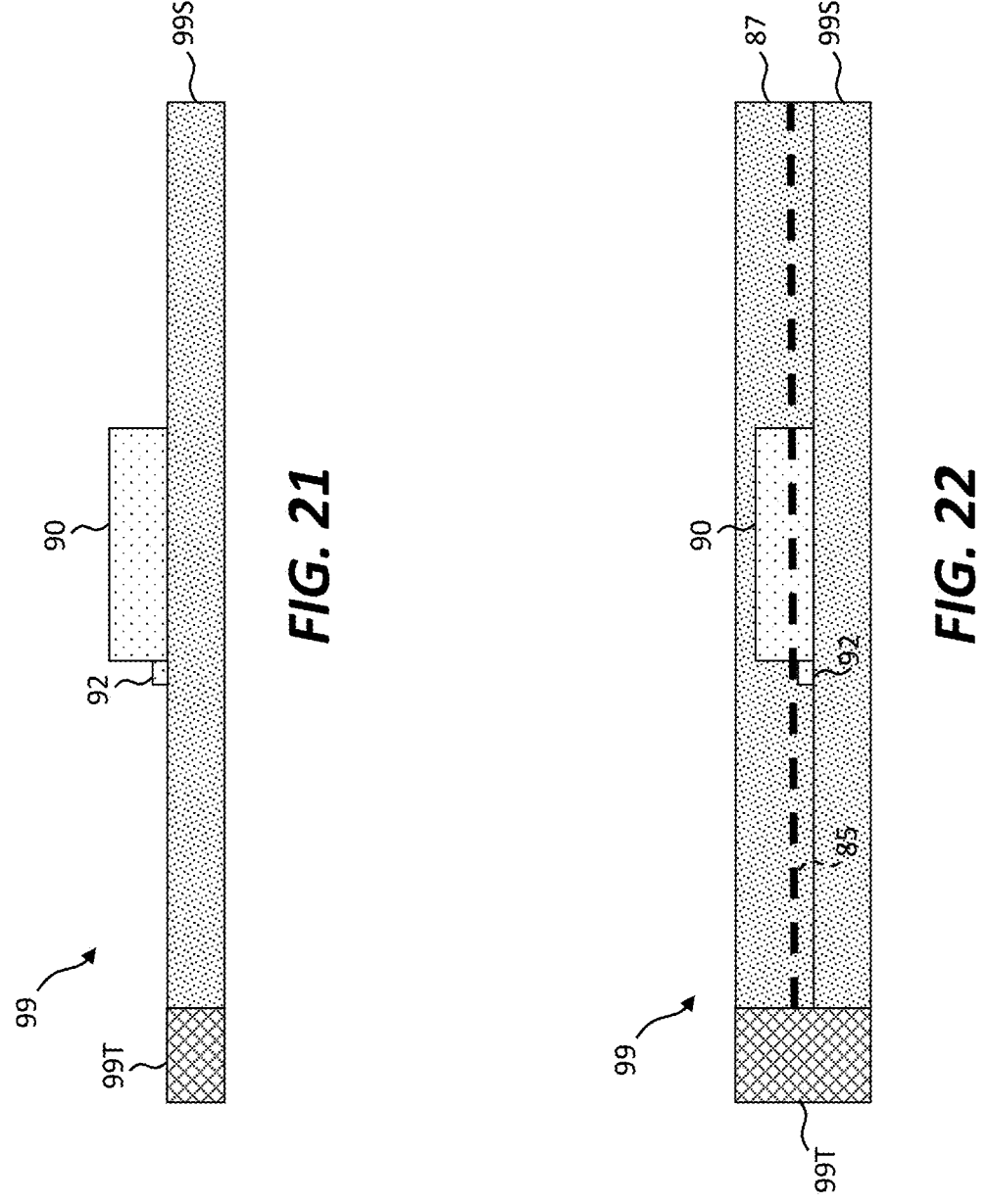
Figure 23A:
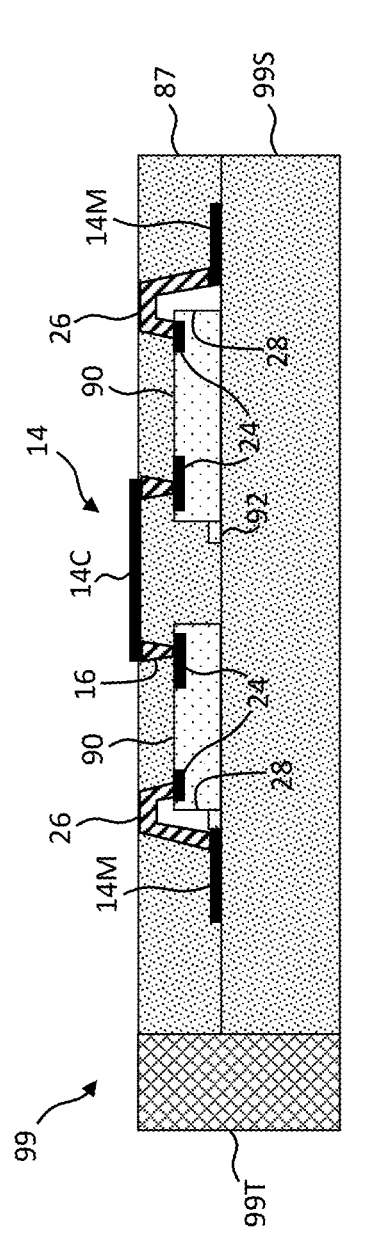
Figure 23B:
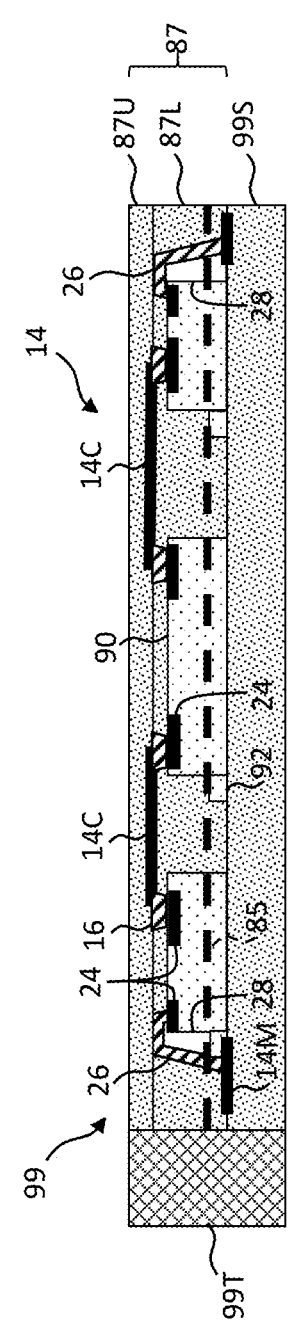
Figures 24, 25A, 25B:
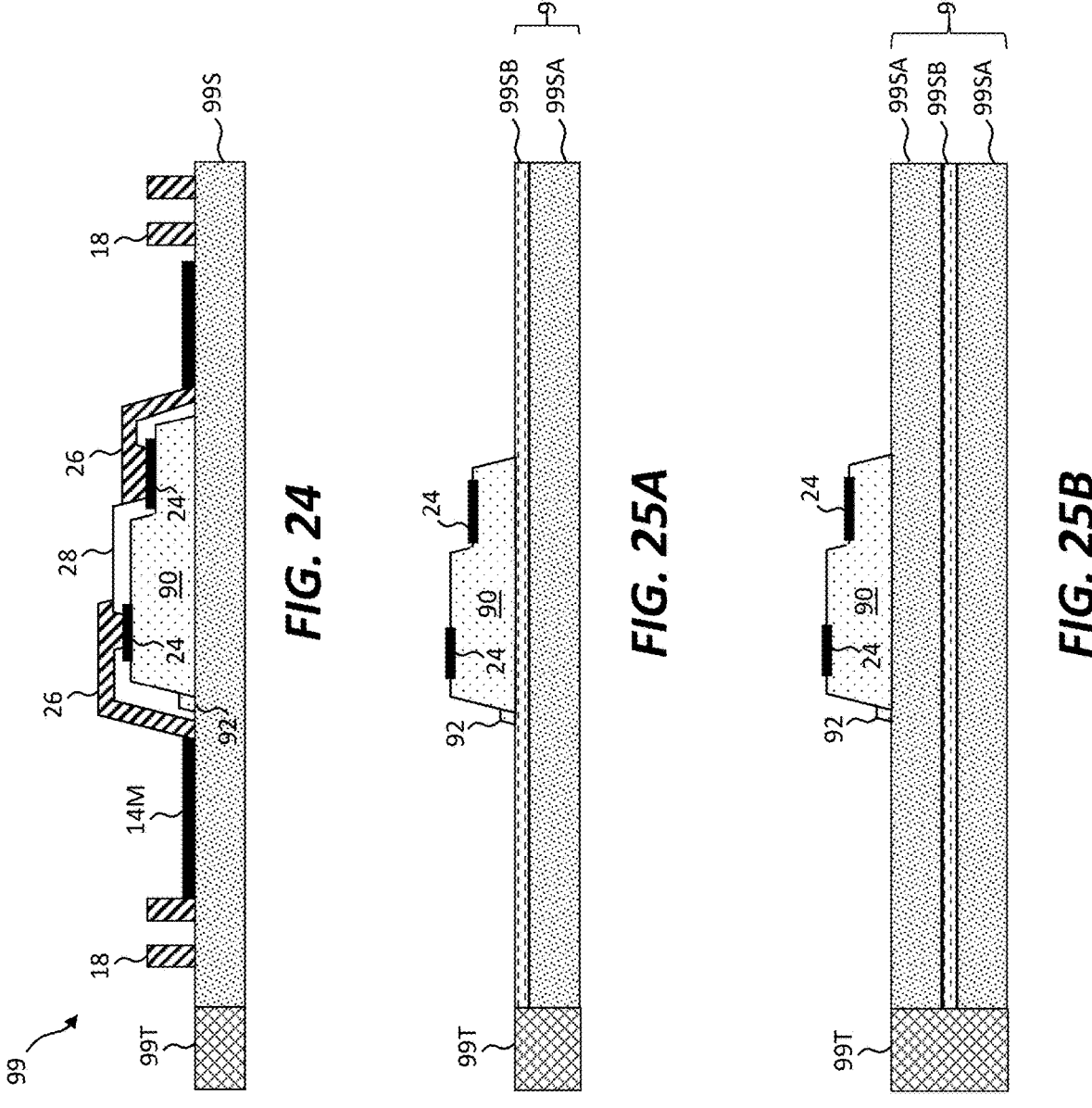
Figures 25C, 25D, 26:
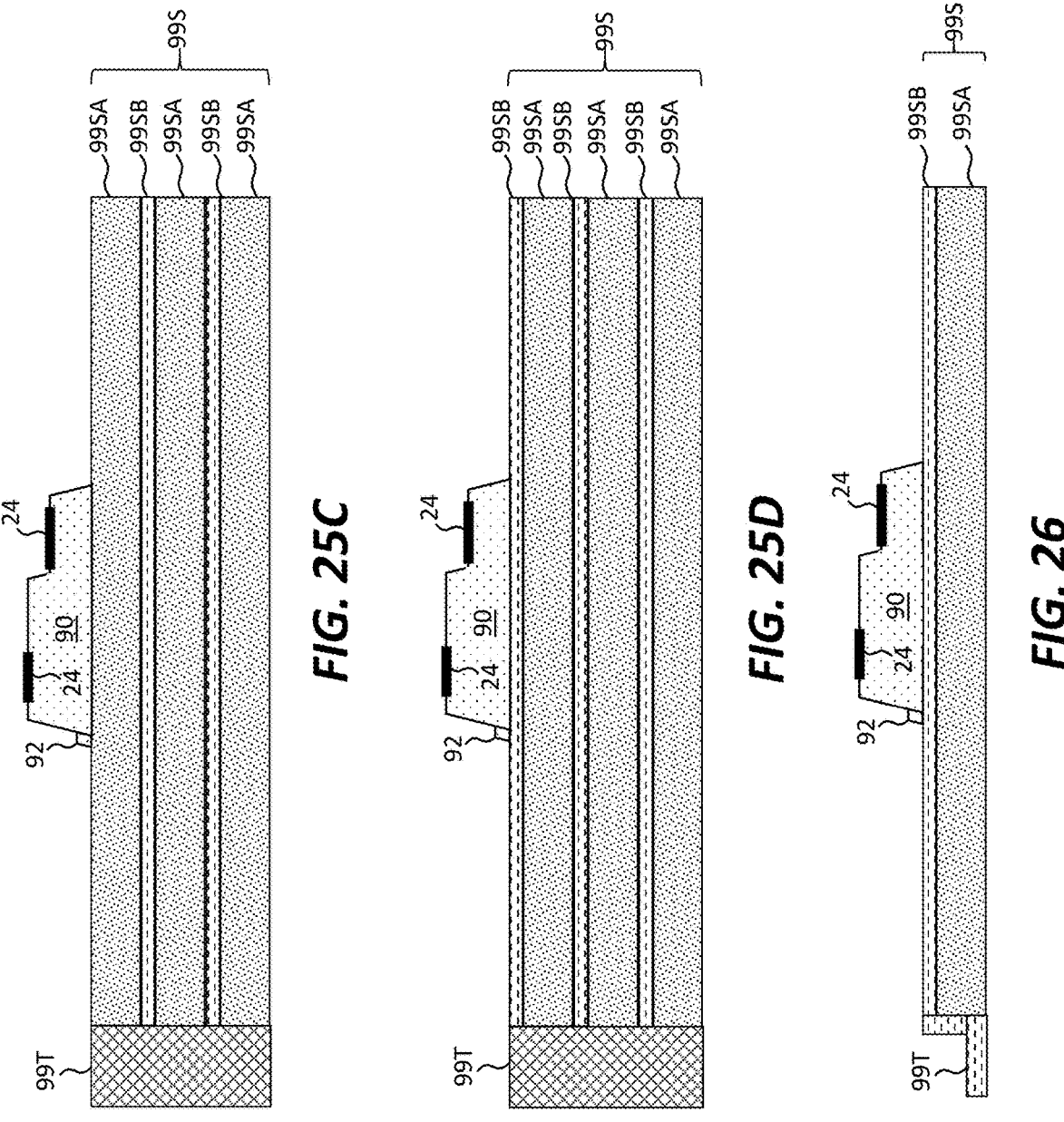
Figure 27A:
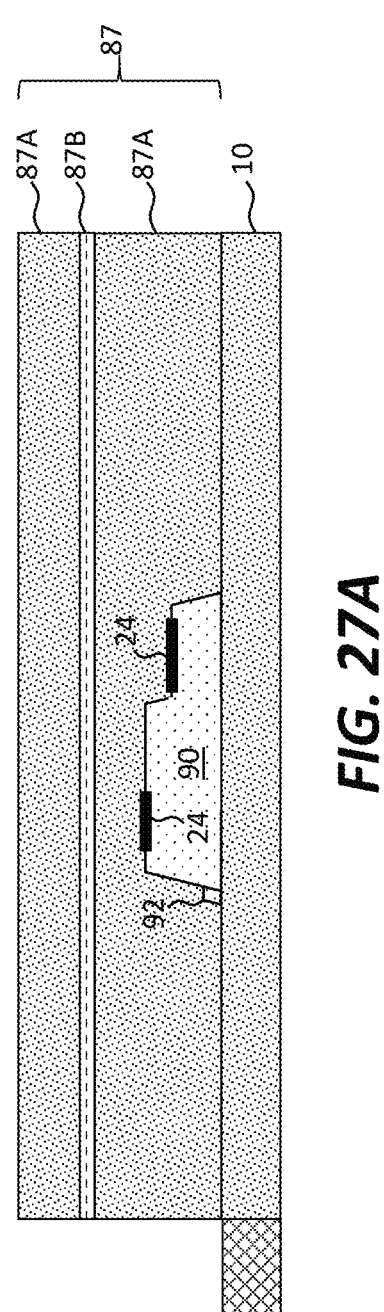
Figure 27B:
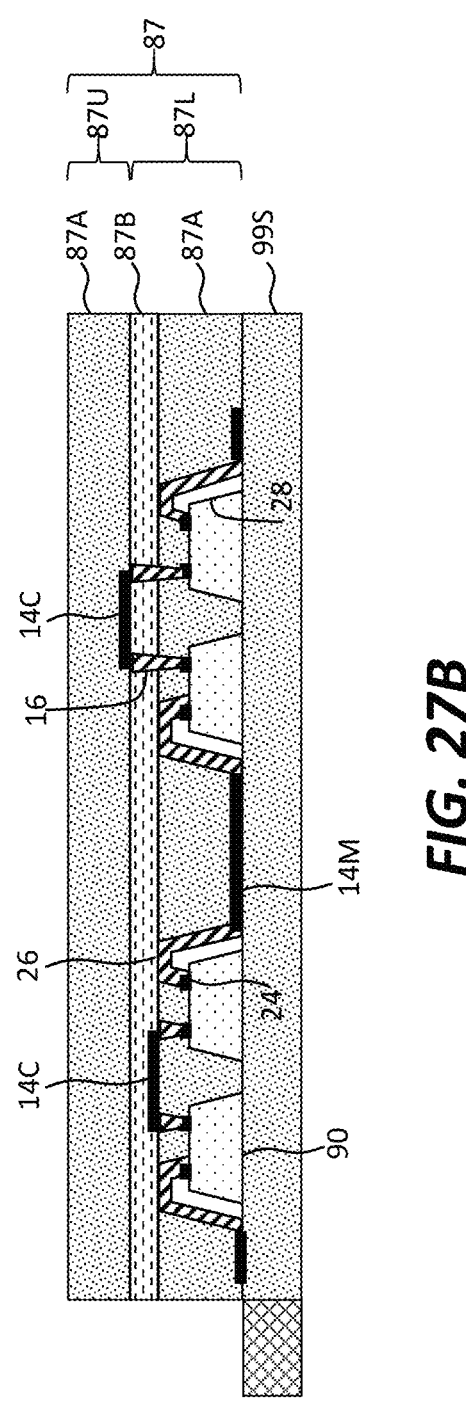
Figure 27C:
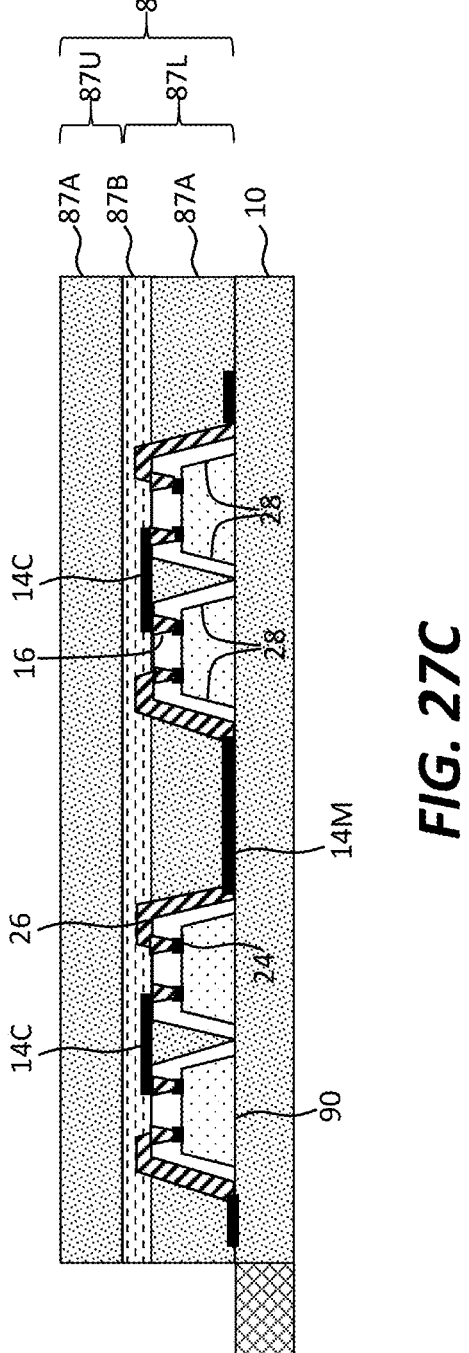
Figure 28:
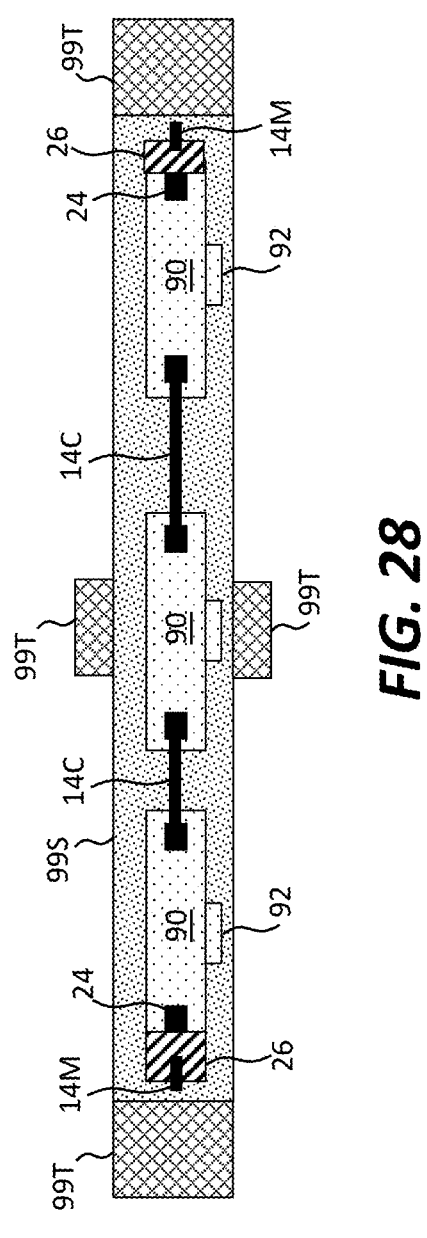
Figure 29:
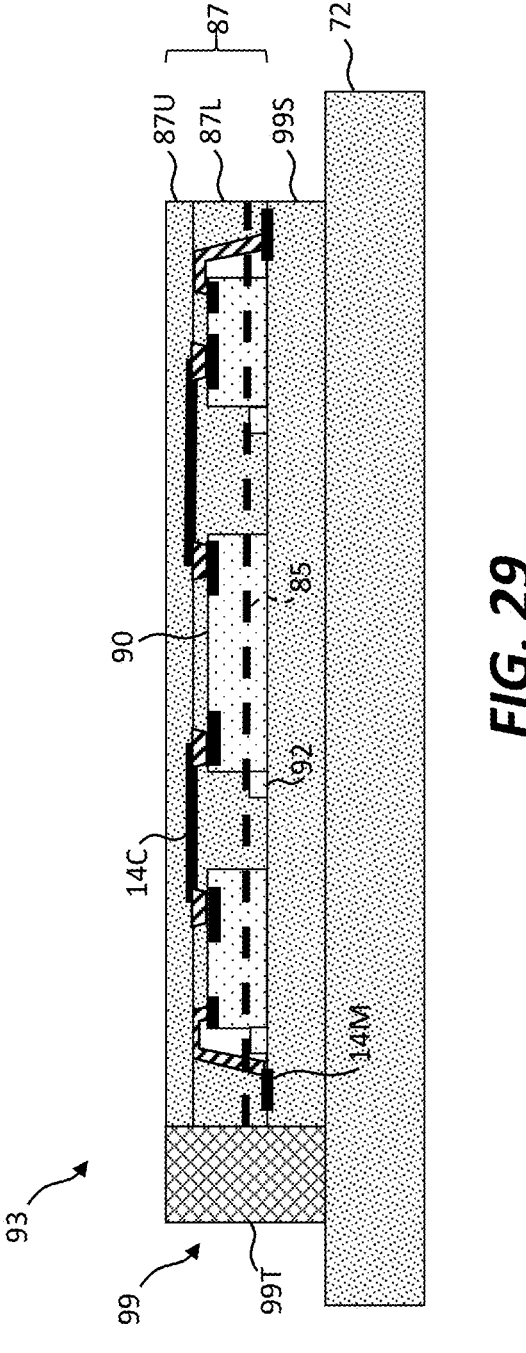
Figures 30A, 30B, 30C:
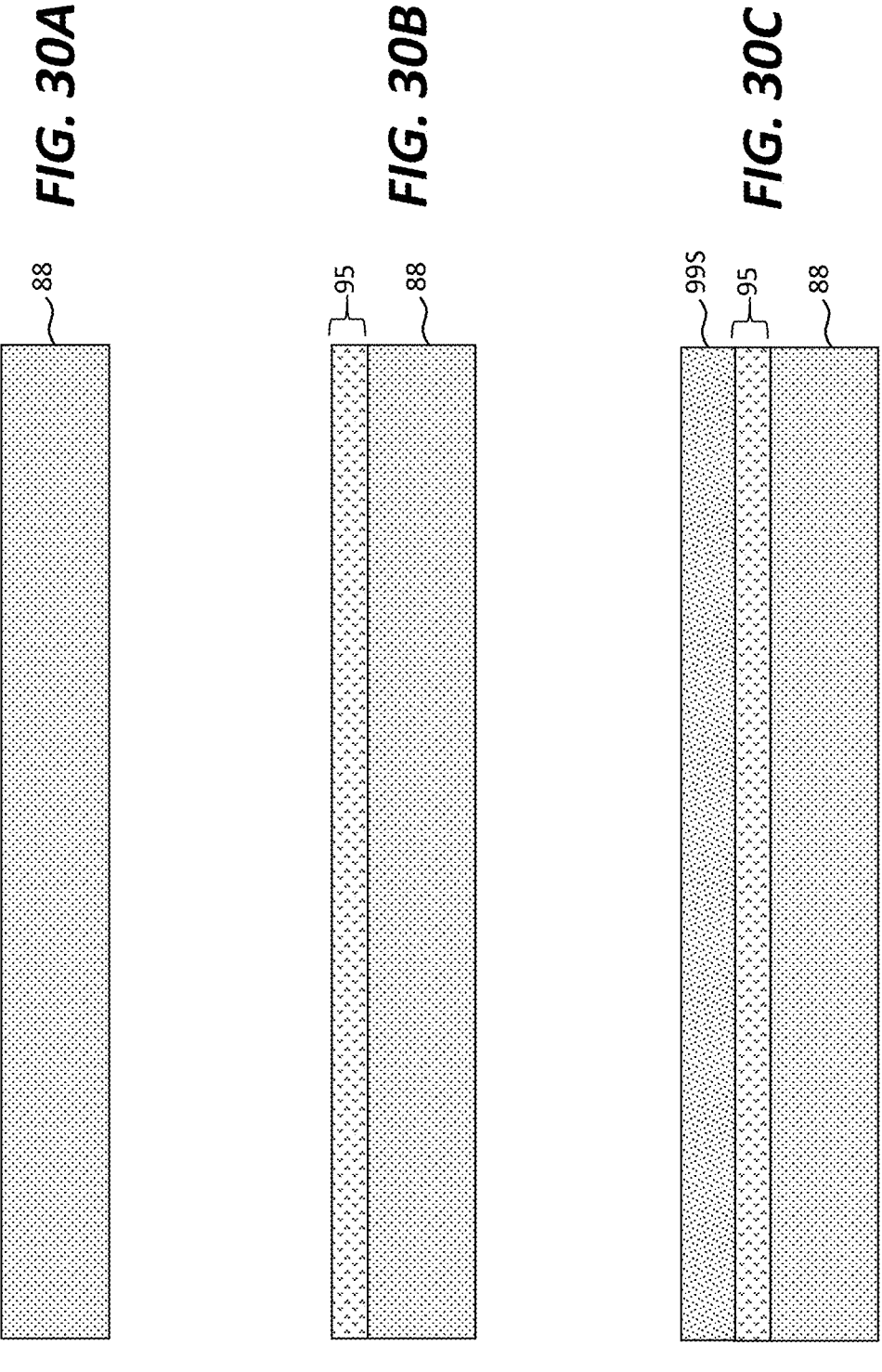
Figures 30D, 30E, 30F:
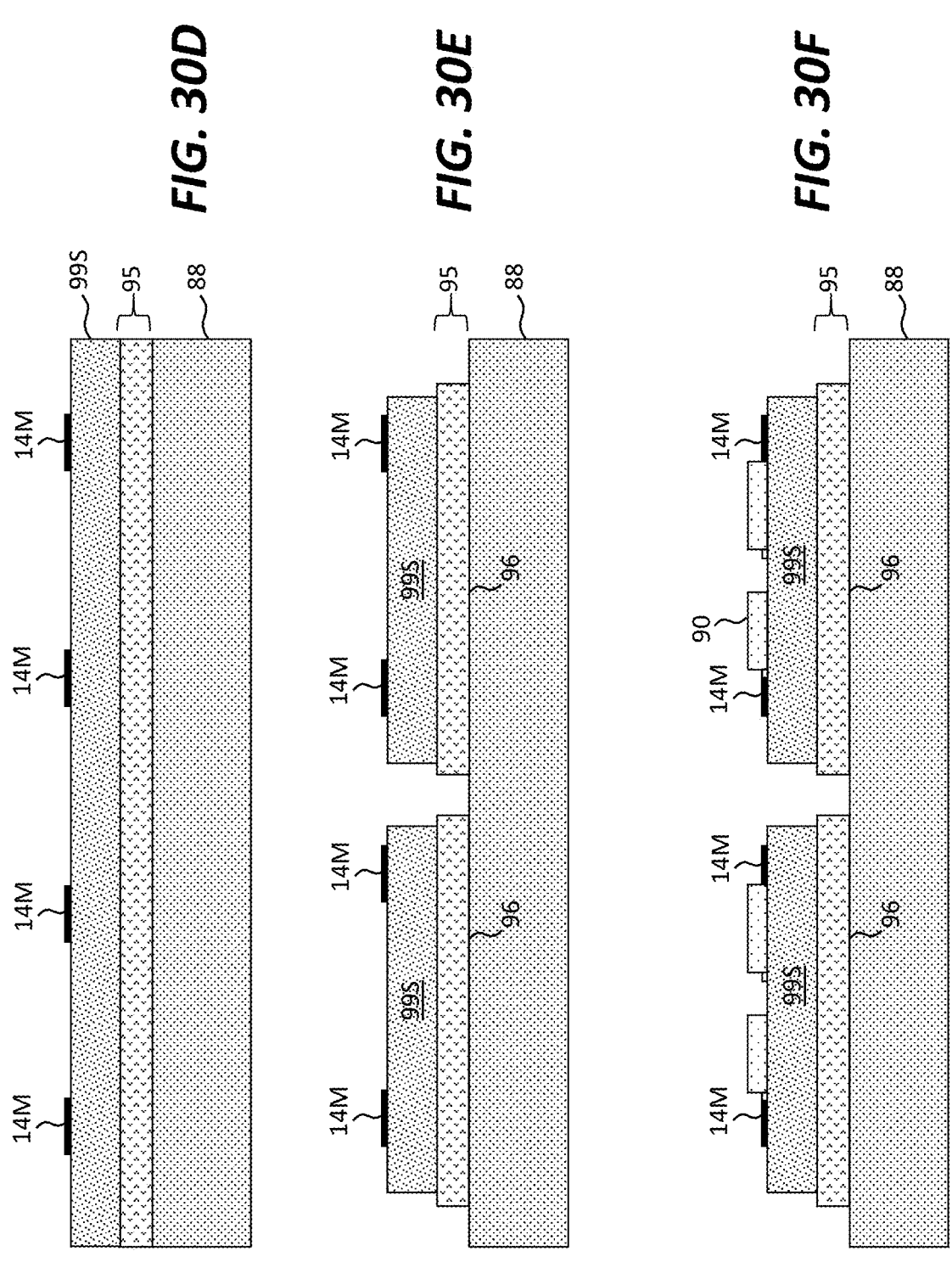
Figures 30G, 30H:
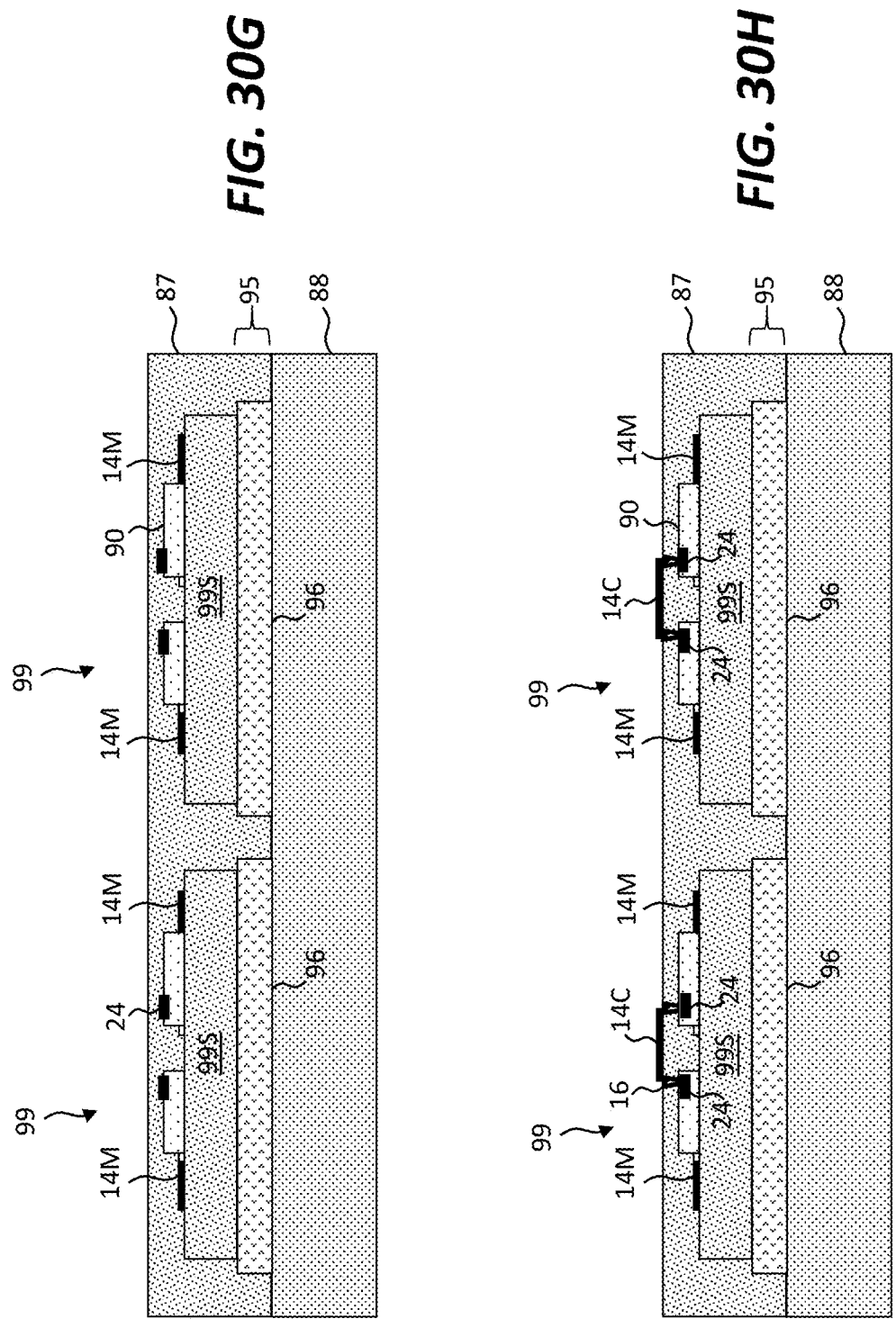
Figures 30I, 30J:
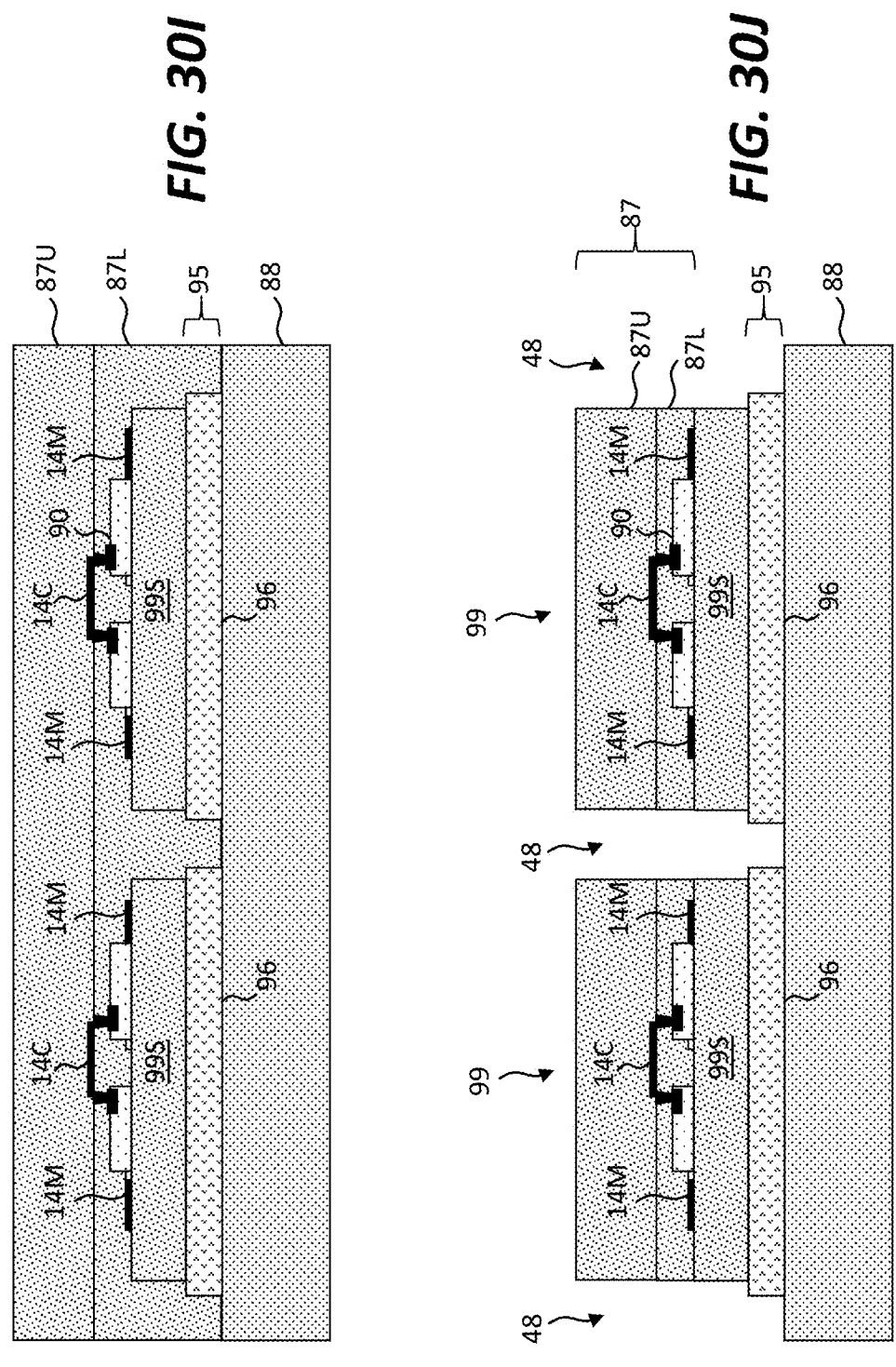
Figures 30K, 30L:
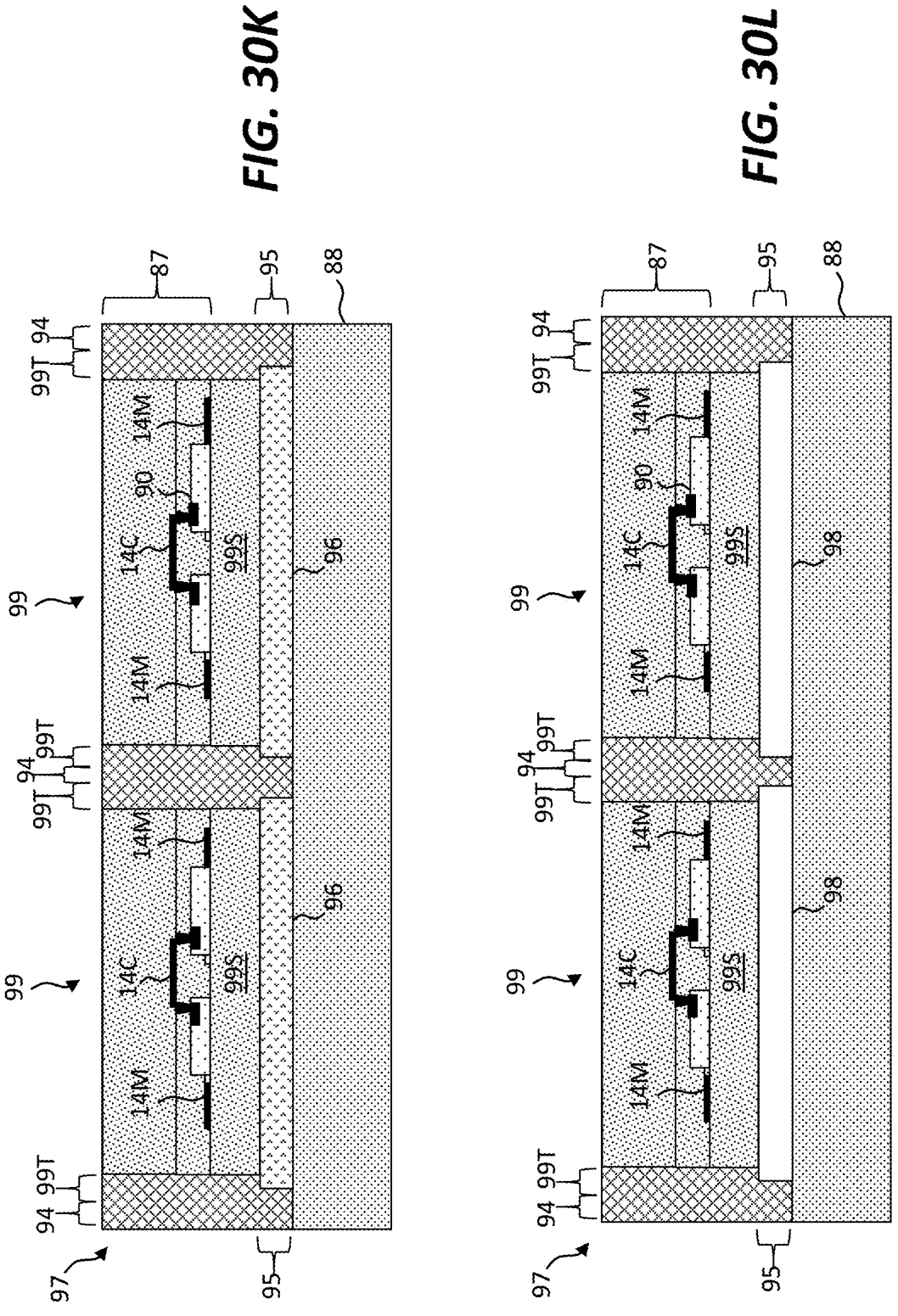
Figure 30M:
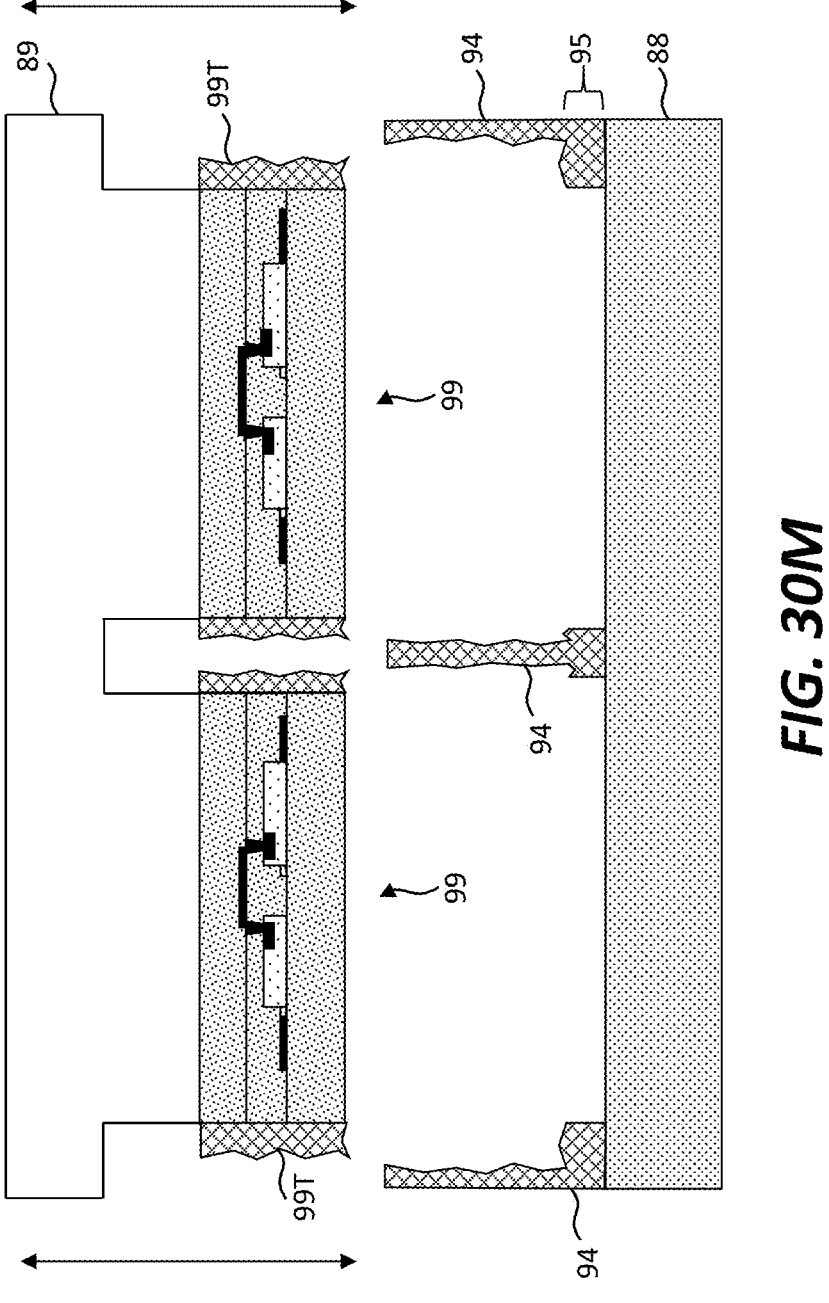
Figures 30N, 30O:
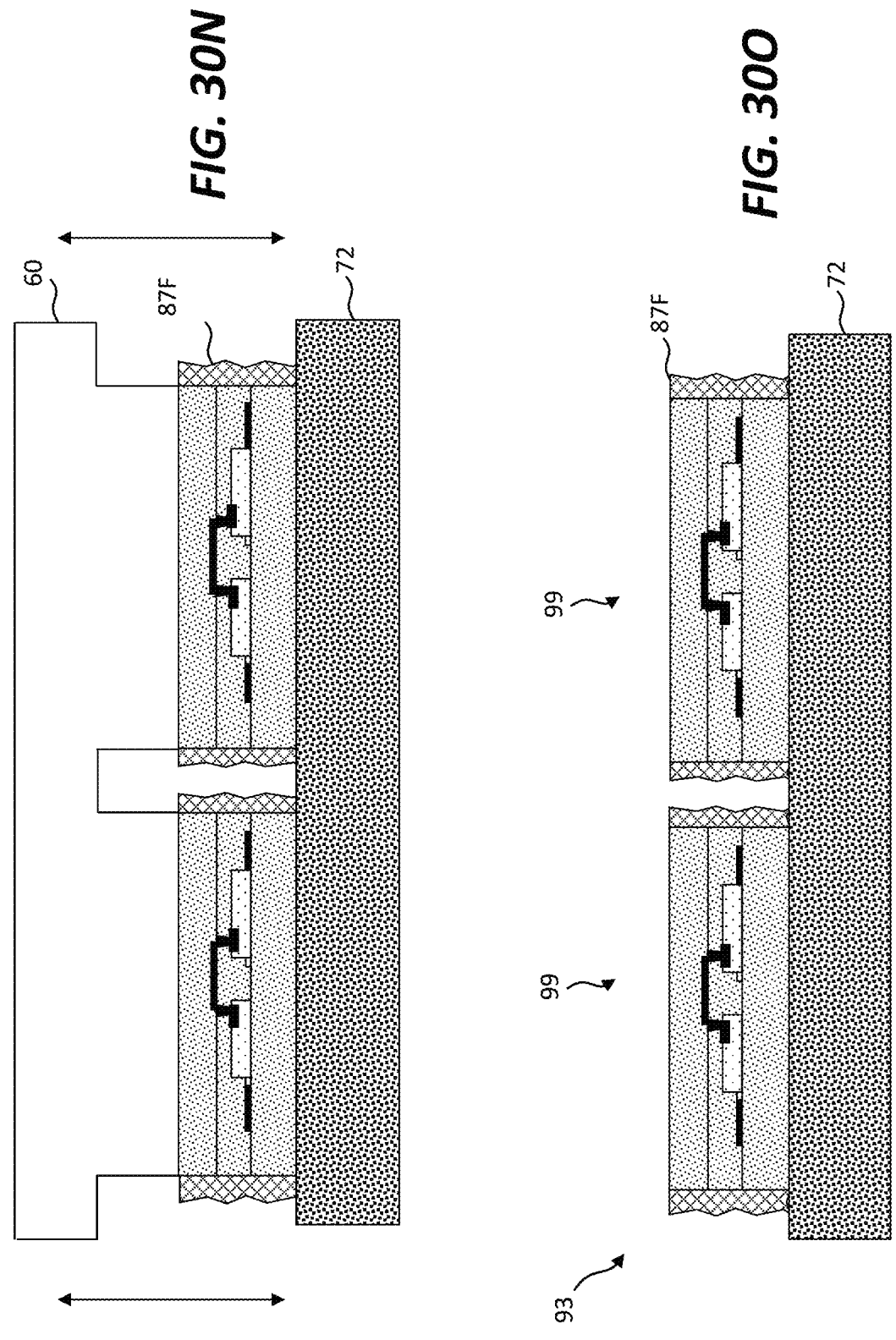
Figure 31:
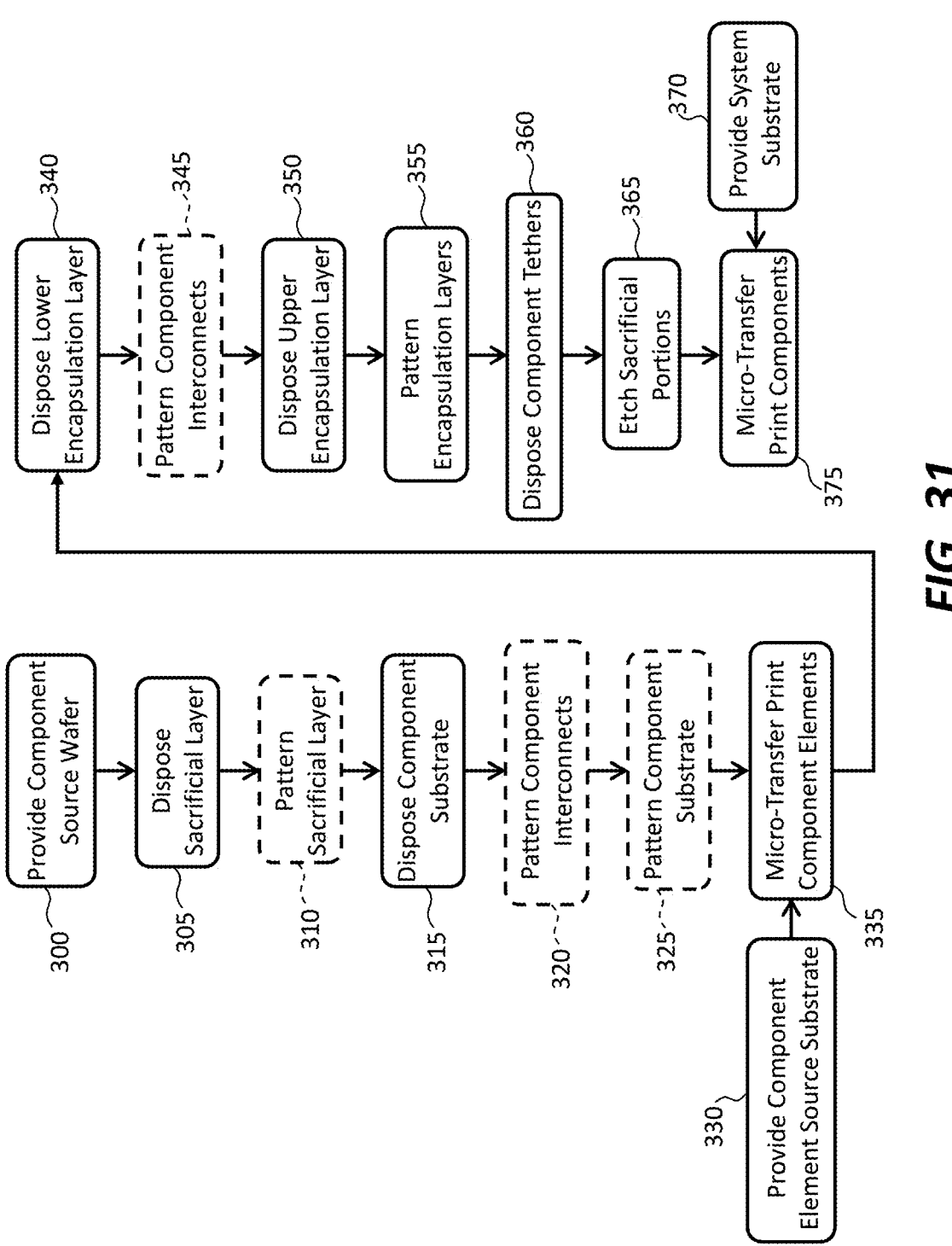
Figure 32:
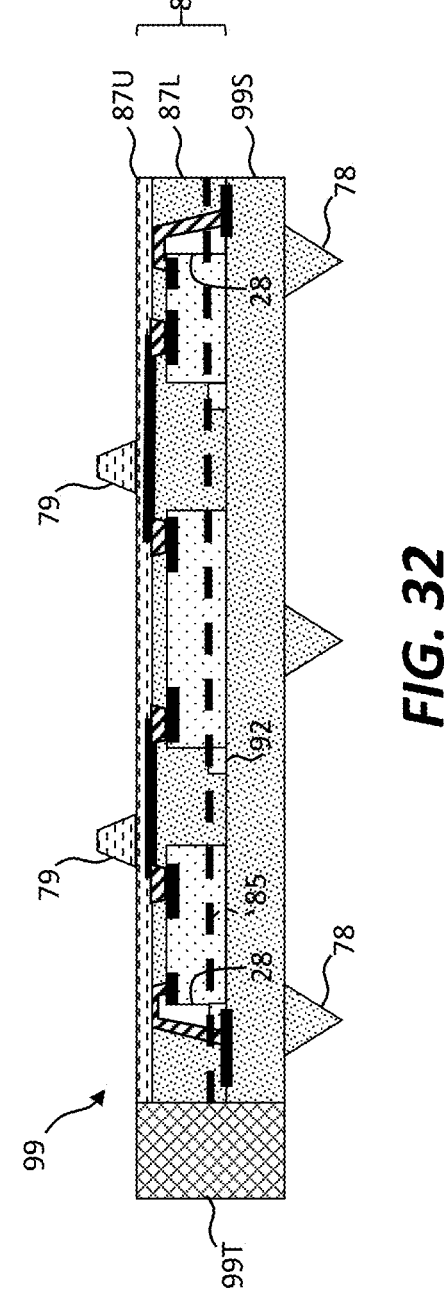
Figures 34A, 34B:
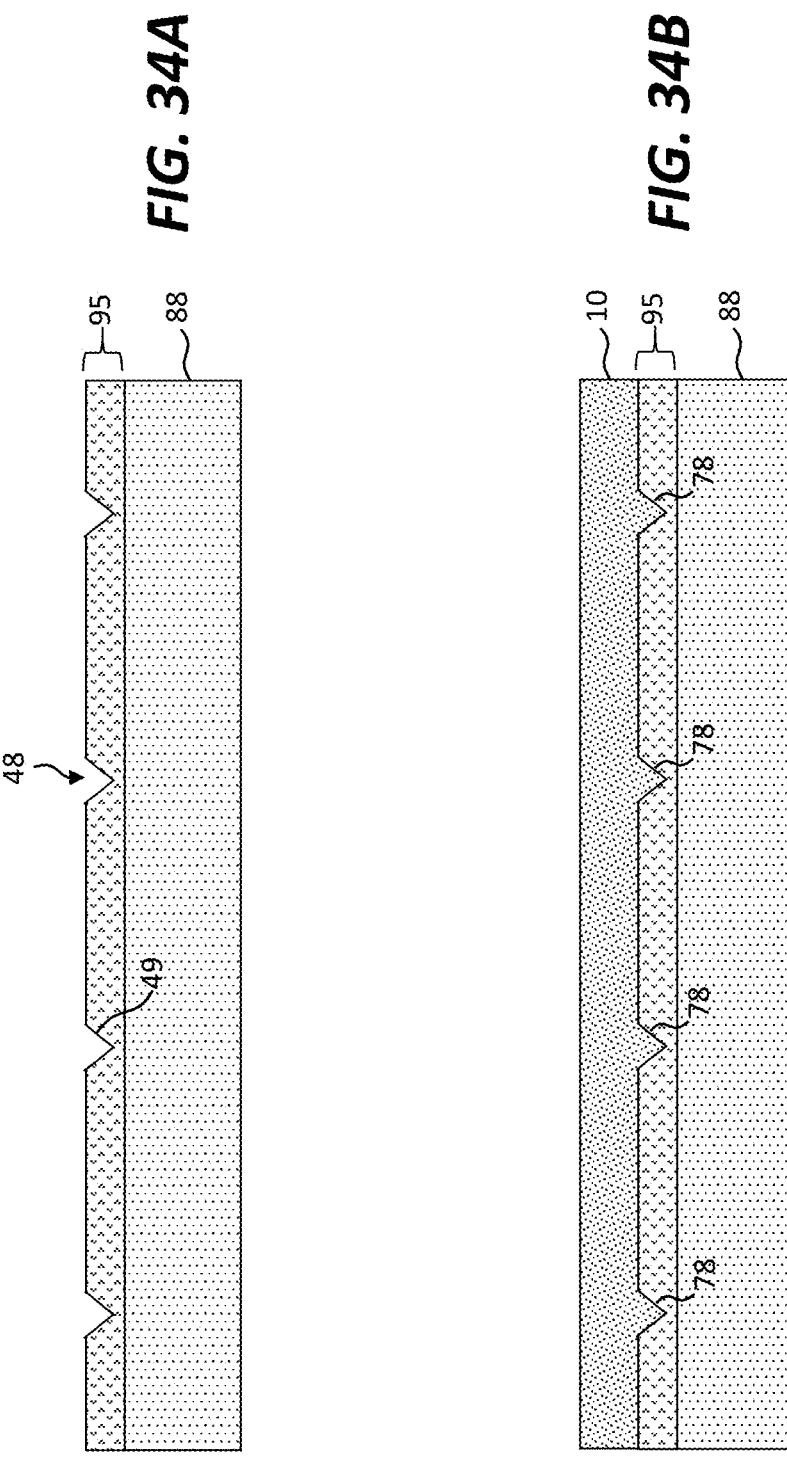
Figure 35:
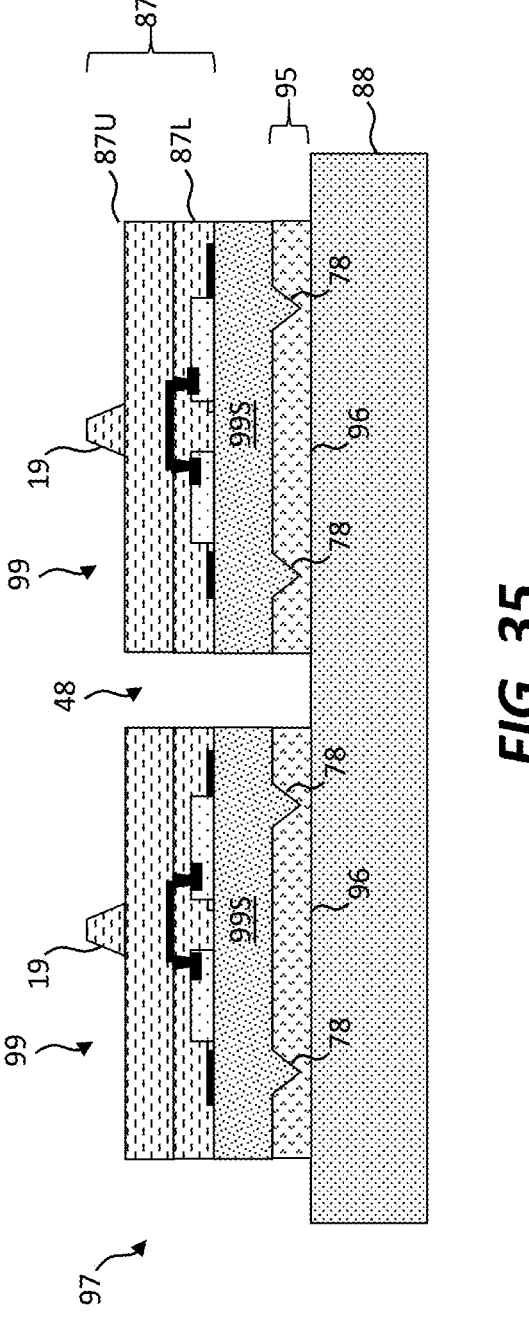
Figures 36A, 36B:
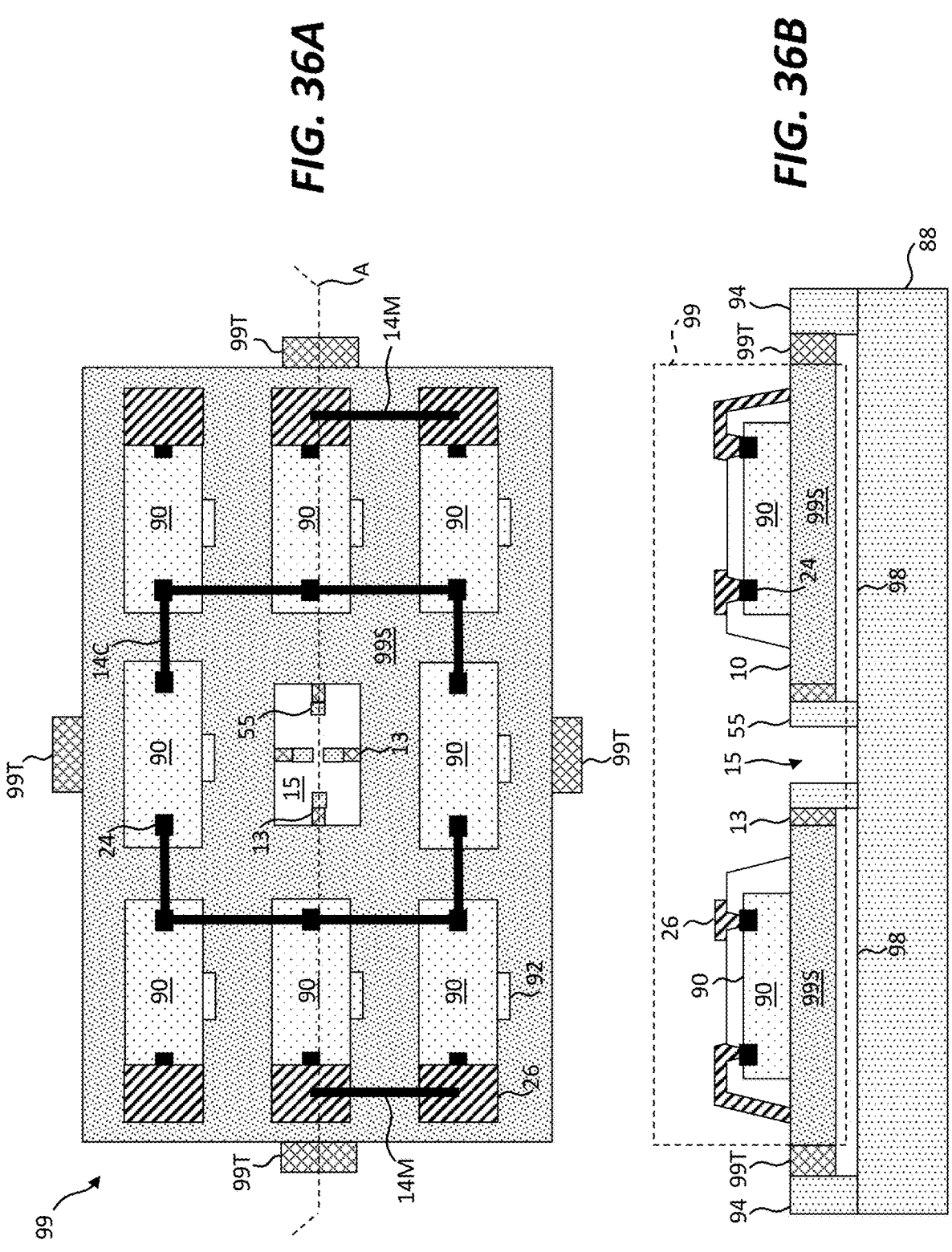
Figure 38A:
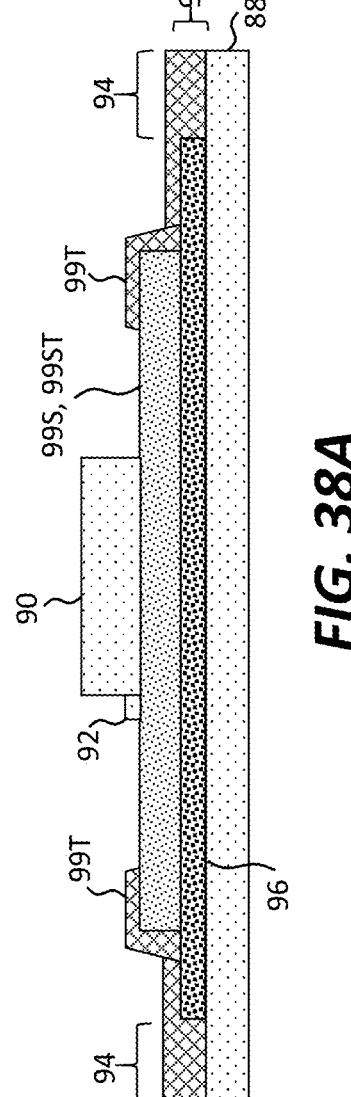
Figure 38B:
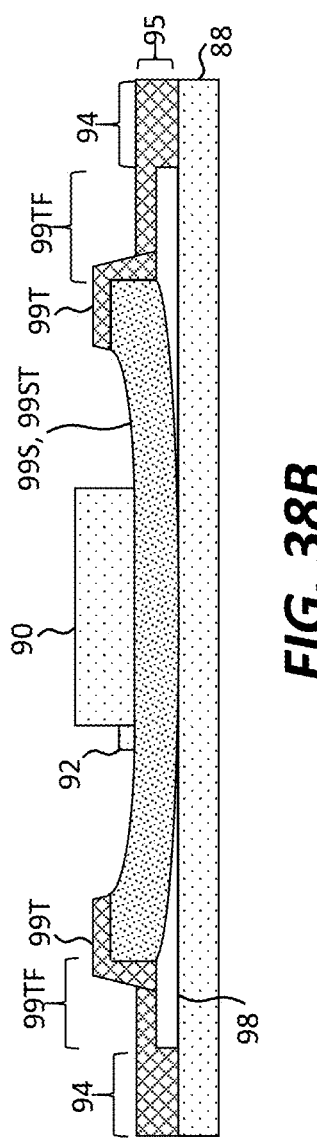
Figures 39, 40:
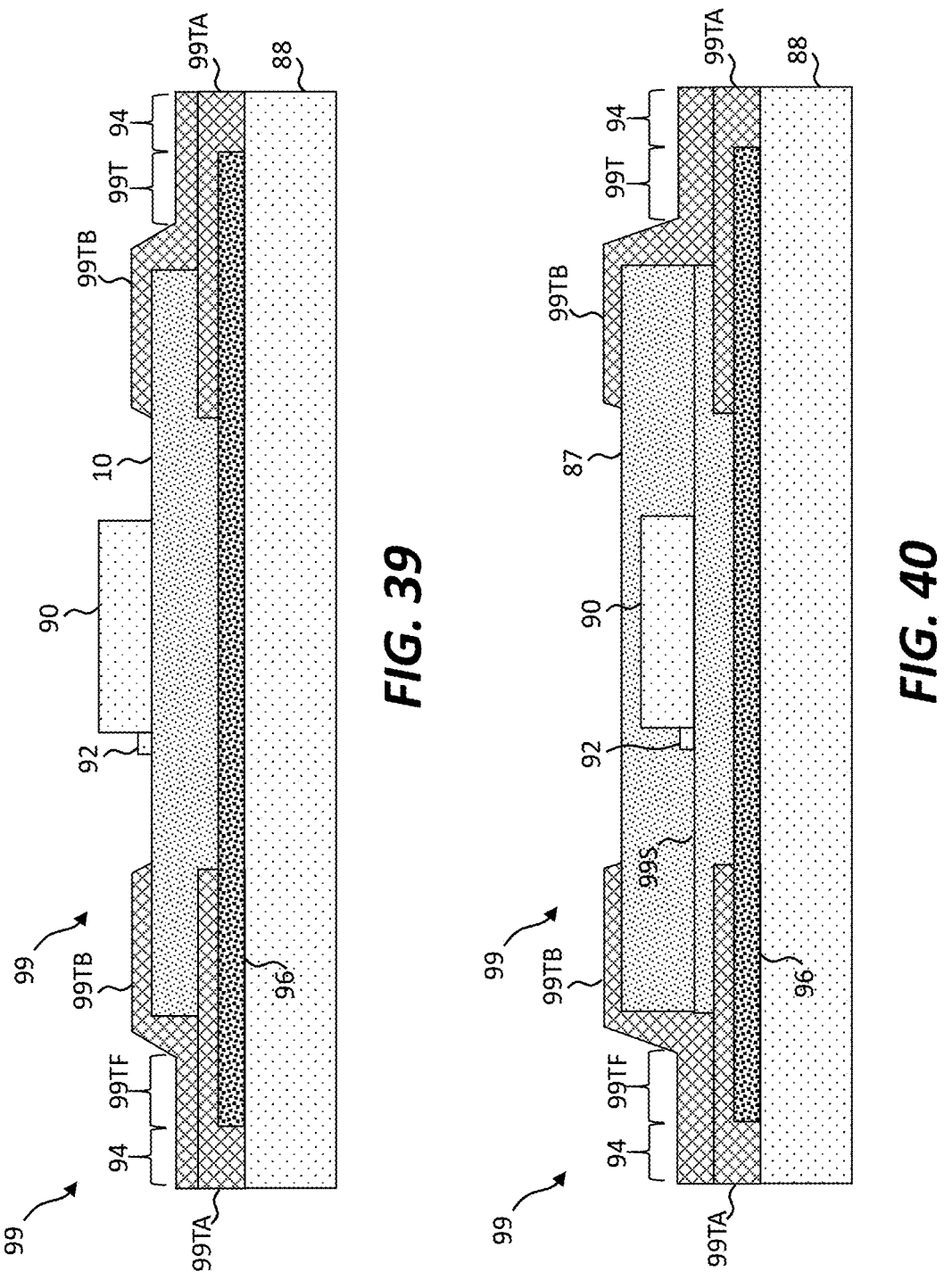
Figure 41:
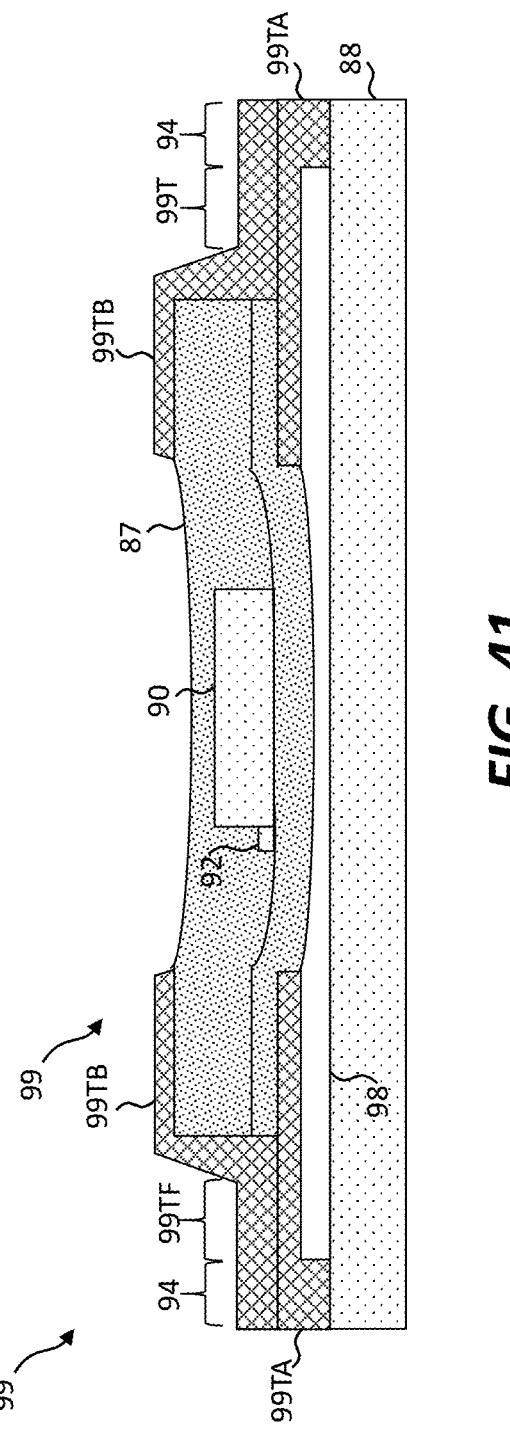
Figure 42A:
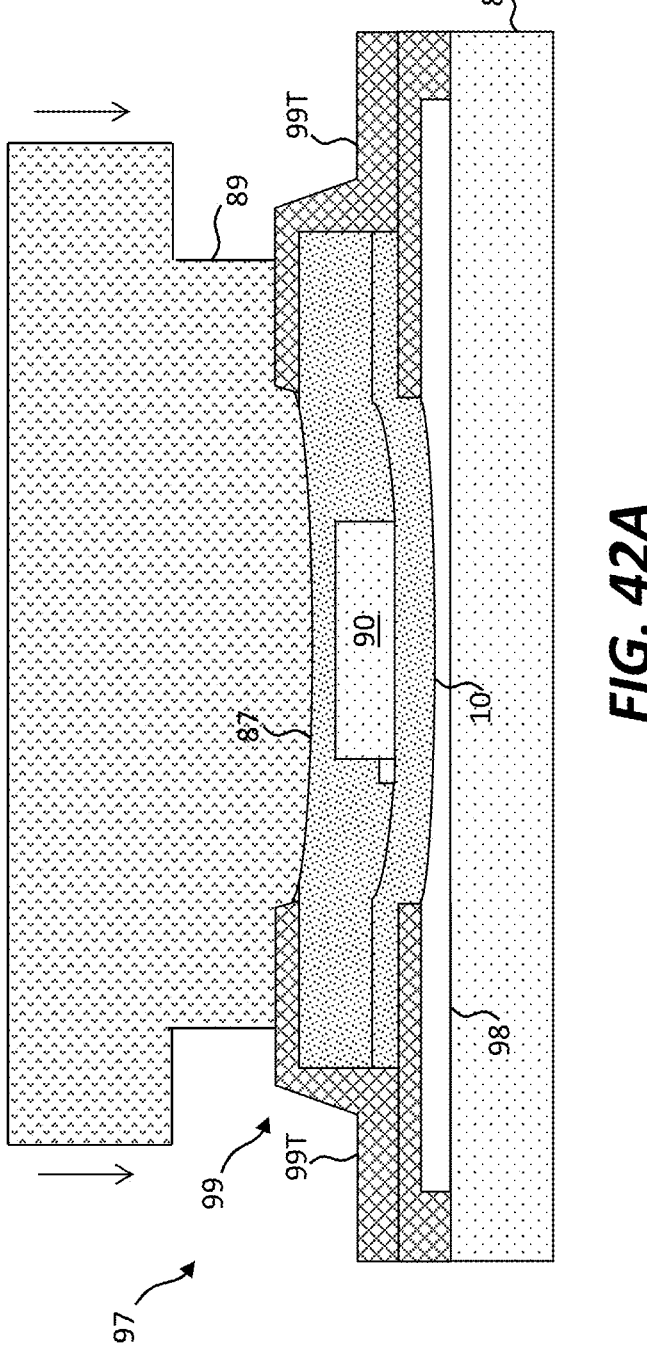
Figure 42B:
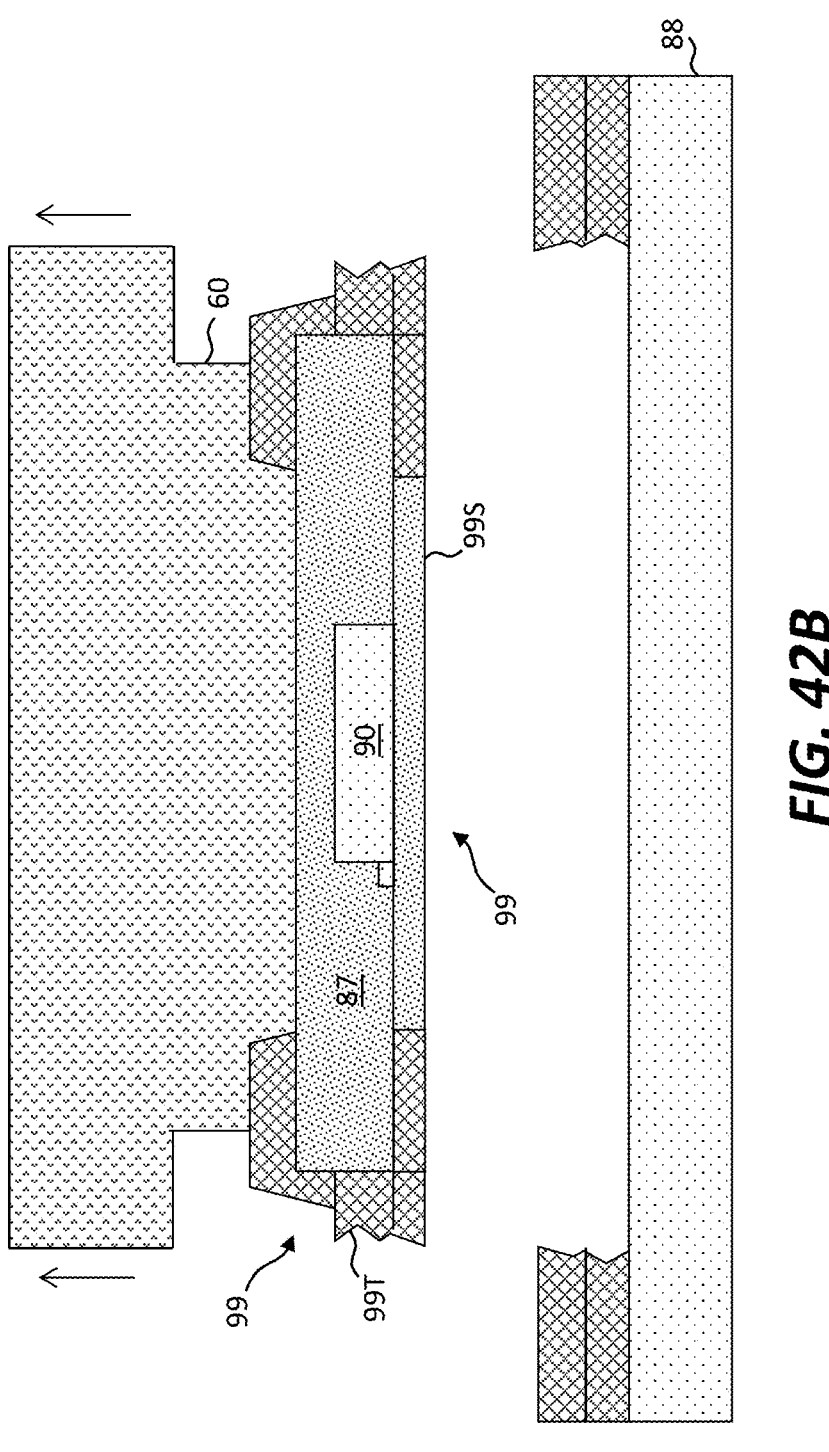
Figure 43A:
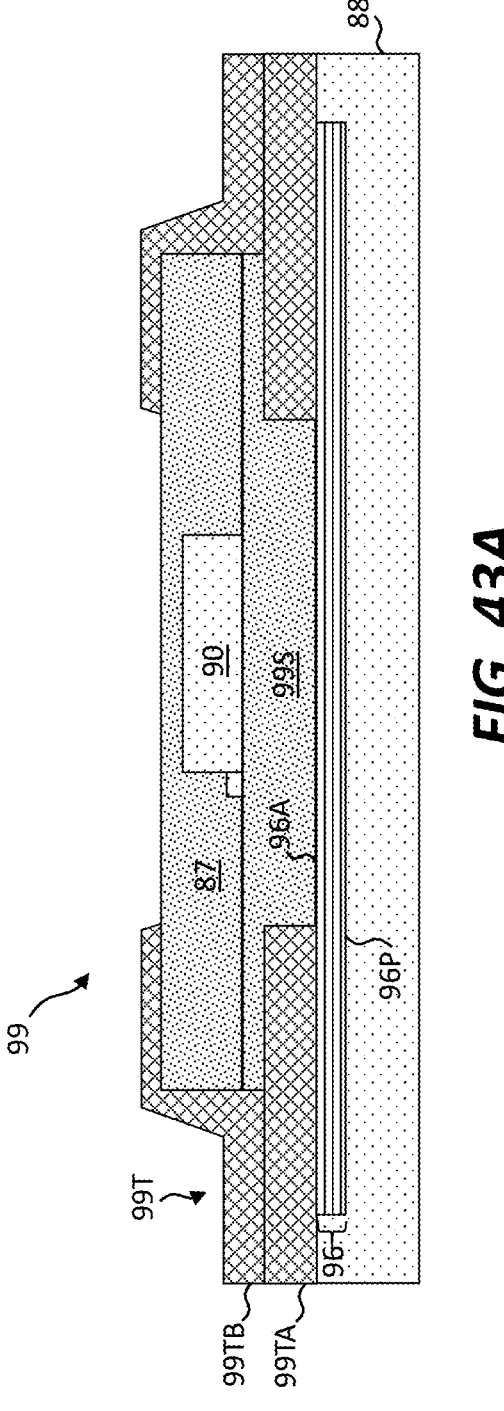
Figure 43B:
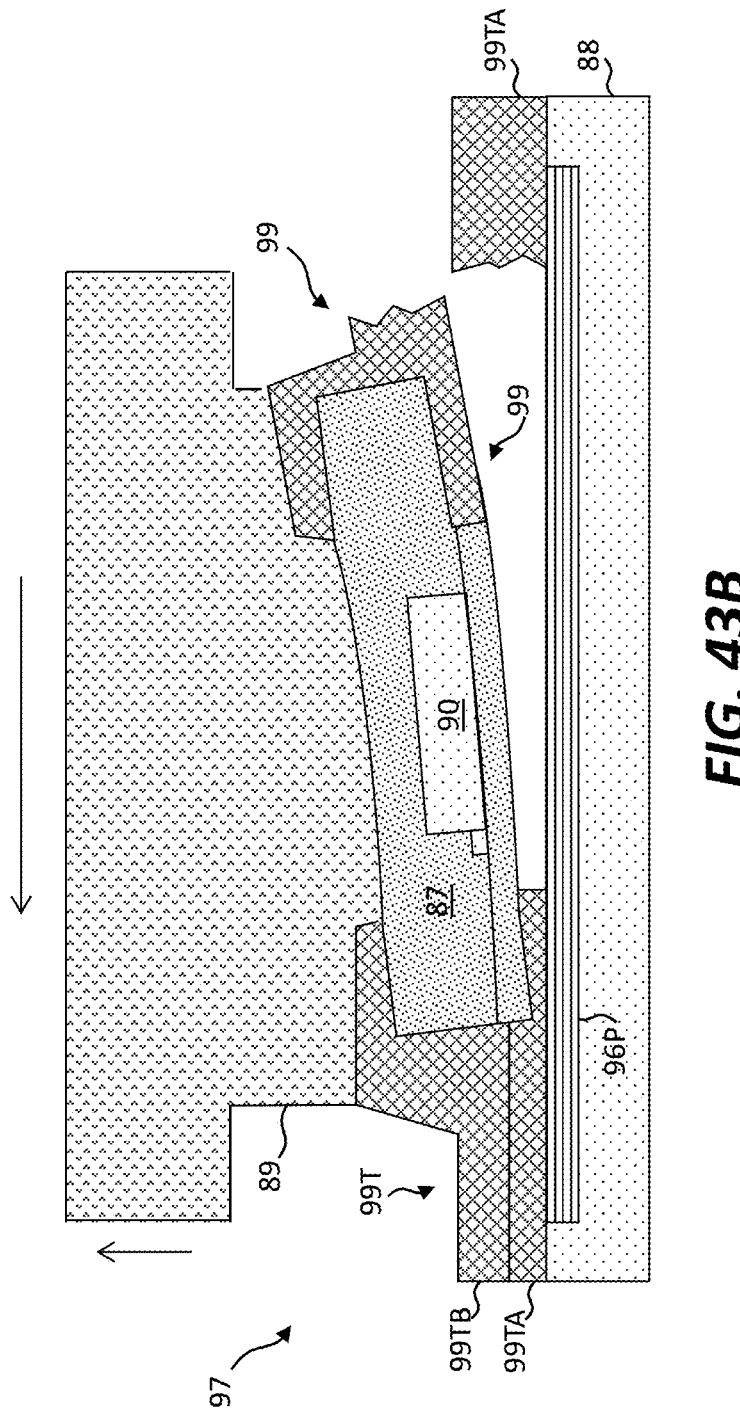
Figure 43C:
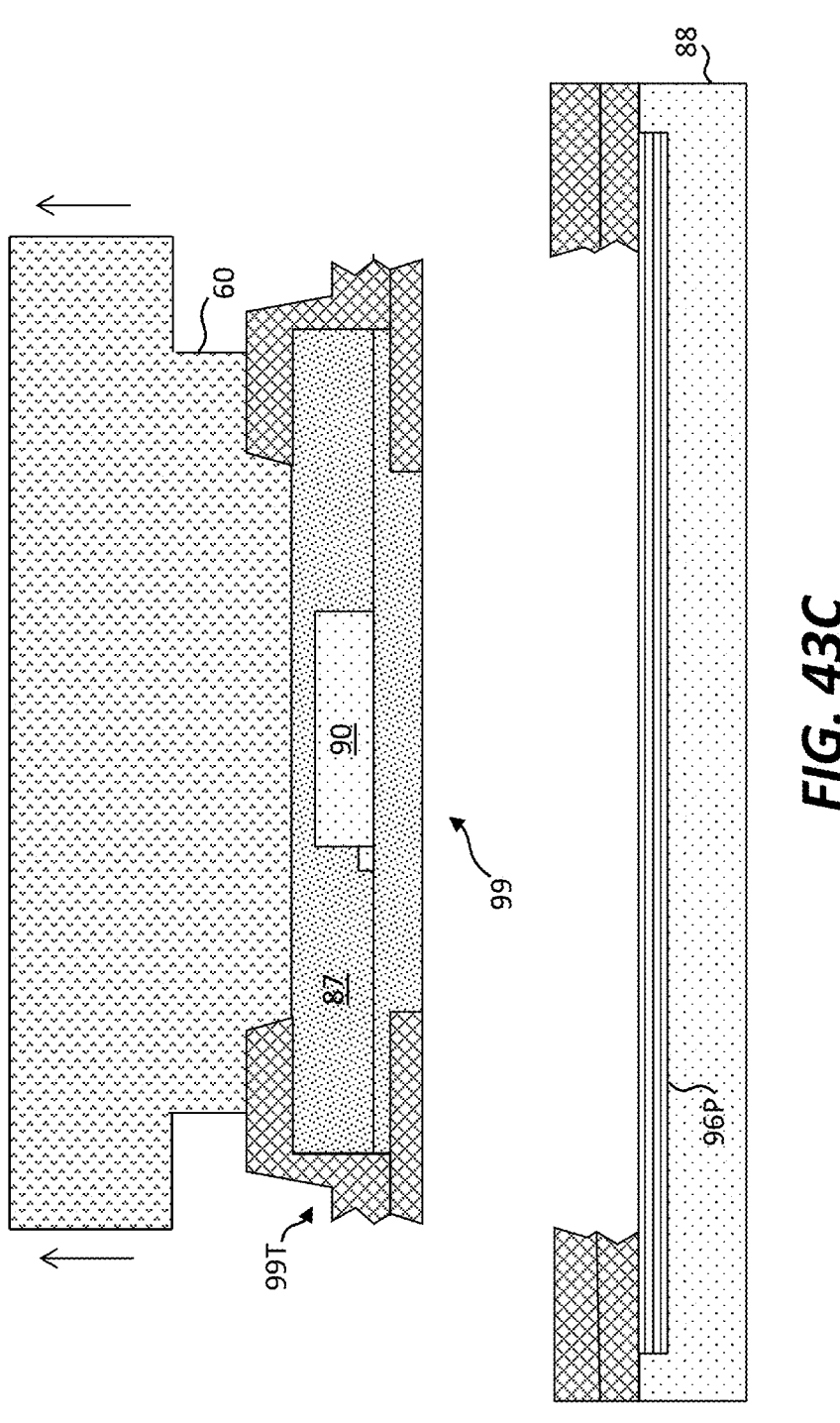
Figure 45:
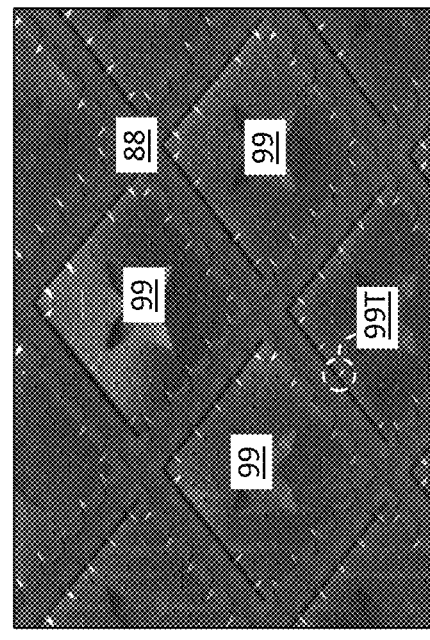
Figure 46:
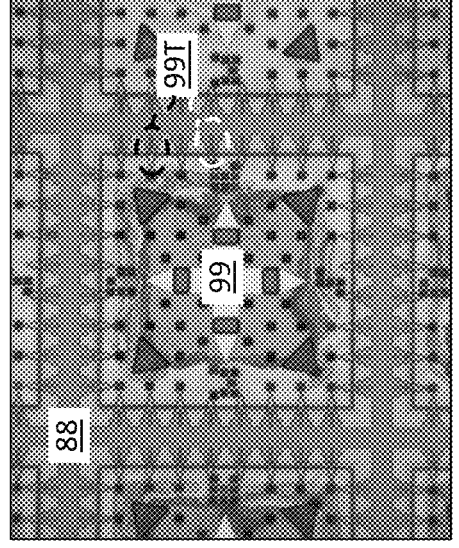
Figure 44:
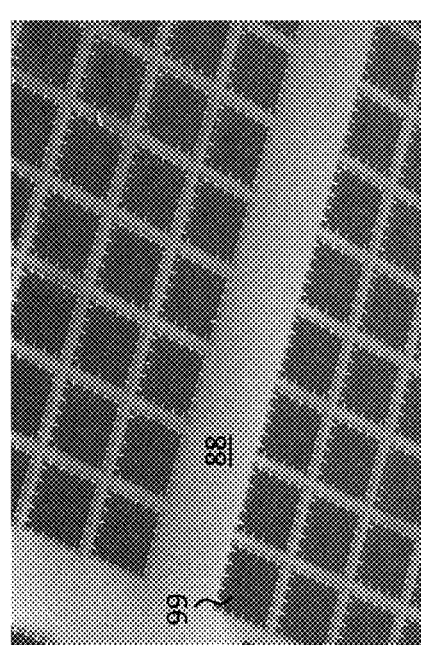
Figure 48:
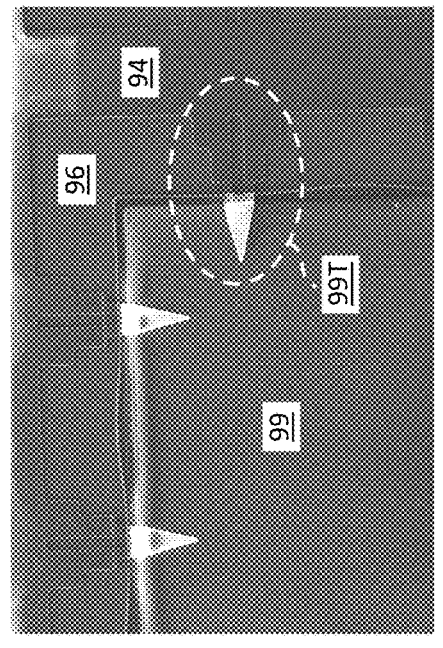
Figure 47:
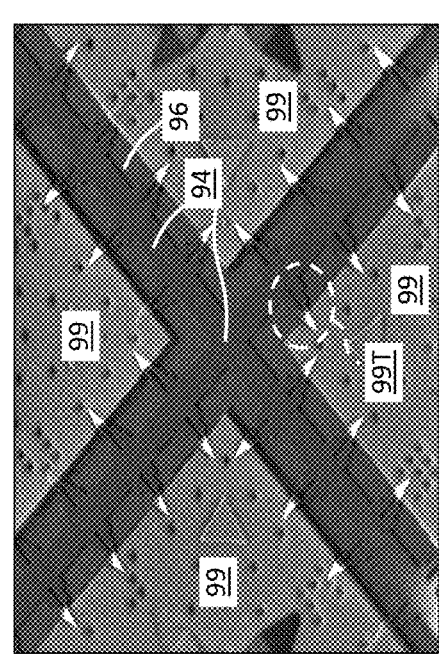
Figure 49:
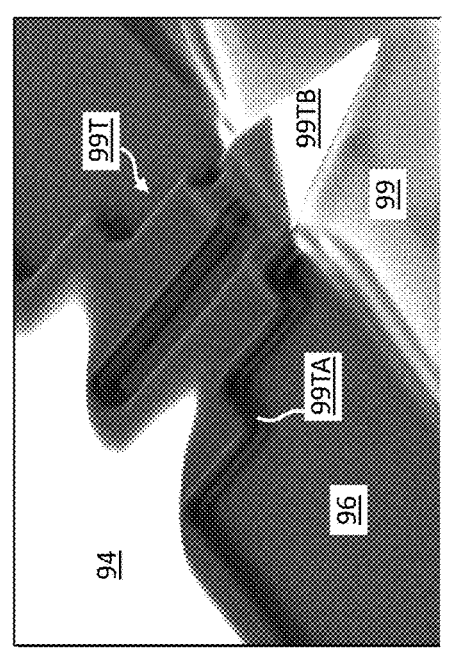

FIG. 6 is a schematic diagram of one side of a hybrid currency banknote according to illustrative embodiments of the present disclosure;

FIG. 7 is a schematic diagram illustrating a component according to illustrative embodiments of the present disclosure;

FIGS. 8-9 are flow charts illustrating methods according to illustrative embodiments of the present disclosure;

FIG. 10 is a schematic diagram of a component according to illustrative embodiments of the present disclosure;

FIG. 11 is a schematic diagram of a power converter according to illustrative embodiments of the present disclosure;

FIG. 12 is a cross section of a piezoelectric individual power-source element according to illustrative embodiments of the present disclosure;

FIG. 13 is a schematic illustration of a method according to illustrative embodiments of the present disclosure;

FIG. 14 is a schematic illustration of methods of operating illustrative embodiments of the present disclosure;

FIG. 15 is a schematic cross section illustration of an inorganic light-emitting diode with an LED tether according to illustrative embodiments of the present disclosure;

FIG. 16 is a schematic cross section illustration of a convertor or controller, or both, with a respective converter or controller tether according to illustrative embodiments of the present disclosure;

FIG. 17 is a perspective of a component with a component tether according to illustrative embodiments of the present disclosure;

FIG. 18 is a schematic illustration of a component comprising a power source according to illustrative embodiments of the present disclosure;

FIG. 19 is a perspective of an individual power-source element comprising first and second electrodes on either side of piezoelectric material according to illustrative embodiments of the present disclosure;

FIG. 20 is an electrical schematic diagram of a power source, convertor, and light-emitting diodes according to illustrative embodiments of the present disclosure;

FIG. 21 is a simplified schematic cross section of a component according to illustrative embodiments of the present disclosure;

FIG. 22 is a simplified schematic cross section of a component comprising an encapsulation layer and mechanically neutral stress plane according to illustrative embodiments of the present disclosure;

FIGS. 23A and 23B are schematic cross sections of components comprising an encapsulation layer and component-element interconnections according to illustrative embodiments of the present disclosure;

FIG. 24 is a schematic cross section of a component comprising a component substrate, dielectric structures, and component-element interconnections according to illustrative embodiments of the present disclosure;

FIGS. 25A-25D are schematic cross sections of multi-layer component substrates according to illustrative embodiments of the present disclosure;

FIG. 26 is a schematic cross section of a component substrate with a component tether according to illustrative embodiments of the present disclosure;

FIGS. 27A-27C are schematic cross sections of a multi-layer encapsulation layer according to illustrative embodiments of the present disclosure;

FIG. 28 is a schematic top view of a component with multiple component elements, multiple component tethers, and component-element interconnections according to illustrative embodiments of the present disclosure;

FIG. 29 is a schematic cross section of a component system comprising a component comprising multiple component elements according to illustrative embodiments of the present disclosure;

FIGS. 30A-30O are successive schematic cross sections illustrating exemplary methods, component wafers, and structures in the construction and printing of exemplary components according to illustrative embodiments of the present disclosure;

FIG. 31 is a flow diagram showing methods and structures according to illustrative embodiments of the present disclosure;

FIG. 32 is a schematic cross section of component with anti-stiction structures (e.g., spikes) according to illustrative embodiments of the present disclosure;

FIGS. 33A-33E are successive schematic cross sections illustrating exemplary methods and structures in the construction of exemplary components according to illustrative embodiments of the present disclosure;

FIGS. 34A-34B are successive schematic cross sections of processed wafers according to illustrative embodiments of the present disclosure;

FIG. 35 is a schematic cross section illustrating exemplary methods and component structures according to illustrative embodiments of the present disclosure;

FIG. 36A is a schematic plan view and FIG. 36B is a corresponding cross section taken along cross section line A of FIG. 36A illustrating internal module cavities and internal component tethers according to illustrative embodiments of the present disclosure;

FIGS. 37A-37G are cross sections of component tether, component substrate, and encapsulation layer structures according to illustrative embodiments of the present disclosure;

FIGS. 38A-38B are cross sections of a component and component source wafer useful in understanding and according to illustrative embodiments of the present disclosure;

FIGS. 39 and 40 are cross sections of a component source wafer according to illustrative embodiments of the present disclosure;

FIG. 41 is a cross section of a component source wafer with a micro-component disposed over a gap according to illustrative embodiments of the present disclosure;

FIGS. 42A-42B are successive cross sections of structures enabling micro-transfer printing of a component according to illustrative embodiments of the present disclosure;

FIGS. 43A-43C are successive cross sections of micro-transfer printing a component by peeling the component from a low-adhesion surface according to illustrative embodiments of the present disclosure; and FIGS. 44-49 are micro-graphs of micro-component source wafers according to illustrative embodiments of the present disclosure.

Figure 1:
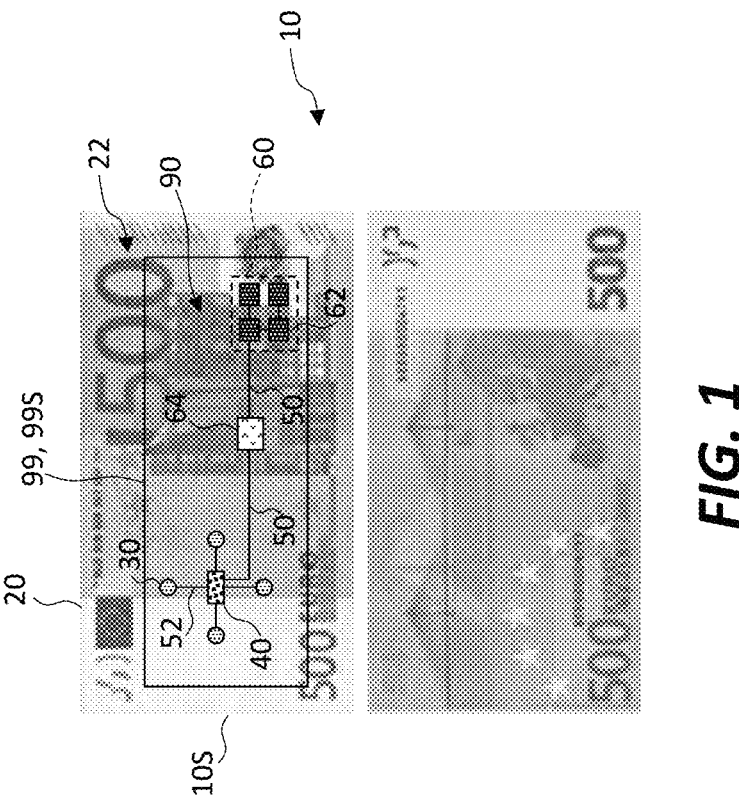
FIG. 1 is a plan view of the front and back sides of a hybrid currency document according to illustrative embodiments of the present disclosure.
Figure 50:
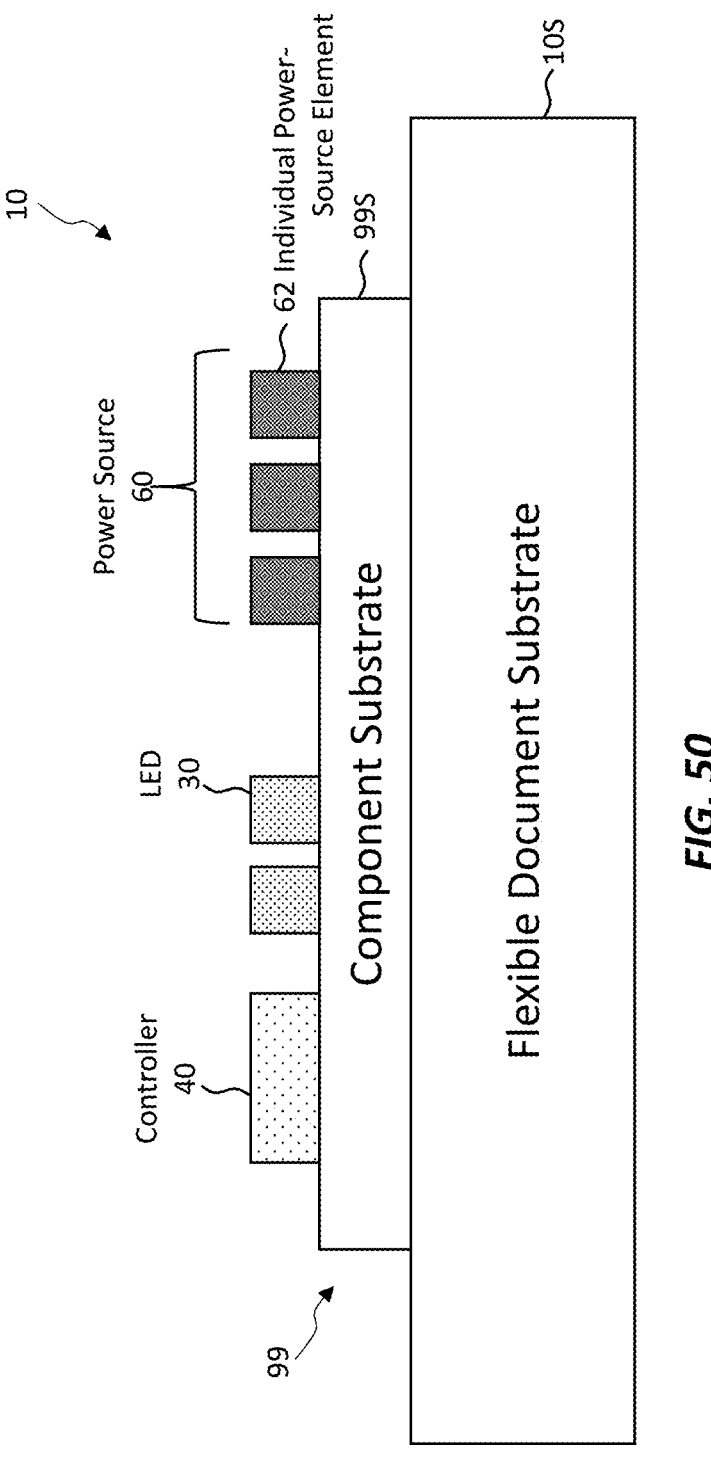
Figure 51A:
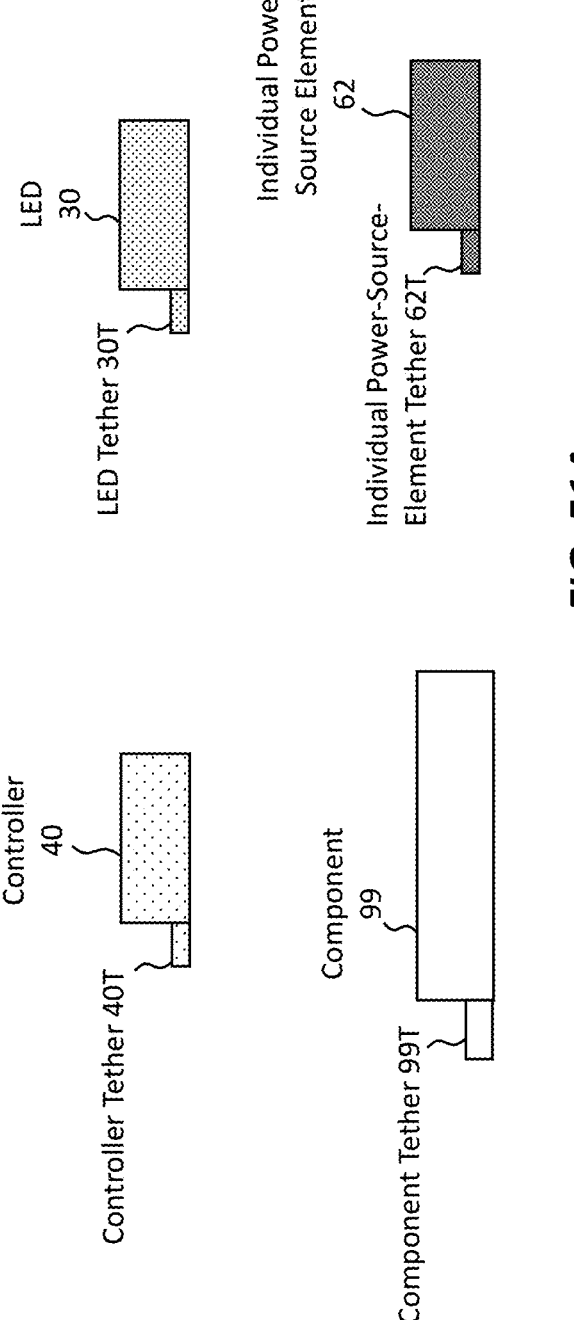
Figure 51B:
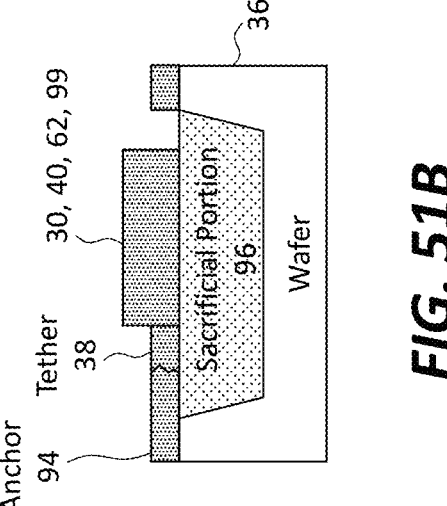
Figure 52:
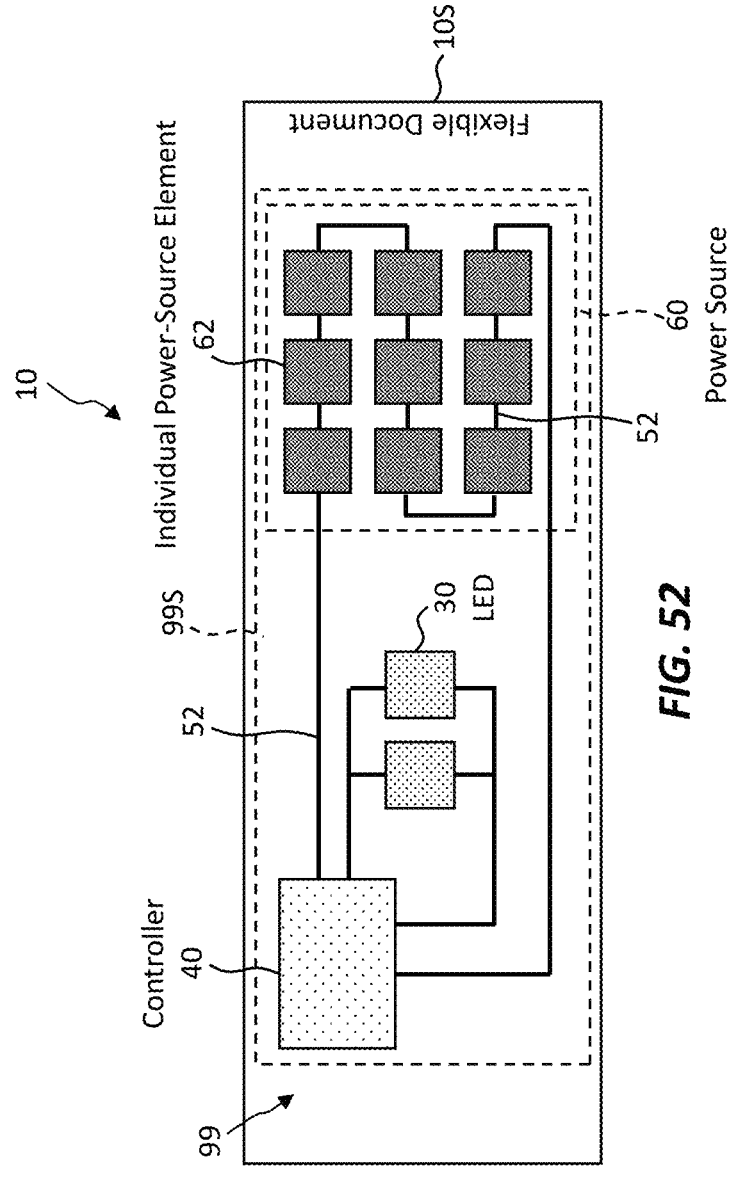
Figure 53:
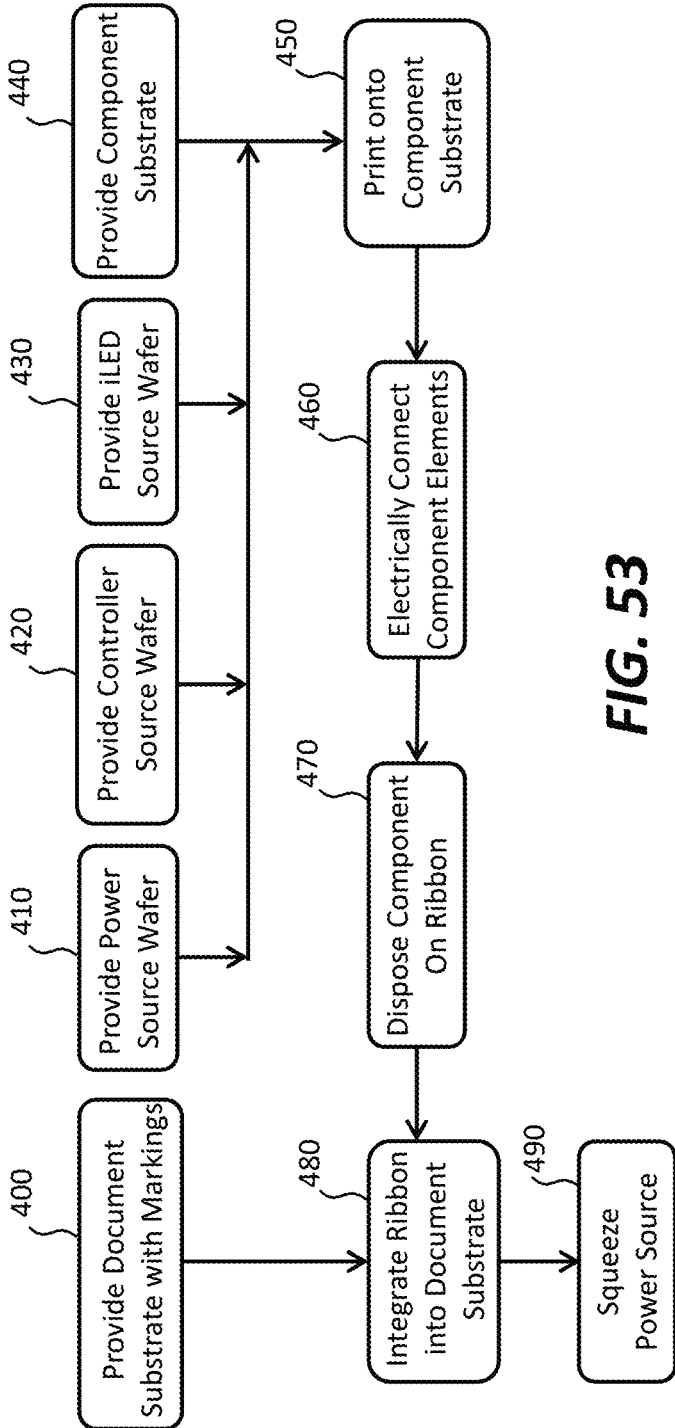
Figure 54:
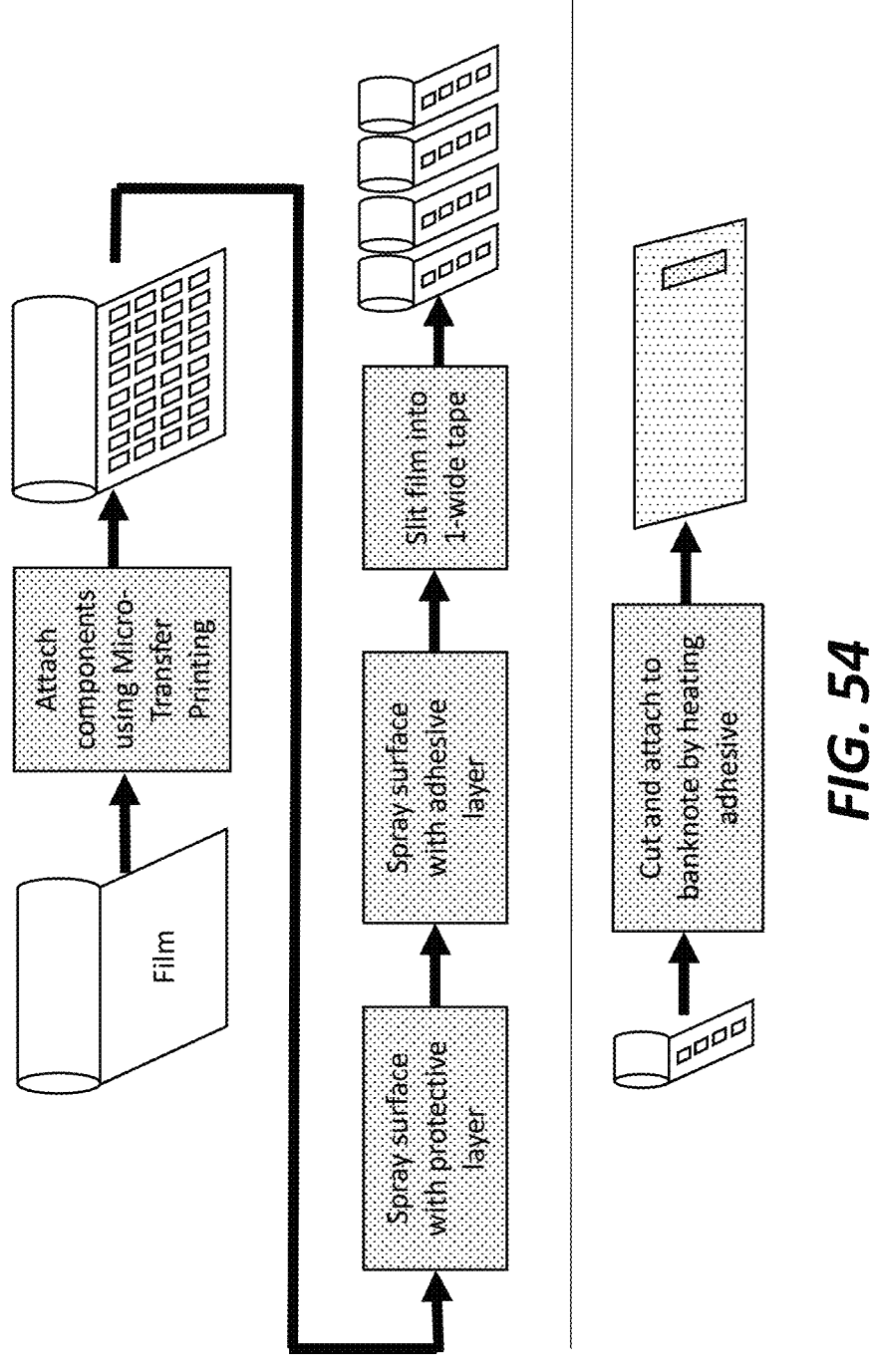

FIG. 50 is an illustration of a cross section of a hybrid sheet that is a hybrid document, according to illustrative embodiments of the present disclosure;

FIG. 51A illustrates micro-transfer printable or printed component elements including a controller, light-emitting diode (LED), individual power-source element, and component (e.g., comprising a controller, LED, and individual power-source elements), according to illustrative embodiments of the present disclosure;

FIG. 51B is a schematic illustration of a micro-transfer printable structure and source wafer according to illustrative embodiments of the present disclosure;

FIG. 52 is an illustration of a plan view the hybrid sheet of FIG. 1, according to illustrative embodiments of the present disclosure;

FIG. 53 is a flow diagram of a method of making a hybrid sheet (e.g., hybrid document), according to illustrative embodiments of the present disclosure; and FIG. 54 is a flow diagram of a method of making a hybrid sheet (e.g., hybrid document), according to illustrative embodiments of the present disclosure.

DETAILED DESCRIPTION OF CERTAIN EMBODIMENTS

It is contemplated that systems, devices, methods, and processes of the disclosure encompass variations and adaptations developed using information from the embodiments described herein. Adaptation and/or modification of the systems, devices, methods, and processes described herein can be performed by those of ordinary skill in the relevant art.

Throughout the description, where articles, devices, and systems are described as having, including, or comprising specific components, or where processes and methods are described as having, including, or comprising specific steps, it is contemplated that, additionally, there are articles, devices, and systems according to certain embodiments of the present disclosure that consist essentially of, or consist of, the recited components, and that there are processes and methods according to certain embodiments of the present disclosure that consist essentially of, or consist of, the recited processing steps.

Referring to FIG. 1, in some embodiments of the present disclosure, a hybrid currency banknote 10 includes a banknote 20 having visible markings 22. Banknote 20 can be a government-issued banknote 20 or other document 20 indicated by visible markings 22 and can comprise a flexible substrate 10S that includes paper, plastic, or impregnated paper. One or more light-controlling elements 30, a controller 40, a power converter 64, and power source 60 (e.g., together or any one a component element 90) can be provided on a component substrate 99S in a component disposed on flexible substrate 10S and embedded in or on banknote 20. Component substrate 99S can be more flexible than one or more or any of component elements 90 but less flexible than flexible substrate 10S. In some embodiments, component substrate 99S comprises polyimide. Controller 40 can be electrically connected to the one or more light-controlling elements 30 with wires 52 for controlling the one or more light-controlling elements 30. A power connection 50 is electrically connected to controller 40 from power source 60, one or more light-controlling elements 30, or both, with wires 52. In some embodiments, power source 60 is electrically connected to power connection 50, for example directly to power connection 50 (not shown) or through power convertor 64 (as shown). Power source 60 can comprise separate individual power-source elements 62 spatially distributed over component substrate 99S of component 99 and electrically connected (e.g., in series, in parallel, or both) with wires 52. Power source 60 and controller 40 can be a common element or a common circuit and controller 40 can be a power conditioning circuit or can include analog or digital control circuitry. Controller 40, light-controlling elements 30 and power connection 50 can be electrically connected, for example with wires 52. Multiple controllers 40 can be used to provide redundancy, reduce failures, and increase lifetime. The multiple controllers 40 can be connected in parallel with common input, output, power, and ground connections. In other embodiments, controller 40 can include multiple circuits in multiple integrated circuits and include discrete devices, such as capacitors and resistors that can provide additional control support, for example as timing or trimming devices to support light-controlling element 30 flash rates, filter devices such as acoustic wave devices (either bulk or surface).

Document 20 can be a conventional printed document such as a label, a commercial document such as a certificate, a stock certificate, a printed value-bearing document, a bond, or a bearer bond or a government-issued document such as an identification document, a passport, a monetary instrument, or a license and can include additional anti-counterfeiting features such as are found in high-security documents. A bond can be a commercial, municipal, or corporate bond, a government-issued bond, or bearer bond, or other debt security. A high-security document is a document 20 that includes a security feature and document 20 can be a high-security document. In some embodiments, and as described herein, a banknote 20 is a high-security document 20. Other high-security documents 20 include passports and identification cards such as driver's licenses or other government-issued identification. As used herein, the term "banknote" is used synonymously with high-security document 20 and any reference to "banknote" 20 can also be a reference to a high-security document 20. Banknote 20 can be a government-issued banknote 20 and can include visible markings 22 such as value indicators, decorative elements, and anti-counterfeiting structures or markings.

Component elements 90 can be, or can be a part of, or can include one or more integrated circuits and, in some embodiments, can be or include a small micro-transfer printable integrated circuit such as a chiplet, or a semiconductor for example having an area no greater than 100,000, 50,000, 20,000, 10,000, 5,000, 1,000, 500, 250, or 100 square microns. In embodiments, component elements 90 can be a small micro-transfer printable module, for example formed on a semiconductor or other substrate such as glass or plastic having an area no greater than 100,000, 50,000, 20,000, 10,000, 5,000, 1,000, 500, 250, or 100 square microns. Similarly, component 99 can comprise electrically connected component elements 90 on component substrate 99S for example having an area less than 100,000, 50,000, 20,000, 10,000, 5,000, 1,000, 500, 250, or 100 square microns. In embodiments, component 99 can be a small micro-transfer printable module, for example formed on a polymer substrate or flexible glass substrate having an area no greater than 100,000, 50,000, 20,000, 10,000, 5,000, 1,000, 500, 250, or 100 square microns. Component substrate 99S and component 99 can have a thickness of only a few microns and the completed structure can have a thickness of less than 35 μm. Component substrate 99S can have a length or width (or both) of, for example no greater than 1 mm, no greater than 500 microns, no greater than 250 microns, no greater than 100 microns, or no greater than 50 microns. Component substrate 99S can have a thickness no greater than 100 microns, no greater than 50 microns, no greater than 20 microns, no greater than 15 microns, no greater than 12 microns, no greater than 10 microns, or no greater than 5 microns.

Hybrid currency banknote 10 (e.g., hybrid banknote 10) can include a plurality of components 99 and in embodiments there is no electrical interconnection between the various components 99 so that each component 99 is electrically separate, independent, and disconnected from any other component 99 and can also be spatially separated and physically independent and separated, although components 99 can be arranged in a desired pattern on document substrate 10S. Components 99 can each have a separate and independent component substrate 99S different from the banknote 20 and document substrate 10S.

Power source 60 can be a piezoelectric power source, can incorporate MEMS devices, and power convertor 64 can convert the power provided by power source 60 to a form that is used by controller 40, light-controlling elements 30, or both. Power convertor 64 can include power storage, for example using capacitors such as thin-film capacitors with a high-K dielectric to provide power over a time period. The capacitors can be spatially distributed, electrically connected separate capacitors (e.g., with wires 52), for example located among the individual power-source element 62 on component substrate 99S. Output diodes can be used to isolate power source 60 or light-controlling elements 30. In one arrangement, power source 60 is indicated by visible markings 22, power source 60 forms a part of visible markings 22, or power source 60 is obscured by visible markings 22. Multiple power sources 60 and multiple power convertors 64 can be used to provide redundancy.

Wires 52 can be constructed on component substrate 99S and component elements 90 using photolithographic techniques. Wires 52 can be patterned over component elements 90 and component substrate 99S, for example by evaporating or sputtering an aluminum metallization layer and pattern-wise etching (using optically sensitive photoresist and optical masks) the metal layer to form the wires 52. An insulating or protective dielectric can be deposited, for example silicon dioxide using sputtering or evaporation, or by coating or laminating a layer of a dielectric material such as SU8 over wires 52, component elements 90, and component substrate 99S.

In some embodiments, power source 60 comprises a plurality of electrically connected but physically separated individual power-source element 62. Power source 60 can be a piezoelectric power source activated by pressure, or a piezoelectric power source activated by movement, for example flapping flexible banknote 20 or bringing ends of flexible banknote 20 near to each other (e.g., as in folding flexible banknote 20 in half) and then separating the ends of flexible banknote 20 from each other to the extent possible, e.g., flattening flexible banknote 20, thereby mechanically moving power source 60. Component 99 can be indicated by visible markings 22, component 99 can form a part of visible markings 22, or component 99 can be obscured by visible markings 22. Individual power-source elements 62 can be arranged in a 2-d array (as shown) or a 1-d array (not shown) and operated by squeezing, waving, pushing, pulling, stretching, or sliding an object across individual power-source elements 62, or providing other rapid movement, for example along the longest dimension of hybrid document 10.

Individual power-source elements 62 can be a group of elements that are operated at the same time with a single action, for example pressure applied to all of the individual power-source elements 62 simultaneously. Individual power-source element 62 can be electrically arranged in series to achieve a desired voltage or in parallel to achieve a desired current or some combination of series and parallel to achieve the desired power characteristics. The spatial area of individual power-source elements 62 over component substrate 99S can be designed to maximize power output from power source 60, for example corresponding to an area of an average finger such as from 0.5 cm$^2$ to 2 cm$^2$ or, for example, 1 cm$^2$.

Light-controlling elements 30 can be inorganic light-emitting diodes 30 such as micro-inorganic-light-emitting diodes 30 suitable for micro-transfer printing, for example made on a semiconductor wafer adapted to the manufacture of inorganic light-emitting diodes 30. In general, light-controlling elements 30 can be light-emitting elements, light-reflecting elements, inorganic light-emitting diodes, organic light-emitting diodes, micro-electromechanical reflective elements, reflective electrophoretic elements, or reflective electrochromic display elements. For clarity of exposition, light-controlling elements 30 of the present disclosure are referred to below as inorganic light-emitting diodes (iLEDs) 30. However, in various embodiments the present disclosure contemplates the use of a corresponding variety of light-controlling elements 30.

Controller 40 can be an integrated circuit, for example a small chiplet, suitable for micro-transfer printing. Controller 40 can include digital circuits or logic (for example CMOS circuits) and power circuits (for example for driving an LED 30 causing LED 30 to emit or otherwise control light). Controller 40 can include information storage circuits, a state machine, or a stored program machine to implement the desired functionality of the hybrid currency banknote 10. Controller 40 can read or write information such as currency values, process information, respond to input and provide output. Power connection 50 can be directly connected to controller 40 (as shown) or to iLEDs 30, or both. Alternatively, power connection 50 can indirectly connect to controller 40 or to iLEDs 30, or both, through power convertor 64 (as shown).

It can be desirable to fold or spindle hybrid currency banknote 10 of the present disclosure. To facilitate such a manipulation without damage to component 99, in embodiments of the present disclosure, power source 60 can comprise a plurality of electrically connected smaller individual power-source elements 62. A single large power source 60 can be too rigid to readily fold or curve, whereas an arrangement of individual smaller physically separate individual power-source elements 62 can allow folding between the smaller individual power-source elements 62, even if the smaller individual power-source elements 62 themselves are relatively rigid.

In some embodiments, iLEDs 30 and controller 40 are too small to be readily visible with the unaided human eye. Furthermore, iLEDs 30 and controller 40 can be located in areas of banknote 20 that include visible markings 22 to further obscure the presence of iLEDs 30 and controller 40, as well as any wires 52. Similarly, power source 60 or an arrangement of individual smaller individual power-source elements 62 can be obscured by visible markings 22. In some embodiments, any of iLEDs 30, controller 40, wires 52, power source 60, individual power-source elements 62, or power convertor 64 are marked with visible markings 22. For example, ink can be printed over iLEDs 30, controller 40, wires 52, power source 60, individual power-source elements 62, or power convertor 64 to obscure them or otherwise make them a part of visible markings 22 on banknote 20. Since iLEDs 30, controller 40, wires 52, power source 60, individual power-source elements 62, or power convertor 64 can each be very small, for example having a size in the micron range, they can be effectively invisible to the unaided human eye. For example, one or more inorganic micro-light-emitting diodes 30 or controller 40 of hybrid currency banknote 10 can have a width from 2 to 5 μm, 5 to 10 µm, 10 to 20 µm, or 20 to 50 µm, a length from 2 to 5 µm, 5 to 10 µm, 10 to 20 µm, or 20 to 50 µm, or a height (thickness) from 2 to 5 µm, 4 to 10 µm, 10 to 20 µm, or 20 to 50 µm.

In some embodiments of the present disclosure, iLEDs 30, controller 40, and power source 60 (and optionally power converter 64) are disposed (e.g., by micro-transfer printing) on component substrate 99S to form component 99 and component 99 is directly printed onto banknote 20, for example before or after banknote 20 is printed with ink. Referring to FIG. 2 in some embodiments, banknote 20 includes a metalized or metallic ribbon 70 or thread, for example Mylar". Component 99 is printed, for example micro-transfer printed, onto ribbon 70 and can therefor comprise at least a portion of a component tether 99T. In some embodiments, component 99 is assembled onto ribbon 70 by means other than micro-transfer printing, e.g., pick-and-place and does not comprise at least a portion of a component tether 99T. In such embodiments, iLEDs 30, individual power-source elements 62, optionally power converter 64, and controller 40 can each include at least a portion of a tether 38, resulting from fracturing a tether 38 on respective source wafers 36 (e.g., as generically shown in FIG. 51B) from which iLEDs 30, individual power-source elements 62, optionally power converter 64, and controller 40 originate and that connects iLEDs 30, individual power-source elements 62, optionally power converter 64, and controller 40 to an anchor on the respective source wafer 36 in the micro-transfer printing process. Ribbon 70 or thread is then incorporated into banknote 20 to make a hybrid currency banknote 10, according to some embodiments of the present disclosure.

Referring to FIG. 3, in some embodiments, one or more inorganic LEDs 30 are disposed in a location corresponding to a portion of visible markings 22 to highlight or otherwise indicate the portion of visible markings 22. For example, one or more inorganic LEDs 30 can underline or surround a graphic element of visible markings 22. As shown in FIG. 3, one or more inorganic LEDs 30 outline the numeral 5. Thus, one or more inorganic LEDs 30 can be disposed to form a graphic indicator such as any of one or more of a number, a letter, and a pictogram. The graphic indicator can have semantic content, for example indicating a value, a date, or a person.

Referring next to FIG. 4, one or more light pipes 32 can be located in association with one or more inorganic light-emitting diodes 30 to transmit light emitted by inorganic light-emitting diodes 30 through light pipes 32 and emit the transmitted light from the opposite end of light pipe 32. In some embodiments, light pipes 32 include portions that leak light at desired locations, for example by purposefully forming nicks, scratches, or other forms of light diffusers 34 in light pipes 32 to allow light to leak from light pipe 32. Thus, the arrangement of light pipes 32 can also correspond to a portion of visible markings 22 to highlight or otherwise indicate the portion of the visible markings 22, form a graphic indicator, or form any one or all of a number, a letter, and a pictogram to indicate a value, a date, or a person.

Controller 40 can control one or more inorganic light-emitting diodes 30 in a component 99 to flash or sequentially flash individual iLEDs 30, forming spatial, temporal, or temporal-spatial light patterns. Referring to FIG. 5, in some embodiments, inorganic light-emitting diodes 30 can emit different colors of light. For example, a red light-emitting diode 82 can emit red light, a green light-emitting diode 84 can emit green light, and a blue light-emitting diode 86 can emit blue light. Different inorganic light-emitting diodes 30 can be arranged spatially to form a display 80, a two-dimensional array, or a graphic element. The different components 99 can be disposed in groups for a desired effect, for example each numeral or graphic element in the disposed arrangement of components 99 can have a different color.

In some embodiments of the present disclosure and referring to FIG. 6, hybrid currency banknote 10 includes visible markings 22 that do not include a value. Such a hybrid currency banknote 10 can be a non-denominational banknote 20 that either has an assigned value or a variable value stored in a memory 44 in controller 40, as shown in FIG. 7. Referring to FIG. 7, an assigned value can be provided by providing a circuit 42 and memory 44 in controller 40 or providing circuits 42, such as memory 44, connected to controller 40. Memory 44 can be a read-only memory that encodes a desired assigned value. The assigned value can be a currency value or can include an electronic serial number, or both. In some embodiments, memory 44 of hybrid document 10 (e.g., hybrid currency banknote 10) includes an identifier or serial number, or other information such as printing date or origination that can be displayed by iLEDs 30 under the control of controller 40. Memory 44 can store, for example serial number information, value information, manufacturing information, usage information, or location information. The stored value can be discovered by providing power to power connection 50 by power source 60. The power energizes controller 40 which, in turn, controls iLEDs 30 to display or otherwise indicate the assigned value. Memory 44 can be protected from overwriting, damage, or alternative discovery by protective layers such as a protective shield 46 formed over memory 44 to discourage exposure by light and protect memory 44 from heat. Shield 46 can be a light shield, a light reflector, a light absorber, or a heat conductor.

Referring to FIG. 8, a hybrid currency banknote 10 of the present disclosure can be made by providing a banknote 20 with markings in step 100, for example by printing on a high-quality paper with ink using intaglio printing. An inorganic LED source wafer having micro-transfer printable iLEDs 30 is provided in step 110, a controller source wafer having micro-transfer printable controllers 40 is provided in step 120, and a power-source source wafer having micro-transfer individual power-source elements 62 is provided in step 130. A component source wafer 88 (as described further below, see FIG. 30B) having component substrates 99S is provided in step 140. iLEDs 30 are micro-transfer printed from the inorganic LED source wafer onto component substrate 99S using a stamp to fracture iLED tethers 30T connecting iLEDs 30 to the inorganic LED source wafer leaving at least a portion of an iLED tether 30T on the iLEDs 30 in step 140. Similarly, controller 40 is micro-transfer printed from the controller source wafer onto component substrate 99S using a stamp to fracture controller tethers 40T connecting controller 40 to the controller source wafer leaving at least a portion of a controller tether 40T on the controller 40 in step 140. Likewise, individual power-source elements 62 are micro-transfer printed from the power-source source wafer onto component substrate 99S using a stamp to fracture individual power-source element tethers 62T connecting individual power-source elements 62 to the power-source source wafer leaving at least a portion of an individual power-source-element tether 62T on individual power-source elements 62 in step 150. Wires 52 electrically connecting the component elements 90 are formed in step 160 to make an electronic circuit 42 having electrical conductors. The electrical conductors can be provided before or after the iLEDs 30, individual power-source elements 62, and controllers 40 are micro-transfer printed in step 150. Component 99 is then integrated into banknote 20 in step 170 to make a hybrid currency banknote 10 of the present disclosure. Hybrid currency banknote 10 can be further processed, for example by over coating or printing to provide environmental robustness, decoration, or to obscure the micro-transfer printed components 99.

Referring to FIG. 9, the hybrid currency banknote 10 of the present disclosure can be used by first receiving the hybrid currency banknote 10 in step 200, providing power to the hybrid currency banknote 10 in step 210, and viewing light emitted by the hybrid currency banknote 10 in step 220. Power can be provided by squeezing piezoelectric power source 60.

U.S. patent application Ser. No. 14/743,981, filed Jun. 18, 2015, entitled Micro-Assembled Micro LED Displays and Lighting Elements, incorporated herein by reference describes micro-transfer printing structures and processes useful with the present disclosure. For a discussion of micro-transfer printing techniques see also U.S. Pat. Nos. 8,722,458, 7,622,367 and 8,506,867, each of which is hereby incorporated by reference in its entirety. Micro-transfer printing using compound micro-assembly structures and methods can also be used with the present disclosure, for example, as described in U.S. patent application Ser. No. 14/822,868, filed Aug. 10, 2015, entitled Compound Micro-Assembly Strategies and Devices, which is hereby incorporated by reference in its entirety.

A simplified schematic of some embodiments of the present disclosure is illustrated in FIG. 10. As shown in FIG. 10, a power source 60 includes two parallel groups of four series-connected individual power-source elements 62 electrically connected to power connection 50 and the power convertor 64 and controller 40. Power convertor 64 and controller 40 can be a single component element 90, as shown, or include multiple different component elements 90 such as separate integrated circuits. Control current from power convertor 64 and controller 40 drives iLEDs 30 of display 80. In FIG. 10, power source 60 is a piezoelectric power source 60 comprising individual power-source elements 62. FIG. 11 illustrates an example power convertor 64 and controller 40 having a four-diode bridge rectifier and storage capacitor CR providing power from a piezoelectric power source 60 to a current limiter that, in turn, provides current to iLEDs 30. (Controller 40 can be powered by individual power-source elements 62 to control iLEDs 30 but individual power-source elements 62 are not illustrated in FIG. 11.)

Referring to FIG. 12, an individual power-source element 62 can include a dielectric layer such as a silicon nitride layer with a first metal layer providing an electrically conductive first connection post 69 or spike. A piezoelectric material layer is in electrical contact with the first metal layer and, on a side of the piezoelectric material layer opposite the first metal layer, a second metal layer is in electrical contact with a second metal layer and forms an electrically conductive second connection post 69 or spike. The individual power-source elements 62 of FIG. 12 can be micro-transfer printed onto two conductors (e.g., wires 52) so that the first and second connection posts 69 are in contact with the conductors. The first and second connection posts 69 can pierce or otherwise deform and adhere to the conductors after micro-transfer printing.

FIG. 13 illustrates the process of making a banknote 20 according to some embodiments of the present disclosure. A printed banknote 20 is provided together with a ribbon 70 having a component 99 comprising an array of micro-transfer printed iLEDs 30 electrically connected to a controller 40, a power convertor 64, and a power source 60 with wires 52. Ribbon 70 is laminated or otherwise integrated into banknote 20 to make a hybrid currency banknote 10. Ribbon 70 can be at least partially transparent to the frequency of emitted light, for example 50%, 60%, 70%, 80%, 90%, or 95% transparent. ILEDSs 30 can emit light through ribbon 70 or away from ribbon 70 through an encapsulation layer. This construction can protect component 99 from environmental or mechanical damage.

As shown in FIG. 14, a hybrid currency banknote 10 of the present disclosure having a piezoelectric power source 60 can be pressed or squeezed, for example, by a finger, to provide power to iLEDs 30 in a display 80, causing iLEDs 30 to emit light. Power can be provided both when pressing and releasing (hence the use of a bridge rectifier in FIG. 11). It has been demonstrated that fingertips having a one square cm area can provide a force of 35 N. Even with a smaller force of 10 N, a piezoelectric power source 60 with a total area of 0.06 cm$^2$ provides sufficient power to operate a piezoelectric hybrid document, according to some embodiments of the present disclosure, including digital control for iLEDs 30 sequencing, for example flashing. The array of individual power-source elements 62 can occupy a larger area (e.g., 0.5 cm$^2$ with a lower fill factor to provide apparent transparency and improved flexibility to the power source 60. A 20×20 array of 400 iLEDs 30 (for example, green-light-emitting iLEDs 30) can provide a readable display 80 in these conditions over a viewing angle of 140 degrees similar to displays found in body-worn electronic devices (e.g., watches, fitness trackers).

According to some embodiments of the present disclosure, a hybrid currency banknote 10 can have one or more energy output devices embedded in or on document substrate 10S. The one or more energy output devices can be one or more of one or more light-emitting elements, a sound-emitting element, and a vibration element. The sound-emitting element can be a piezoelectric speaker and the vibration device can be a piezoelectric device. The elements can be controlled, powered, hidden, constructed, or otherwise provided in ways similar to those of the light-emitting elements 30 discussed at greater length above. Such alternative energy output modalities can be useful for persons with impaired vision.

Memory 44 can store a variable value that can change over time, for example as the hybrid document 10 is used. For example, controller 40 can detect power provided by power source 60 as hybrid document 10 is used, for example detect patterns of use indicating functional codes. In some embodiments, memory 44 stores a binary state representing the value or validity of the hybrid document 10. For example, a banknote 20 can have an assigned value but, according to embodiments of the present disclosure, can be valid or invalid, depending on the state stored in memory 44, e.g., responsive to codes entered by using power source 60. A code can be a temporally successive sequence of presses (squeezes) in a predetermined rate, or rhythm (e.g., similar to a Morse code) that can be detected and used to modify the action of controller 40 and light emitted from iLEDs 30, or a value stored in memory 44. Thus, hybrid currency banknote 10 can be programmed, for example turned off (the state is invalid and hybrid currency banknote 10 is not legal tender) and turned on (the state is valid and hybrid currency banknote 10 is legal tender), specific values entered into memory 44, or a value in memory 44 modified. This capability is useful for controlling banknotes 20, for example during transportation and manufacture. Thus, currency or other documents can be invalidated if they are expected to be at risk, for example from theft, and then validated when the risk is no longer present.

If hybrid document 10 is a hybrid currency banknote 10, the state of hybrid document 10 can be in addition to a variable value or can be a value. For example, a hybrid currency banknote 10 can have a fixed nominal value that is valid (effectively legal tender at the nominal value) or invalid (not legal tender and an effective value of zero). Alternatively, the nominal value is not fixed and, when the hybrid currency banknote 10 is valid it has the variable value and when it is invalid it has an effective value of zero.

As with hybrid currency banknote 10 described above, light-controlling elements 30 of hybrid documents 10 can be light-emitting elements, light-reflecting elements, inorganic light-emitting diodes, organic light-emitting diodes, micro-electromechanical reflective elements, reflective electrophoretic elements, or reflective electrochromic display elements. The state of the hybrid document 10 can be indicated by lighting up or otherwise controlling one of the light-controlling elements 30. For example, a valid state can be indicated by flashing LEDs 30 or lighting up a sequence of light-controlling elements 30 in a linear or circular motion. An invalid state can be indicated by not showing light-controlling elements 30 as expected, by showing other light-controlling elements 30 (for example in a different color), or by showing light-controlling elements 30 in a different configuration or sequence. In some embodiments of the present disclosure, hybrid document 10 vibrates or emits acoustic signals, such as audible sounds, tones, or sequences of sound, for example in a melody using, for example, polymer piezo films or electrostatic speakers. A hybrid document 10 can include one or more output modes, for example a light-controlling mode or an acoustic mode, or both a light-controlling mode and an acoustic mode.

Inorganic light-emitting diodes (iLEDs) 30 can be horizontal diodes with iLED tethers 30T, as shown in FIG. 15. Similarly, controller 40 or power convertor 64 can comprise or be attached to a controller tether 40T or power-converter tether 64T, respectively, as shown in FIG. 16. A fractured or separated tether on or attached to a device indicates that the device was transfer printed (e.g., micro-transfer printed) from a source device wafer. For example, inorganic light-emitting diodes 30 can be micro-transfer printed from an inorganic light-emitting diode source wafer, controller 40 can be micro-transfer printed from a controller source wafer, individual power-source elements 62 can be micro-transfer printed from an individual power-source element source wafer, and power convertor 64 (if present and distinct from controller 40) can be micro-transfer printed from a power-convertor source wafer.

According to embodiments of the present disclosure and as illustrated in the perspective of FIG. 17, a power source 60 comprising individual power-source elements 62 is connected to power connection 50, e.g., a wire 52. Power source 60 can be disposed on component substrate 99S, for example by constructing power source 60 on component substrate 99S, e.g., with potassium sodium niobate (KNN), or by micro-transfer printing individual power-source elements 62 from an individual power-source elements source substrate to component substrate 99S.

As shown in the perspective of FIG. 17, power source 60 can comprise a plurality of electrically connected individual power-source elements 62. Individual power-source elements 62 can be electrically connected in series (as shown), in parallel, or in a combination of series and parallel. Component 99 can comprise a power convertor 64 disposed on component substrate 99S and connected to power connection 50. Power convertor 64 can be electrically connected to controller 40 or one or more inorganic light-emitting diodes 30, e.g., with wires 52. In some embodiments, power convertor 64 and controller 40 are a common device or circuit. Power convertor 64 converts the power provided from power connection 50 from power source 60 to a form that is used by controller 40 (if controller 40 is distinct from power convertor 64) or inorganic light-emitting diodes 30, or both.

In some embodiments of the present disclosure and as shown in FIG. 17, power convertor 64 comprises a unitary capacitor 67. In some embodiments, power convertor 64 comprises a disaggregated capacitor 67 comprising multiple capacitors 67 electrically connected in parallel, as shown in FIG. 18 and FIG. 20 with 32 individual capacitors 67 each 200 by 200 microns square. FIG. 20 is an electrical diagram of a simplified and illustrative circuit 42 for component 99. In some embodiments, power convertor 64 comprises a diode, as shown in FIG. 17. Thus, in some illustrated embodiments, power convertor 64 or controller 40, can include multiple elements (e.g., a capacitor, multiple capacitors, and a diode) that can be constructed and assembled separately of different materials. For example, capacitor 67 can be constructed on component substrate 99S (e.g., constructed of KNN) and the diode can be micro-transfer printed onto component substrate 99S from a diode source wafer. In some embodiments, power convertor 64 comprises any one or combination of these. A disaggregated structure for power convertor 64 or power source 60 can provide a more mechanically robust structure that can be at least somewhat flexed without cracking since the individual rigid component elements 90 are smaller and spatially separated. In embodiments illustrated in FIG. 17, power convertor 64 (comprising a capacitor 67 and diode) rectifies and stores charge generated by power source 60 until the charge exceeds the amount needed to pass through three inorganic light-emitting diodes 30, causing the inorganic light-emitting diodes 30 to emit light. The emitted light can flash or flash sequentially, for example under the control of controller 40. In some embodiments, power source 60 and at least some portions of power convertor 64 are constructed of common materials in common steps, for example using KNN using photolithographic methods and can be formed on component substrate 99S using photolithographic methods and materials.

As shown in FIG. 19, piezoelectric material 58 suitable for individual power-source elements 62 of power source 60 can comprise (K,NA)NbO3 (KNN) or lead zirconate titanate (PZT) or another piezoelectric material, for example having a thickness from 0.5 microns to 2 microns, that can be used to generate electrical power in response to mechanical stimulation (e.g., physical motion). In some embodiments, piezoelectric material of individual power-source elements 62 is formed in a solid, rigid structure having rectangular sides (for example a cube) disposed with a surface on and adhered to component substrate 99S. In some embodiments, individual power-source elements 62 only move with component substrate 99S, e.g., does not move independently of component substrate 99S. The electrical power is transmitted by first and second electrodes 54, 56 disposed on opposing sides of piezoelectric material 58 and transmitted (e.g., by electrically connected wires 52) to controller 40 or iLED(s) 30, or both. First and second electrodes 54, 56 can be a patterned metal, metal alloy, or can comprise layers of metal, for example 100 nm-500 nm of Ti/Au. Controller 40 can be an integrated circuit (e.g., a silicon CMOS integrated circuit). Controller 40 can be an integrated circuit or can be a simple circuit comprising one or more of a diode, rectifier, and bridge circuit, with or without capacitor(s) 67. Controller 40 and capacitor(s) 67 can receive and control the generated electrical power from individual power-source elements 62 and cause inorganic light-emitting diode(s) 30 to emit light.

Capacitor(s) 67 can comprise or be a same material as piezoelectric material 58, for example comprising first and second electrodes 54, 56 on either side of piezoelectric material. For example, in some embodiments, piezoelectric material 58 that is used for piezoelectric individual power-source elements 62 can be used for the dielectric in capacitor(s) 67. Thus, manufacturing costs can be reduced by providing capacitor(s) 67, portion(s) thereof, and individual power-source elements 62 in common deposition and patterning steps (e.g., a common patterned photolithographic deposition). Additionally, in some embodiments, terminals for capacitor(s) 67 can be formed in common deposition and patterning steps with first and second electrodes 54, 56. In some embodiments, capacitor(s) 67 can use different materials from individual power-source elements 62, for example using a different dielectric material formed in a different patterned deposition step.

Capacitor(s) 67 can have an area of 50×50 to 200×200 microns squared. iLEDs 30 can be horizontal or vertical LEDs 30, such as inorganic light-emitting diodes 30, and can have a size of 8×15 microns to 50×80 microns or larger. Individual power-source element 62, controller 40, iLED(s) 30, and, optionally, capacitor(s) 67, are at least a portion of (e.g., all of) a circuit 42 that emits light from iLEDs 30 in response to power received from (e.g. and generated by) individual power-source elements 62. Other devices can be included in circuit 42 beyond individual power-source elements 62, controller 40, light-emitting diode(s) 30, and capacitor(s) 67, for example if more complex control or power generation, management, or distribution is desired.

Certain embodiments of the present disclosure provide, inter alia, printable components 99 (e.g., micro-components or micro-modules) comprising a flexible component substrate 99S disposed on a flexible document substrate 10S (or other system substrate) in a flexible document 10 (or other flexible system). Such a flexible document 10 can exhibit greater operational robustness when stressed by mechanical bending, for example when in use. As used herein, a flexible material or structure can deform in response to mechanical stress and then return to its original shape when the mechanical stress is removed, e.g., the flexible material or structure is capable of demonstrating elastic deformation. Components 99 can comprise component elements 90 (e.g., micro-component elements or micro-devices) from respective different native source wafers 36 (as shown in FIG. 51B) comprising different materials, including semiconductors such as doped or undoped silicon or various doped or undoped compound semiconductors. Each component element 90 in component 99 can be made in the material that is best suited to the function of the component element 90. By including such component elements 90 together in a printable component 99, robust electrical, optical, or electrical and optical interconnections can be made that withstand normal use conditions of a flexible system (e.g., flexible document 10) that incorporates component 99. By using a flexible, organic, or polymer component substrate 99S for such a printable component 99, larger components 99 can be used that are less prone to mechanical degradation (e.g., breakage, cracking) or separation from an underlying flexible component substrate 99S (e.g., due to bending or folding of component substrate 99S). As just one example, component 99 that includes flexible component substrate 99S can be used in conjunction with a banknote 20 as a security feature for banknote 20 while better withstanding normal use of banknote 20 than a similar structure with a more rigid substrate. As used herein, a "printable component" is a component 99 or module that is capable of being printed (e.g., by micro-transfer printing) or has been printed to a destination or target substrate such as a flexible document substrate 10S.

According to some embodiments of the present disclosure and as illustrated in FIG. 21, a printable component 99 comprises a component substrate 99S, a component element 90 disposed on component substrate 99S, and at least a portion of a component tether 99T in contact with component substrate 99S. Component element 90 can be micro-transfer printed to component substrate 99S and can comprise a broken (e.g., fractured) or separated component-element tether 92. In some embodiments, at least a portion of a component tether 99T is a broken (e.g., fractured) or separated tether, for example if printable component 99 has been printed from a component source wafer 88, for example by micro-transfer printing as described further below. In some embodiments, at least a portion of a component tether 99T is a component tether 99T that physically connects printable component 99 to component source wafer 88. Component tether 99T can be in a common layer or can comprise common materials with component substrate 99S. Component tether 99T can extend (e.g., laterally) from component substrate 99S. In some embodiments, component tether 99T is in a different layer from component substrate 99S or comprises different materials from component substrate 99S. Component substrate 99S can be flexible and can comprise layers of organic or inorganic materials, or both organic and inorganic materials, that protect components 99 from environmental contaminants. In some embodiments, component-element tether 92 is component tether 99T, for example where component element 90 is disposed near an edge of component substrate 99S. In some embodiments, component substrate 99S comprises at least a portion of a component tether 99T. In some embodiments, component element 90 comprises at least a portion of a component tether 99T.

Component tether 99T can be directly or indirectly connected to (e.g., physically attached to or in contact with) component substrate 99S, for example attached to or protrude or extend (e.g., laterally) from a side or edge of a substantially planar component substrate 99S. For example, component tether 99T can be connected to (e.g., physically attached to or in contact with) an edge of component substrate 99S that extends in a direction different from a surface of component substrate 99S, for example a direction that is substantially orthogonal to a surface of component substrate 99S on which is disposed component element 90. Thus, component tether 99T can primarily extend in a direction substantially parallel with a component substrate 99S surface. Component tether 99T can directly or indirectly physically connect (e.g., attach) component substrate 99S to an anchor 94 of a component source wafer 88 (e.g., a component source wafer 88 discussed further below with respect to FIGS. 30A-30O). According to some embodiments, component tether 99T is broken (e.g., fractured or separated) as a consequence of transfer printing (e.g., micro-transfer printing) component 99 from component source wafer 88 to a system substrate 72 (discussed further subsequently). Thus, component tether 99T can be a broken (e.g., fractured) or separated tether.

Component element 90 can be an unpackaged component element 90, for example a bare die. Component element 90 can be an integrated circuit, for example a monocrystalline semiconductor integrated circuit such as a silicon integrated circuit or a compound semiconductor integrated circuit. Component element 90 can be an active component element (e.g., comprising transistors) or a passive component element (e.g., comprising capacitors, inductors, resistor, or conductors), or include both active and passive elements. Component element 90 can be a semiconductor device, a piezoelectric device, an acoustic filter, a color converter, a light-emitting diode, or a laser. Component element 90 can comprise multiple devices or elements or an assembly of devices or elements, for example having different functions (e.g., a controller and optoelectronic device) or having a same function with a different property (e.g., color of light emission). Such multiple devices or assembly of multiple devices can be interconnected into an electronic, optical, or optoelectronic circuit.

Component element 90 can be a micro-component (e.g., having a dimension such as length and/or width less than 1,000 microns (e.g., no greater than 500 microns) but for simplicity and brevity is described herein as a component element 90. In some embodiments, component element 90 can have a length or width, or both, no greater than 200 microns, (e.g., no greater than 100 microns, no greater than 50 microns, no greater than 20 microns, no greater than 10 microns, or no greater than 5 microns) and, optionally, a thickness no greater than 100 microns (e.g., no greater than 50 microns, no greater than 20 microns, no greater than 10 microns, or no greater than 5 microns).

A component-element tether 92 can be connected to (e.g., in contact with or attached to) component element 90, e.g., a broken (e.g., fractured) or separated component-element tether 92 resulting from transfer printing component element 90 from a component element 90 source wafer to component substrate 99S. For example, component-element tether 92 can be physically attached to, in contact with, or connected to an edge of component element 90 that extends in a direction different from a surface of component element 90, for example a direction that is substantially orthogonal to a surface of component substrate 99S on which is disposed component element 90. Thus, component-element tether 92 can primarily extend in a direction substantially parallel with the component substrate 99S surface.

According to some embodiments, component substrate 99S is flexible. Component substrate 99S can comprise an organic material. Component substrate 99S can be or comprise a polymer. Component substrate 99S can be or comprise a polyimide.

According to embodiments of the present disclosure, component 99 is micro-transfer printed from a component source wafer 88 to a system substrate 72 (e.g., ribbon 70) with a stamp 89 (discussed further below with respect to FIGS. 30A-30O). As part of some micro-transfer printing processes, a tether (e.g., component tether 99T) physically connects component 99 to an anchor 94 of component source wafer 88. Stamp 89 contacts component 99, adhering component 99 to stamp 89. Stamp 89 is removed from component source wafer 88 together with component 99, breaking (e.g., fracturing) or separating component tether 99T and moved to and in alignment with system substrate 72, where stamp 89 disposes component 99 on system substrate 72. System substrate 72 can comprise an adhesive layer to facilitate disposition and adhesion of component 99 on system substrate 72. Component element 90 can be similarly disposed on component substrate 99S by providing a component element 90 attached to component source wafer 88 with component-element tether 92, contacting component element 90 with stamp 89, removing stamp 89 from component source wafer 88 together with component element 90, breaking (e.g., fracturing) or fracturing component-element tether 92, disposing component element 90 on component substrate 99S with stamp 89, and removing stamp 89.

According to embodiments of the present disclosure, component substrate 99S is flexible. If component tether 99T was likewise flexible (e.g., comprising similar materials as component substrate 99S), component tether 99T may not break (e.g., fracture) as desired, but would instead bend as stamp 89 and component 99 are removed from component source wafer 88, inhibiting or preventing the removal of component 99 from component source wafer 88. Thus, in some embodiments, different materials are used for component tether 99T than for component substrate 99S. Further, according to certain embodiments of the present disclosure, component tether 99T is more brittle than component substrate 99S. For example, component tether 99T is less flexible than component substrate 99S, component tether 99T is stiffer than component substrate 99S, component tether 99T fractures more easily than component substrate 99S, or component tether 99T has a greater Young's modulus than component substrate 99S. In embodiments, component tether 99T can break (e.g., fracture) more readily than component substrate 99S when removed from component source wafer 88 with stamp 89, enabling component 99 removal from component source wafer 88. According to some embodiments, component substrate 99S has a first flexibility and component tether 99T has a second flexibility less than the first flexibility. Component tether 99T can comprise any one or combination of an organic material, a polymer, polyimide, a photoresist, an inorganic material, a crystalline inorganic material, an amorphous inorganic material, silicon oxide, or silicon nitride. In some embodiments, component substrate 99S comprises an organic material, a polymer that is more flexible than a polymer of component tether 99T.

According to some embodiments, and as shown in FIG. 22, component 99 can comprise an encapsulation layer 87 disposed over component element 90 (and, in some embodiments, any component-element tether 92), for example on (e.g., in contact with) or over component element 90 on a side of component element 90 opposite component substrate 99S. Portions of encapsulation layer 87 can be in direct contact with component substrate 99S. Encapsulation layer 87 can comprise similar or the same materials as component substrate 99S, for example organic materials, polymers, or a polyimide. Encapsulation layer 87 can have the same flexibility (or Young's modulus) as component substrate 99S or can be more or less flexible than component substrate 99S.

According to embodiments of the present disclosure, component element 90 is at least partly disposed in a mechanically neutral stress plane 85 of component 99. That is, in some embodiments mechanically neutral stress plane 85 of component 99 passes through component element 90. Thus, when component 99 is mechanically stressed, e.g., bent, folded, creased, spindled, twisted, or otherwise mechanically manipulated in a non-planar fashion, the mechanical stress on component element 90 is reduced, thereby enhancing the mechanical robustness of component 99 and reducing any propensity of component 99 to break or fracture in response to non-planar mechanical manipulation.

According to embodiments of the present disclosure and as illustrated in FIG. 23A, component 99 can comprise multiple component elements 90. Component elements 90 can be interconnected with interconnections 14 and, in some embodiments, interconnection vias 16, for example electrical, optical, or electro-optical interconnections or vias such as wires 52 (e.g., electrical traces) or light pipes 32. Interconnections 14 can be connected to component element 90 contact pads 24 through interconnection vias 16 or with electrodes 26 insulated from bare-die component elements 90 with dielectric structures 28, such as silicon dioxide or nitride. Component-element interconnections 14C can be disposed at least in part on or in encapsulation layer 87 and component-element interconnections 14M can be disposed at least in part on component substrate 99S. Component-element interconnections 14C and component-element interconnections 14M (collectively interconnections 14) can interconnect component elements 90. Interconnections 14 can be wavy or serpentine to resist fracturing when mechanically manipulated in a non-planar fashion.

As shown in FIG. 23B, interconnections 14 can affect the stiffness of encapsulation layer 87 or component substrate 99S and can be controlled (e.g., by varying thickness or width) to locate mechanically neutral stress plane 85 where desired, for example extending through component elements 90. According to some embodiments, encapsulation layer 87 can encapsulate component-element interconnections 14C to protect component-element interconnections 14C and further control the stiffness of encapsulation layer 87, for example by adjusting the thickness or composition of encapsulation layer 87. In some embodiments, component substrate 99S and encapsulation 87 together entirely encapsulate component 99. According to some embodiments, encapsulation layer 87 can comprise a lower encapsulation sublayer 87L disposed on component substrate 99S and component elements 90 and an upper encapsulation sublayer 87U can be disposed on lower encapsulation sublayer 87L. Component-element interconnections 14C can be disposed on lower encapsulation sublayer 87L on a side of lower encapsulation sublayer 87L opposite component substrate 99S. Upper encapsulation sublayer 87U can be disposed over or on (e.g., in contact with) component-element interconnections 14C and lower encapsulation sublayer 87L. In some embodiments, component-element interconnections 14C are disposed within lower encapsulation sublayer 87L. In some embodiments, component-element interconnections 14C are disposed within upper encapsulation sublayer 87U. In some embodiments, component-element interconnections 14C are disposed between upper and lower encapsulation sublayers 87U and 87L. Upper and lower encapsulation sublayers 87U and 87L can comprise the same or different materials (e.g., a polymer) and can be deposited by coating, for example spray, curtain, or spin coating.

According to some embodiments of the present disclosure and as shown in FIG. 24, component 99 can comprise a component structure 18 formed on component substrate 99S before or after component element 90 is disposed on component substrate 99S. Component structure 18 can be formed, for example, by photolithographic processing methods and materials. Component structure 18 can be or comprise, for example, an antenna, a capacitor, a resistor, an inductor, a light pipe 32 (e.g., a light guide or optical fiber), or an optical structure such as a reflector (e.g., mirror), refractor (e.g., lens), or diffractor. Component structure 18 can be interconnected with interconnections 14 (e.g., component-element interconnections 14M) to component elements 90 or to external devices, such as system controllers (not shown in the Figures), any or all of which can be functional elements enabling component 99 to operate and provide a desired function.

According to some embodiments of the present disclosure and as illustrated in FIGS. 25A-25D and FIG. 26, component substrate 99S can comprise multiple layers, for example organic component substrate layers 99SA disposed in alternation with inorganic component substrate layers 99SB. The multiple organic and inorganic component substrate layers 99SA and 99SB can provide chemical resistance to chemical contaminants (e.g., liquids or gases) as well as providing a mechanism for controlling the flexibility of component substrate 99S. For example, organic component substrate layer 99SA can be resistant to a contaminant that affects inorganic component substrate layer 99SB, or vice versa. Organic component substrate layers 99SA can be or comprise a polymer (e.g., a plastic), such as a polyimide, and inorganic component substrate layers 99SB can be or comprise oxides (e.g., silicon oxide or aluminum oxide), nitrides (e.g., silicon nitride), metals, ceramics, sapphire, or quartz.

As shown in FIG. 25A a single inorganic component substrate layer 99SB is disposed on a single organic component substrate layer 99SA. According to some embodiments, component element 90 is disposed on inorganic component substrate layer 99SB. FIG. 25B illustrates component substrate 99S comprising inorganic component substrate layer 99SB disposed between organic component substrate layers 99SA with component element 90 disposed on organic component substrate layer 99SA. FIG. 25C illustrates component substrate 99S with five alternating inorganic component substrate layers 99SB and organic component substrate layers 99SA with component element 90 disposed on the top organic component substrate layer 99SA adjacent to component element 90. FIG. 25D illustrates component substrate 99S with six alternating inorganic component substrate layers 99SB and organic component substrate layers 99SA with component element 90 disposed on the top inorganic component substrate layer 99SB adjacent to component element 90. Component element 90 can be disposed on inorganic component substrate layer 99SB and can serve as a dielectric surface on which component-element interconnections 14M (shown in FIG. 24) are disposed, for example by photolithography.

Organic component substrate layers 99SA can be thicker than inorganic component substrate layers 99SB, as shown in FIGS. 25A-25D. According to some embodiments, an organic component substrate layer 99SA is on a side of component substrate 99S opposite component element 90 and an inorganic component substrate layer 99SB is on a side of component substrate 99S adjacent to, in contact with, or adhered to component element 90. As illustrated in FIG. 26, component tether 99T can be or comprise a same material as inorganic component substrate layer 99SB and can be formed in a common step or disposed in a common layer with inorganic component substrate layer 99SB. According to some embodiments, component tether 99T is exclusively inorganic and component substrate 99S is only partially inorganic so that component tether 99T is more brittle and prone to fracture under non-planar mechanical stress than is component substrate 99S.

Organic component substrate layer 99SA can be flexible. Organic component substrate layer 99SA can be or comprise a polymer or can be or comprise polyimide. Inorganic component substrate layer 99SB can be flexible (but can be more or less flexible than organic component substrate layer 99SA) and can be or comprise an inorganic material such as silicon oxide (e.g., silicon dioxide) or silicon nitride. Material of inorganic component substrate layer 99SB can be less flexible than material of organic component substrate layer 99SA but can be disposed in a thinner layer than organic component substrate layer 99SA. Organic component substrate layers 99SA and inorganic component substrate layers 99SB can be formed and patterned using material deposition and patterning methods known in, for example, photolithography. In some embodiments, organic and inorganic component substrate layers 99SA and 99SB both comprise a same or different organic material or both comprise a same or different inorganic material.

As shown in FIG. 27A, according to some embodiments of the present disclosure, encapsulation layer 87 can comprise one or more organic and inorganic layers such as organic encapsulation layer 87A and inorganic encapsulation layer 87B. Any of the component substrate layer arrangements 99SA, 99SB shown in FIGS. 25A-25D can be applied to encapsulation layer 87. FIG. 27A illustrates encapsulation layer 87 comprising three alternating layers of organic encapsulation layers 87A and inorganic encapsulation layer 87B, with the top and bottom layers comprising organic encapsulation layers 87A (e.g., where the top layer is on a side of encapsulation layer 87 opposite component element 90 or component substrate 99S and the bottom layer is adjacent to or in contact with component element 90 or component substrate 99S. Each of upper and lower encapsulation sublayers 87U and 87L can comprise one or more layers, for example alternating layers, of organic encapsulation layers 87A and inorganic encapsulation layers 87B. Encapsulation layer 87 can comprise one or more same materials as component substrate 99S, either organic or inorganic. Where encapsulation layer 87 and component substrate 99S comprise only a single organic layer (e.g., a polyimide), both encapsulation layer 87 and component substrate 99S can comprise the same material. Where encapsulation layer 87 and component substrate 99S comprise alternating organic and inorganic layers, organic encapsulation layer 87A can be or comprise the same material as organic component substrate layer 99SA and inorganic encapsulation layer 87B can be or comprise the same material as inorganic component substrate layer 99SB. Component-element interconnections 14C can be disposed on, or interconnection vias 16 can be formed in, any one of organic or inorganic encapsulation layers 87A, 87B. Encapsulation layer 87 and component substrate 99S material composition, thickness, and sublayers can be arranged to provide mechanically neutral stress plane 85 where desired.

As illustrated in embodiments according to FIG. 27B, component-element interconnections 14C can be disposed on lower encapsulation sublayer 87L. In some embodiments, component-element interconnections 14C are disposed on organic encapsulation layer 87A or inorganic encapsulation layer 87B and electrically connected to component element contact pad 24 of component element 90 through interconnection vias 16 (e.g., as shown in FIGS. 23A, 23B). As shown in FIG. 27B, inorganic encapsulation layer 87B is a part of lower encapsulation sublayer 87L and component-element interconnections 14C (shown on the left side) are disposed within lower encapsulation sublayer 87L. Alternatively, inorganic encapsulation layer 87B could be a part of upper encapsulation sublayer 87U and component-element interconnections 14C (shown on the right side) disposed within upper encapsulation sublayer 87U. As illustrated in embodiments according to FIG. 27C, dielectric structures 28 can encapsulate and electrically insulate component element 90 (except for interconnection vias 16) and component-element interconnections 14C can be disposed at least in part on dielectric structures 28.

According to some embodiments of the present disclosure and as illustrated in the plan (top) view of FIG. 28, at least a portion of each of a plurality of component tethers 99T are in contact with or attached to component substrate 99S or encapsulation layer 87 (not shown). Some components 99 can be long and thin, for example comprising component elements 90 that are lasers. In some such embodiments, a flexible component substrate 99S once released from component source wafer 88 can sag and experience stiction between component substrate 99S and component source wafer 88, inhibiting picking component 99 from component source wafer 88 with stamp 89, as discussed below with respect to FIGS. 30A-30O. Additional component tethers 99T disposed around the periphery of component 99, especially along a long edge of component 99, can provide additional support to component 99, prevent or reduce stiction, and enable component 99 pickup by stamp 89. Such component tethers 99T can be offset from each other, for example with one at a first end on a first side and another at an opposing second end on an opposing second side, or oppose each other, for example with two at each end respectively on opposing sides or opposing pairs on opposing long sides of component 99 or component element 90.

Printable components 99 can be disposed on a system substrate 72 (e.g., a ribbon 70 or flexible substrate 10S) to form a component system 93, as shown in FIG. 29, for example by micro-transfer printing a component 99 from a component source wafer 88 (discussed below with respect to FIGS. 30A-30O) to system substrate 72. One or more components 99 can be disposed on system substrate 72 to form a printed component system 93. System substrate 72 can be a flexible substrate and can be more flexible than component substrate 99S and component substrate 99S can be more flexible than component elements 90. System substrate 72 can be paper, polymer, or a combination of paper and polymer. System substrate 72 can be a security paper, for example a banknote 20, or can be any one or combination of a security strip, Mylar", a holographic structure, a foil, a metalized surface, or an aluminized surface.

In rigid systems, a rigid component disposed on a larger rigid destination (target) substrate (e.g., system substrate 72) is not subject to as much mechanical stress as the rigid destination substrate since the rigid destination substrate is larger and force applied to the rigid system will be primarily applied to the rigid destination substrate. Even if a destination substrate is relatively flexible, if a rigid component disposed on the flexible destination substrate is sufficiently small, in some embodiments the amount of mechanical stress applied to the rigid component is relatively limited, particularly if the mechanical stress is applied manually, e.g., by a human hand, which can be relatively large compared to the rigid component 99, e.g., a micro-component 99. However, if a component 99 is comparable in size to something that can be felt, pressed, or manipulated by the human hand (for example no less than 0.2 mm or no less than 0.5 mm, it can be directly manually felt and stressed, for example by hand spindling or folding. In some such embodiments, a flexible component substrate 99S of a relatively flexible component 99 can survive the manual mechanical stress, and the smaller, more rigid component elements 90 can be protected from manual mechanical stress by the more flexible component substrate 99S that is less flexible than the destination substrate (e.g., system substrate 72). Therefore, according to embodiments of the present disclosure, component substrate 99S has a size that can be manually directly felt or mechanically stressed, for example having a size in the range of 200 microns to 500 microns or 500 microns to 1000 microns or larger. For example, component substrate 99S can have at least one of a length and a width greater than 200 microns (e.g., no smaller than 400 microns, no smaller than 500 microns, no smaller than 700 microns, or no smaller than 1000 microns, or larger). In contrast, more-rigid component elements 90 can be smaller than more-flexible component substrate 99S, for example no greater than 200 microns, 100 microns, 50 microns, 20 microns, or 10 microns in a length or a width dimension, or both, and can be less manually palpable than component 99, even if component element 90 is relatively rigid. According to embodiments, system substrate 72 is more flexible and larger than component substrate 99S and component substrate 99S is more flexible and larger than component elements 90 to provide a mechanically robust system resistant to environmental and mechanical abuse.

According to embodiments of the present disclosure and as illustrated in the flow diagram of FIG. 31 and the sequential structures of FIGS. 30A-30O, components 99 and component systems 93 can be constructed using photolithographic processes and micro-transfer printing. FIGS. 30A-30O have a greatly exaggerated height (e.g., thickness) for illustrative clarity. Generally, the layers illustrated are very thin relative to their length or width. Referring to step 300 of FIG. 31 and FIG. 30A, a component source wafer 88 is provided. Component source wafer 88 can be, for example, a semiconductor, glass, polymer, ceramic, sapphire wafer, or a wafer found in the integrated circuit or display industries and can have opposing substantially planar surfaces useful for photolithographic processing, material deposition, or micro-transfer printing. In step 305 and as shown in FIG. 30B, a sacrificial layer 95 is disposed on component source wafer 88, for example by evaporating a sacrificial material, such as germanium, over component source wafer 88. In step 315 a component substrate 99S is disposed on sacrificial layer 95, as shown in FIG. 30C, for example by spinning or spraying an organic material, such as a polyimide, over sacrificial layer 95. Component substrate 99S can be cured, completely or partially. Sacrificial layer 95 comprises materials that are selectively etchable with respect to component substrate 99S and component source wafer 88. Component substrate 99S can comprise multiple organic and inorganic component substrate layers 99SA, 99SB, for example relatively thicker polyimide layers alternating with relatively thinner silicon dioxide layers as shown in FIGS. 35A-35D and can enable selective etching by providing a suitable component substrate 99S layer adjacent to sacrificial layer 95.

Component substrate 99S and sacrificial layer 95 are both patterned and can be patterned together (for example in optional step 325) or separately, first in optional step 310 in which sacrificial layer 95 is patterned and then second in optional step 325 in which component substrate 99S is patterned, for example depending on which respective materials are used and available appropriate etchants. Component-element interconnections 14M can be disposed or patterned on component substrate 99S either before or after component substrate 99S and sacrificial layer 95 are patterned. For example, in step 320 component-element interconnections 14M can be disposed and patterned after component substrate 99S is deposited on sacrificial layer 95 in step 315 but before component substrate 99S and sacrificial layer 95 are patterned, as shown in FIG. 30D. In some embodiments, component-element interconnections 14M are patterned after either component substrate 99S is patterned or after sacrificial layer 95 is patterned in steps 310 or 325, or after both component substrate 99S and sacrificial layer 95 are patterned in steps 325 and 310 respectively. Step 320 and step 325 can be done in reverse order, step 310 can be done after step 320, and the deposition and patterning steps for component-element interconnections 14M can be separated in time by the component substrate 99S patterning in step 325. In some such embodiments, patterned component-element interconnections 14M are disposed on patterned component substrate 99S, which is disposed on patterned sacrificial layer 95, as shown in FIG. 30E.

According to some embodiments and as shown in FIG. 30F and FIG. 31, component-element source substrate(s) (wafers) are provided in step 330 and component elements 90 are transfer printed (e.g., micro-transfer printed) from the component-element source substrate to component substrate 99S in step 335. Because, in certain embodiments, component elements 90 can be micro-transfer printed, component elements 90 can comprise or be attached to a broken (e.g., fractured) or separated component-element tether 92. (Although not shown in the Figures, any of component-element interconnection 14M deposition, component-element interconnection 14M patterning, component substrate 99S patterning, or sacrificial layer 95 patterning can be done after or before component elements 90 are disposed on component substrate 99S. Additional or all component-element interconnection 14M patterning can be done after component elements 90 are transfer printed to electrically connect component elements 90. Those knowledgeable in photolithographic materials and processes will understand that the various steps of FIG. 31 and as illustrated in FIGS. 30A-30O can be done in different orders to form similar structures and embodiments of the present disclosure are not limited by the embodiments described herein.)

If desired, an encapsulation layer 87, for example a lower encapsulation sublayer 87L, can be disposed on or over component substrate 99S and over or on (e.g., directly over or on and in contact with) component(s) 99, for example as shown in FIG. 30G, in step 340, and can be disposed in separate lower and upper encapsulation sublayers 87L, 87U. If component-element interconnections 14C are desired, they can be formed over lower encapsulation sublayer 87L and can electrically connect to component element contact pads 24 on component elements 90 through interconnection vias 16, as shown in FIG. 30H in step 345. As shown in FIG. 30I, in step 350 upper encapsulation sublayer 87U is disposed over lower encapsulation sublayer 87L and any component-element interconnection 14C or interconnection vias 16 on or in lower encapsulation sublayer 87L. If no component-element interconnections 14C or component-element interconnections 14C encapsulation are desired, a single coating of encapsulation layer 87 can suffice to encapsulate component 99. Encapsulation layer 87 can comprise an organic material, for example the same material as a material of component substrate 99S, for example a polyimide, and can be spin or spray coated over component element 90 and component substrate 99S and partially or completely cured. In step 355 and as shown in FIG. 30J, encapsulation layer 87 is patterned with openings 48 that extend down to component source wafer 88. In some embodiments, component substrate 99S and sacrificial layer 95 can be patterned after encapsulation layer 87 is disposed and patterned, rather than in steps 310, 325 as illustrated in FIG. 31. Any of the etch steps can be performed by etching methods known in the photolithographic art, for example a dry etch, for example exposure to a plasma such as an oxygen plasma or a wet etch with a liquid etchant. Those skilled in photolithographic methods will understand that the patterning steps can be done at different steps in the overall process flows of embodiments of the present disclosure, and the disclosure is not limited by any particular embodiment.

In some embodiments comprising component tether 99T, once encapsulation layer 87, component substrate 99S, and sacrificial layer 95 are patterned to expose component source wafer 88 with openings 48, openings 48 are filled with an organic or inorganic material, e.g., a silicon oxide or silicon nitride material, in step 360 to form anchor/component tether structures 94, 99T as shown in FIG. 30K. In embodiments of the present disclosure that do not require an anchor/component tether structure 94, 99T, step 360 can be omitted. Sacrificial portions 96 are etched to release component elements 90 in step 365 and as shown in FIG. 30L, for example by exposure to $H_2O_2$ 30% or other etchants suitable for the material of sacrificial portions 96, leaving component elements 90 attached to component source wafer 88 with anchor/component tether structures 94, 99T. Thus, according to embodiments of the present disclosure, a component source wafer 88 comprises a component source wafer 88, a sacrificial layer 95 comprising sacrificial portions 96 laterally separated by anchors 94 disposed on component source wafer 88 or forming a layer of component source wafer 88, a component 99 disposed entirely on and directly over each sacrificial portion 96, and a component tether 99T connecting each component 99 to an anchor 94.

Components 99 can be micro-transfer printed from component source wafer 88 with a stamp 89 by contacting stamp 89 to component elements 90 to adhere components 99 to stamp 89, removing stamp 89 and components 99 from component source wafer 88, thereby fracturing component tether 99T (shown in FIG. 30M with a greatly exaggerated height for illustrative clarity), transferring stamp 89 and component elements 90 to a system substrate 72, and contacting component elements 90 to system substrate 72 (provided in step 370) with stamp 89 (shown in FIG. 30N), and removing stamp 89, leaving component elements 90 adhered to system substrate 72, in step 375 and as shown in FIG. 30O. Optionally, a flexible adhesive layer is disposed on system substrate 72 before disposing component elements 90 on system substrate 72. Optionally, components 99 are encapsulated on system substrate 72 with a flexible encapsulation layer 87, for example by laminating a sheet (e.g., a polymer or paper sheet) over component elements 90 and system substrate 72 or by inverting component system 93 and laminating inverted component system 93 onto the sheet. For example, system substrate 72 can be a foil or thread that is laminated onto a sheet that is a banknote 20 or other security document 20.

As shown in FIG. 32, step 355 can comprise roughening or patterning a surface of encapsulation layer 87, as well as forming opening 48 (as shown in FIG. 30J), for example to form anti-stiction structures 79. Such a roughened or patterned surface of encapsulation layer 87 on a side of encapsulation layer 87 opposite component substrate 99S can define a non-planar topography that is or has anti-stiction structures 79 that help to prevent components 99 from sticking to each other when removed from component source wafer 88. Anti-stiction structures 79 can be electrically insulating. The surface of encapsulation layer 87 can have such a topography as a result of coating component substrate 99S, component elements 90, component-element interconnection 14C, each of which can have a different height or thickness over component substrate 99S. In some embodiments, an exposed surface of encapsulation layer 87 can have such a topography as a result of exposing encapsulation layer 87 to a roughening agent such as an etchant or plasma, such as an oxygen plasma. In some embodiments, an exposed surface of encapsulation layer 87 can have such a topography as a result of photolithographic methods and materials intended to form structures, such as masking the surface, exposing the unmasked portions of the surface to an etchant, and stripping the mask to form defined anti-stiction structures 79, as shown in FIG. 32. Anti-stiction structures 79 can protrude, extend, or stick out from a surface of encapsulation layer 87 in a direction opposite component substrate 99S and can help to prevent components 99 from sticking to each other or other surfaces or structures when removed from component source wafer 88.

Figures 33A, 33B, 33C:
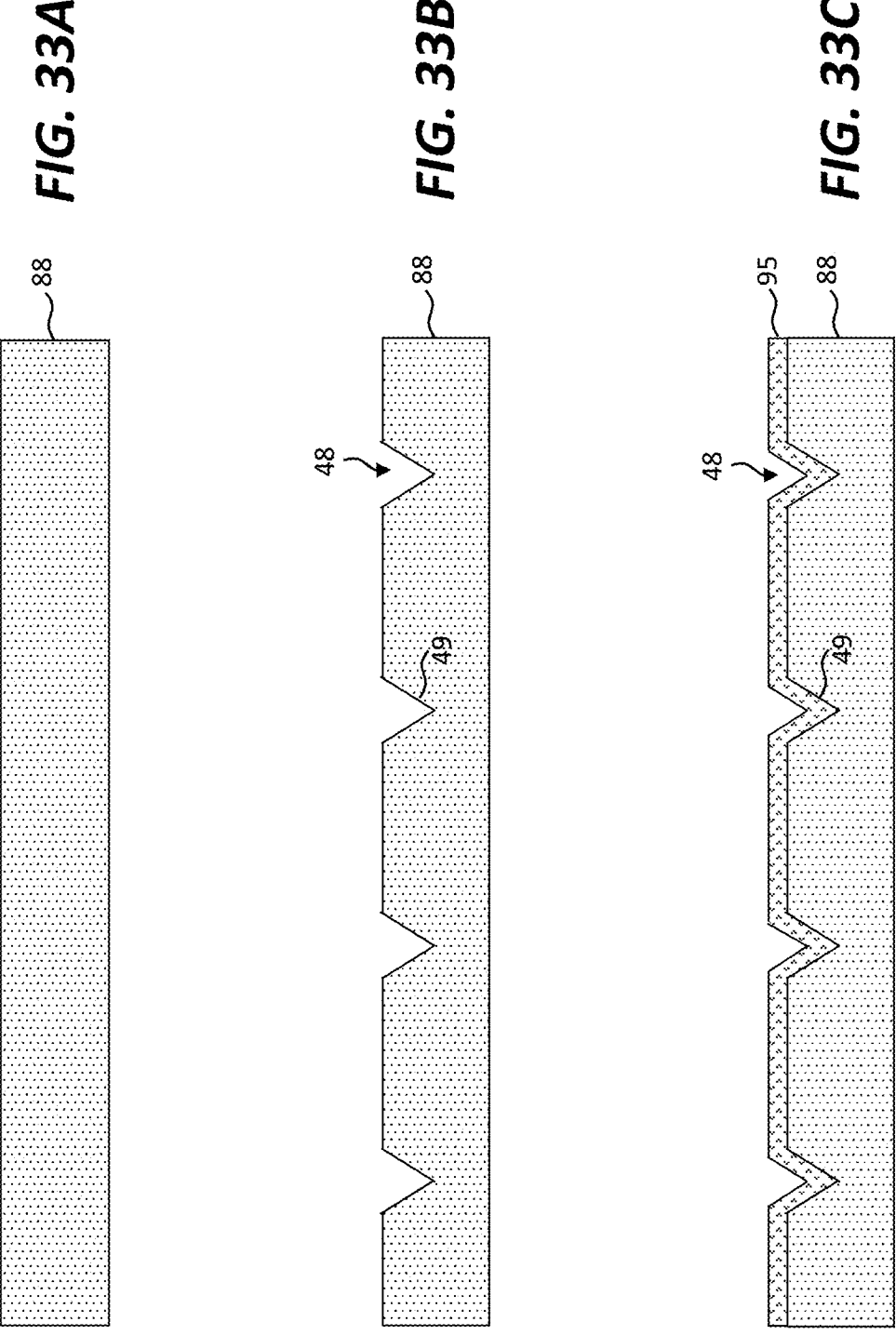
Figures 33D, 33E:
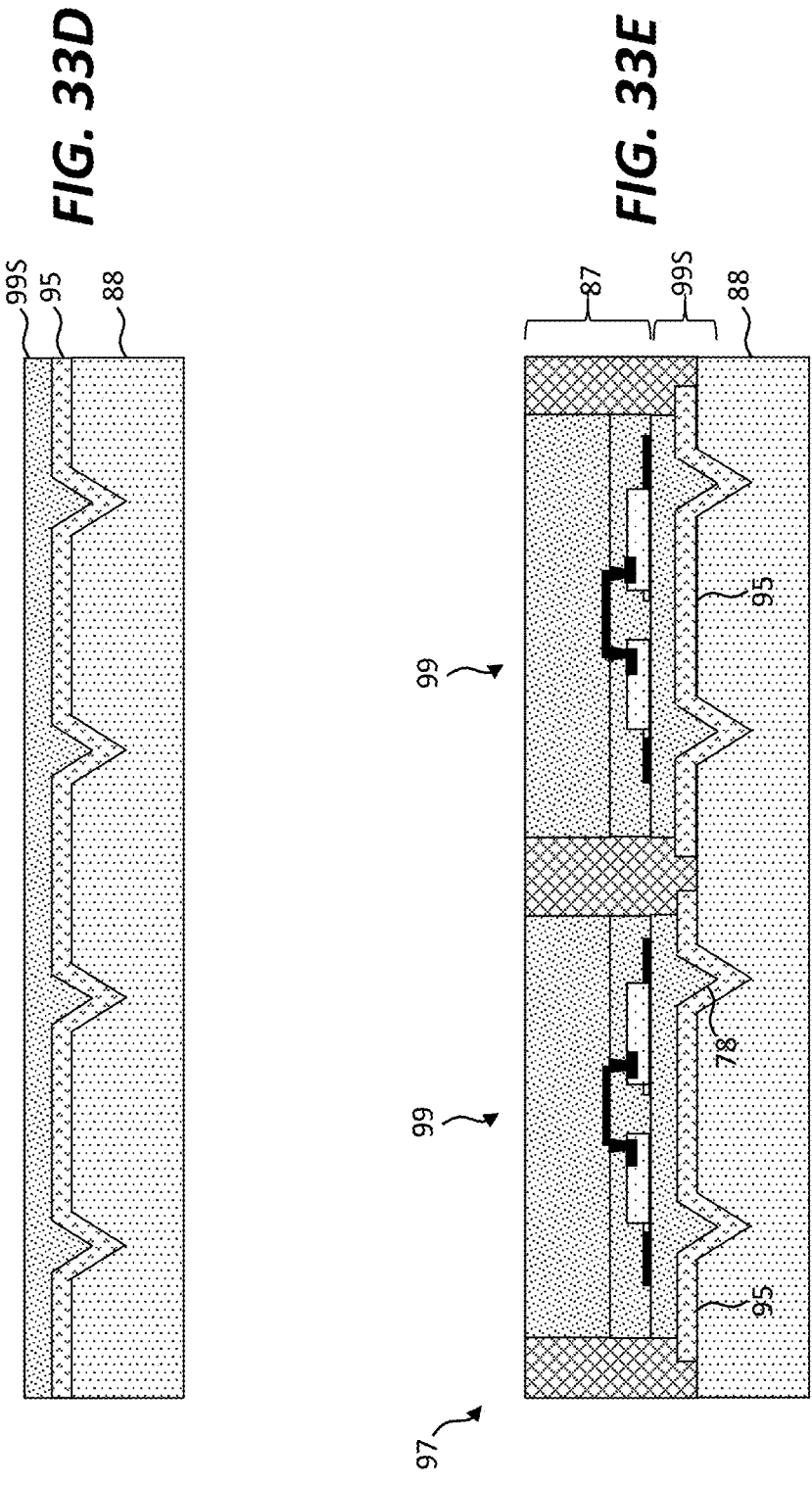

As also shown in FIG. 32, anti-stiction spikes 78 can protrude, extend, or stick out from a surface of component substrate 99S on a side of component substrate 99S opposite component element 90 and also help to prevent components 99 from sticking to each other when removed from component source wafer 88. Spikes 78 can be anti-stiction structures 79 and can be electrically insulating. Anti-stiction structures 79, 78 can comprise dielectric materials, for example organic materials such as polymers or inorganic materials such as silicon oxides or silicon nitrides. As shown in FIGS. 33A-s, spikes 78 can be formed by providing a component source wafer 88 (illustrated in FIG. 33A and equivalent to FIG. 30A in step 300) and making forms 49 in component source wafer 88 (illustrated in FIG. 33B). Forms 49 can have any shape made, for example, by photolithographic processing such as masked etching. In some embodiments, component source wafer 88 comprises crystalline materials (e.g., silicon) having planes that can be etched to form pyramidal structures. The structured surface of component source wafer 88 is coated with sacrificial layer 95, as illustrated in FIG. 33C and equivalent to FIG. 30B in step 305. As illustrated in FIG. 33D, a material of component substrate 99S is coated over structured sacrificial layer 95 (in step 315 and equivalent to FIG. 30C) and forms both spikes 78 and component substrate 99S. Thus, spikes 78 and component substrate 99S can be or comprise a common material and can be a single unified structure made in a common step. The remainder of the structures 30D-30O can be constructed as described in steps 310 and 320 to 375 to make components 99 with anti-stiction structures 79 and anti-stiction spikes 78. FIG. 33E illustrates a structure equivalent to FIG. 30K having a structured component substrate 99S.

As shown in FIGS. 34A and 34B, a structured component substrate 99S with anti-stiction spikes 78 can be constructed by coating component source wafer 88 with sacrificial layer 95 (as shown in FIGS. 30A and 30B in steps 300 and 305), and then forming structures in sacrificial layer 95, for example using photolithographic processing such as masked etching as illustrated in FIG. 34A. The structured sacrificial layer 95 is then coated with component substrate 99S (e.g., as shown in FIG. 30C in step 315). Successive structures corresponding to FIGS. 30D-30O can be made as described with respect to the flow diagram of FIG. 31. FIG. 35 illustrates spikes 78 and anti-stiction structures 79 in components 99 of component source wafer 88 separated by openings 48 (corresponding to FIG. 30J and step 355). In some embodiments, sacrificial layer 95 is a material, for example a polymer, coated, for example by spin, curtain, or spray coating, onto component source wafer 88 and openings 48 are formed by imprint lithography.

FIG. 35 also illustrates embodiments in which components 99 are not micro-transfer printed but are rather completely released from component source wafer 88 when sacrificial portions 96 are etched so that components 99 are not attached with component tethers 99T to anchors 94. Components 99 can be removed from component source wafer 88, or example by washing component source wafer 88, by blowing jets of gas onto micro-components 99, or by inverting component source wafer 88 so that components 99 fall away from component source wafer 88 under the influence of gravity, for example onto a system substrate 72. Anti-stiction structures 79 and spikes 78 can facilitate separation between component source wafer 88 and components 99 by keeping them from sticking together.

The schematic plan view of FIG. 36A and corresponding cross section of FIG. 36B (where FIG. 36A excludes component source wafer 88 for clarity) illustrate embodiments of the present disclosure in which component 99 incorporates an internal component cavity 15. Internal component cavity 15 is an opening in component substrate 99S where no part of component 99 is present so that internal component cavity 15 is a hole or void of arbitrary shape and size (less than a size of component substrate 99S) in component substrate 99S. Internal component cavity 15 extends entirely and all of the way through component substrate 99S. As shown in FIG. 36A, component elements 90, interconnections 14, and electrodes 26 can be disposed on component substrate 99S around internal cavity module 15. In embodiments in which component 99 is relatively large, for example having a length or width no less than 250 microns, 500 microns, 750 microns, or 1 mm and a flexible component substrate 99S, after undercutting the component 99 by etching sacrificial portions 96 leaving a gap 98 between component 99 and component substrate 40 (e.g., after step 365 of FIG. 31), flexible component substrate 99S can sag into gap 98, possibly touching component source wafer 88 or causing stiction between component substrate 99S and component source wafer 88 and making retrieval of component 99 by stamp 89 more difficult, as shown in FIG. 38B, discussed below. Internal component tethers 13 connected to flexible component substrate 99S and internal anchors 55 can be provided in internal component cavity 15 to support component 99 and prevent component 99 from sagging into gap 98 and causing stiction between component substrate 99S and component substrate 99S. Internal component tethers 13 can have the same attributes, construction, and materials as component tethers 99T (e.g., more brittle than component substrate 99S). Although not shown in FIG. 36B, spikes 78 can additionally be used to support component substrate 99S and prevent contact with component source wafer 88. Internal component cavity 15 can also facilitate etching sacrificial portions 96, with or without internal component tethers 13 and internal anchors 55, by enabling etchant ingress to sacrificial portion 96 to make gap 98. Thus, in some embodiments, component substrate 99S can comprise internal component cavity 15 even if no internal component tethers 13 are present. When component 99 is relatively large, etching all of sacrificial portion 96 under each component 99 can take longer than desired, slowing manufacturing processes and exposing component 99 and anchors 94 to an etchant for longer than can be desired and possibly harming them. By providing ingress for an etchant through internal component cavity 15 to sacrificial portion 96, etching time can be reduced, speeding manufacturing processes and reducing component 99 and anchor 94 exposure to the etchant, reducing costs and increasing component 99 reliability.

Therefore, in some embodiments of the present disclosure, a component 99 comprises component substrate 99S with component elements 90 disposed on component substrate 99S. Component substrate 99S comprises an internal component cavity 15 surrounded by component substrate 99S. In some embodiments, internal component tethers 13 in internal component cavity 15 physically connect component substrate 99S to internal anchors 55 in internal component cavity 15. Component 99 can be encapsulated, leaving open internal component cavity 15 or micro-component 99 can be completely encapsulated after component 99 is disposed on system substrate 72.

Figure 37A:
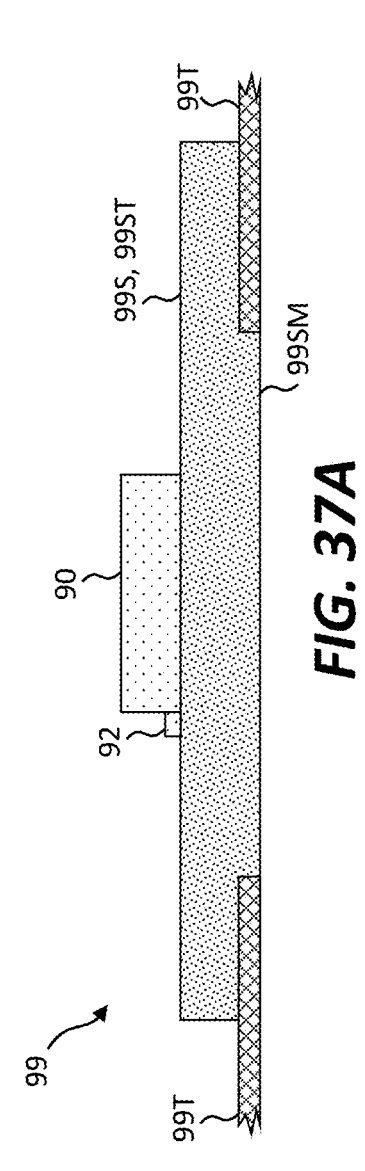
Figure 37B:
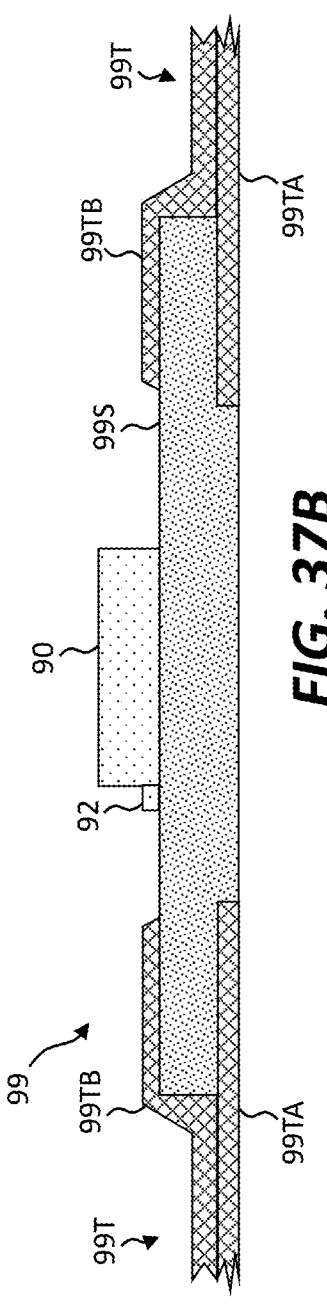

According to embodiments of the present disclosure and as illustrated in FIG. 37A, a useful component tether 99T for component 99 with a flexible component substrate 99S can comprise a component tether layer 99TA that extends on only a portion of a bottom side 99SM of component substrate 99S opposite component element 90 disposed on a top side 99ST of component substrate 99S, e.g., component tether layer 99TA extends beneath only a portion of component substrate 99S and extends beyond component substrate 99S. In some embodiments, and as shown in FIG. 37B component tether 99T can also extend over only a portion of component substrate 99S, e.g., component tether layer 99TB. As will be appreciated by those knowledgeable in the art, the terms over and under, above and below, and top and bottom are relative terms that can be exchanged depending on a perspective of an observer.

Component element 90 can comprise a broken component-element tether 92 as a consequence of micro-transfer printing component element 90 from a component-element source wafer to component substrate 99S. Component tether 99T can be broken (e.g., fractured) or separated as a consequence of micro-transfer printing component 99 from a component source wafer 88 to system substrate 72. Thus, according to embodiments, a component 99 can comprise component substrate 99S having a top side 99ST and an opposing bottom side 99SM and component element 90 disposed on component substrate top side 99ST of component substrate 99S. Component substrate 99S can be flexible, e.g., component substrate 99S can be relatively more flexible than relatively more rigid component element 90. Component tether 99T extends beyond component substrate 99S and component tether 99T also extends beneath at least a portion of component substrate 99S, e.g., component tether layer 99TA. Component tether 99T can provide mechanical support to component substrate 99S. Component 99 can comprise multiple (e.g., two or more) component tethers 99T, e.g., broken (e.g., fractured) or separated component tethers 99T, that can be disposed around a perimeter of component 99, for example disposed symmetrically or regularly around the perimeter. In some embodiments, and as shown in FIG. 37B, each of the two or more component tethers 99T extends beyond component substrate 99S and extends beneath only a portion of component substrate 99S. In some embodiments, component tether 99T comprises a component tether layer 99TA that extends beneath only a portion of component substrate 99S. In some embodiments, component tether 99T comprises a component tether layer 99TB that extends over only a portion of component substrate 99S. In some embodiments, component tether 99T comprises a component tether layer 99TA that extends beneath only a portion of component substrate 99S and comprises a component tether layer 99TB that extends over only a portion of component substrate 99S to form a bi-layer component tether 99T.

The portion of component tether 99T extending below component substrate 99S (e.g., component tether layer 99TA) can provide stability and support to component substrate 99S during component 99 release and printing from component source wafer 88. FIGS. 38A-B show a comparative example with reduced performance when component tether 99T does not extend beneath any portion of component substrate 99S. As shown in FIG. 38A, sacrificial portions 96 separated by anchors 94 of a sacrificial layer 95 comprising a source wafer (e.g., component source wafer 88) with micro-transfer printable components 99 disposed on a top surface of the source wafer can comprise an etchable material. Component substrate 99S is disposed entirely over and directly on (e.g., in direct contact with) sacrificial portion 96 and physically connected to anchors 94 with component tethers 99T. If component substrate 99S is flexible and component tether 99T extends only on component substrate top side 99ST of component substrate 99S, when etchable sacrificial portion 96 is etched to form a gap 98 (e.g., a volume that is not filled with a solid or liquid material and is either a vacuum or filled with a gas, such as atmosphere or an inert gas such as nitrogen), component substrate 99S can sag into gap 98 under the influence of gravity, capillary, or surface adhesion forces (such as electrostatic surface adhesion forces), as shown in FIG. 38B. Over time, flexible component substrate 99S and component source wafer 88 can come into intimate physical contact and result in stiction between flexible component substrate 99S and component source wafer 88. This stiction can inhibit or even prevent the removal of flexible component substrate 99S from component source wafer 88 by micro-transfer printing with a stamp 89. For example, under these circumstances the forces attracting component substrate 99S of component 99 to component source wafer 88 can be greater than the forces adhering component 99 to a stamp 89.

According to embodiments of the present disclosure and as illustrated in FIGS. 37A-37D and 39-41, component tether 99T extends beyond component substrate 99S and extends beneath only a portion of component substrate 99S. Component tether 99T does not extend entirely beneath flexible component substrate 99S because if component tether 99T did extend entirely beneath component substrate 99S, component tether 99T would effectively be a non-flexible (or at least more rigid) layer of component substrate 99S rendering component substrate 99S less flexible, which is undesirable for certain applications. However, component tether 99T extends under only a portion of component substrate 99S to support component substrate 99S and prevent, inhibit, or reduce stiction between component substrate 99S and component source wafer 88, for example as shown in FIG. 41 where sacrificial portion 96 is etched to form gap 98. Rigidity of component tether 99T, for example when it is made of an inorganic material, can therefore act to stabilize component substrate 99S while component 99 is on component source wafer 88 without interfering significantly with flexibility of component substrate 99S once printed (e.g., because component tether 99T extends under only a portion of component substrate 99S).

Furthermore, component tether 99T rigidity can also promote tether breaking (e.g., fracturing) during component 99 pickup with stamp 89 from component source wafer 88 to facilitate high-fidelity printing, whereas a tether made of flexible material may not break (e.g., fracture) at least under equivalent printing conditions (e.g., applied pressure and/or stamp speed after adhesion). Component tether 99T also extends beyond flexible component substrate 99S and physically attaches component substrate 99S to anchor 94 so that component tether 99T can break (e.g., fracture) when component 99 is removed from component source wafer 88 by stamp 89 during micro-transfer printing, as indicated by component-tether fracture area 99TF. A flexible material, such as polyimide, used in component substrate 99S can be difficult to fracture and therefore it can be preferred that component tether 99T does not comprise any portion of flexible component substrate 99S. A breakable (e.g., fracturable) portion of component tether 99T (e.g., component-tether fracture area 99TF) extends beyond flexible component substrate 99S to anchor 94 in a direction parallel to a major surface of component substrate 99S and the extent of component source wafer 88. Component tether 99T can be more rigid than component substrate 99S. For example, component tether 99T can comprise an inorganic material, for example an oxide, such as silicon dioxide, or a nitride, such as silicon nitride, and component substrate 99S can comprise an organic material such as a polymer, for example a polyimide.

FIG. 37A illustrates embodiments of the present disclosure in which only a portion of component tether 99T is disposed beneath only a portion of component substrate bottom side 99SM of component substrate 99S and there is no portion of component substrate 99S directly beneath component tether 99T so that a portion of component tether 99T is in direct contact with sacrificial portion 96 (prior to etching), for example as shown in FIGS. 39-40.

As shown in FIG. 37B, in some embodiments, component tether 99T comprises two component tether layers 99TA and 99TB (together forming component tether 99T in a tweezer shape). Component tether layer 99TA extends beneath component substrate 99S along a portion of its bottom side 99SM and component tether layer 99TB extends on a portion of top side 99ST of component substrate 99S. In some embodiments where component tether 99T comprises multiple layers, component tether 99T extends on only a portion of top side 99ST of component substrate 99S. In some embodiments where component tether 99T comprises multiple layers, component tether 99T extends beneath only a portion of bottom side 99SM of component substrate 99S. Component tether layers 99TA and 99TB can comprise a same material or different materials, for example inorganic materials such as silicon dioxide or silicon nitride. By "sandwiching" component substrate 99S between layers forming component tether 99T, additional stability can be imparted to component substrate 99S that is particularly useful for especially flexible component substrates 99S, such as polyimide substrates.

Figures 37C, 37D:
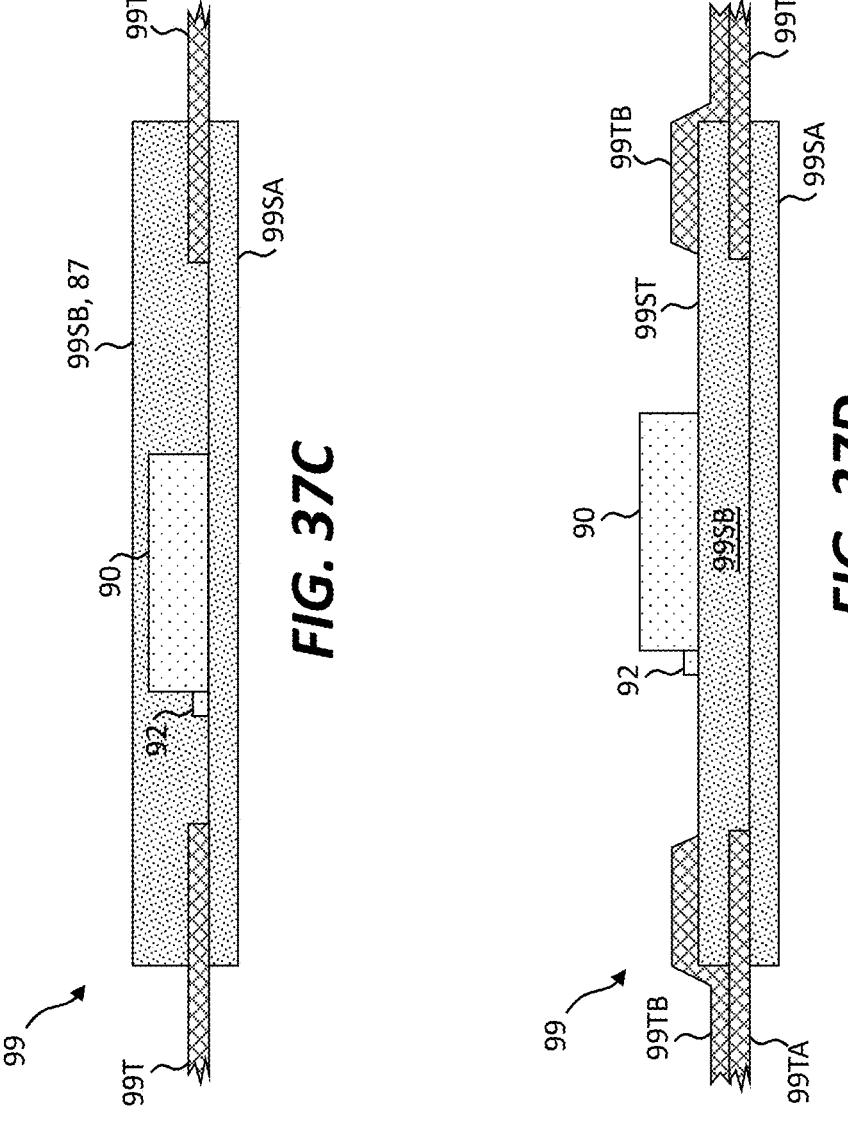

In some embodiments, and as illustrated in FIG. 37C, flexible component substrate 99S can comprise multiple layers, for example two component substrate layers 99SA and 99SB. Component substrate layer 99SA is disposed directly beneath a portion of component tether 99T and component substrate layer 99SB is disposed directly over component substrate layer 99SA and can, for example encapsulate component element 90 (e.g., as shown in FIG. 37G), providing environmental protection to component element 90. In some such embodiments, component tether 99T extends within only a portion of component substrate 99S. Component substrate layer 99SB can comprise a same material as component substrate layer 99SA. Component substrate 99S can comprise only component substrate layer 99SA or can comprise both component substrate layer 99SA and an encapsulation layer 87, such as component substrate layer 99SB when disposed over component element 90.

As shown in FIG. 37D, in some embodiments, component substrate 99S comprises multiple layers, for example two component substrate layers 99SA and 99SB (collectively component substrate 99S) and component tether 99T comprises two component tether layers 99TA and 99TB (collectively component tether 99T). Component tether layer 99TB extends on top side 99ST of component substrate 99S, as in FIG. 37B. Component tether layer 99TA extends within only a portion of component substrate 99S, as in FIG. 37C, e.g., between two component substrate layers 99SA and 99SB.

Figures 37E, 37F:
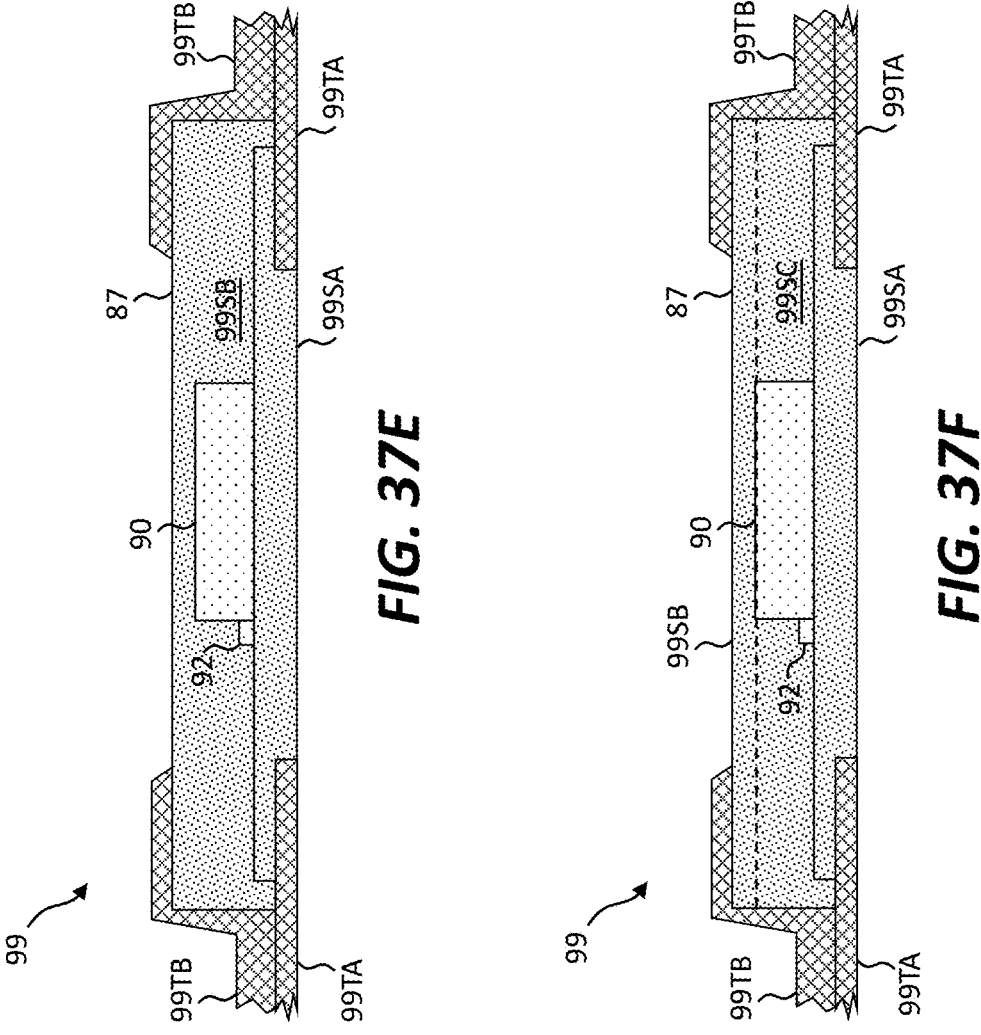
Figure 37G:
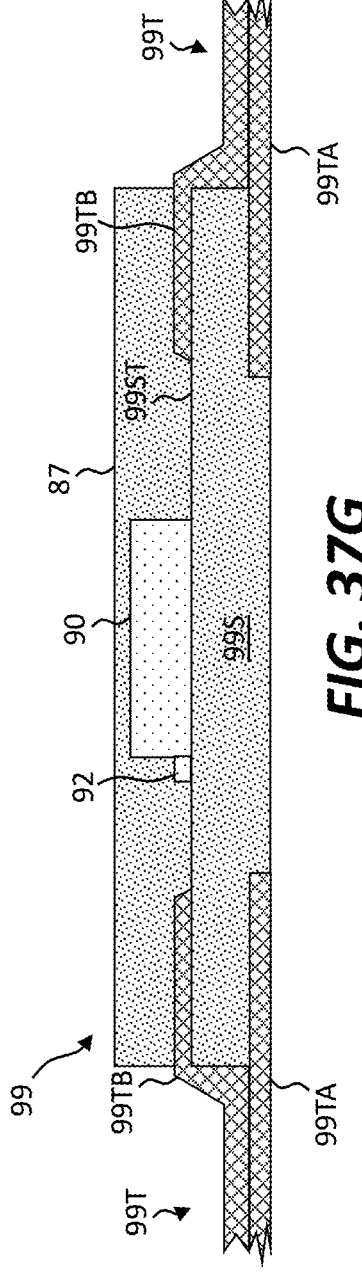

As shown in FIG. 37E, in some embodiments, component substrate 99S comprises multiple layers, for example two component substrate layers 99SA and 99SB (collectively component substrate 99S) and component tether 99T comprises two component tether layers 99TA and 99TB (collectively component tether 99T). A component substrate layer (e.g., 99SB) can also be an encapsulating layer 87. Component tether layer 99TA extends beneath only a portion of component substrate 99S and component tether layer 99TB extends on component substrate 99S, as in FIG. 37B. In some embodiments, and as shown in FIG. 37E, a portion of component substrate 99S is coplanar with at least a portion of component tether 99T whether or not component tether 99T extends beneath only a portion of component substrate 99S (which it does in FIG. 37E).

As shown in FIG. 37F, in some embodiments component substrate 99S comprises three component substrate layers 99SA, 99SB, 99SC, (collectively component substrate 99S), a layer beneath component elements 90 (e.g., component substrate layer 99SA), a layer disposed over component substrate layer 99SA planarizing component elements 90 (e.g., planarizing component substrate layer 99SC, which enables certain wire interconnections 14 between multiple component elements 90 with reduced step heights, for example as shown in FIG. 30H), and an encapsulating component substrate layer 99SB disposed over planarizing component substrate layer 99SC, component elements 90, and any wire interconnections 14 (e.g., as shown in FIG. 30I). The planarizing component substrate layer 99SC and encapsulating component substrate layer 99SB can comprise a same material, or different materials or the same material as component substrate layer 99SA.

As shown in FIG. 37G, in some embodiments, component tether 99T comprises two component tether layers 99TA and 99TB (collectively component tether 99T) and component 99 comprises encapsulation layer 87. Component tether layer 99TB extends on only a portion of top side 99ST of component substrate 99S and component tether layer 99TA extends beneath only a portion of bottom side 99SM of component substrate 99S. Encapsulation layer 87 encapsulates component element 90 and extends on only a portion of component tether 99T (e.g., only the portion of component tether 99T that extends on top side 99ST of component substrate 99S, as shown).

As shown in FIGS. 39-41, according to illustrative embodiments of the present disclosure, a component source wafer 88 comprises a wafer (e.g., component source wafer 88) and a sacrificial layer 95 comprising sacrificial portions 96 laterally separated by anchors 94 disposed on component source wafer 88 or forming a layer of component source wafer 88. A component substrate 99S and component element 90 is disposed directly on and entirely over each sacrificial portion 96. A component tether 99T is in physical contact with each component substrate 99S and is in physical contact with one of anchors 94, for example direct physical contact. In some embodiments, sacrificial portion 96 is etched to define a gap 98 between component 99 and component source wafer 88. According to embodiments of the present disclosure, sacrificial portion 96 is differentially etchable from component substrate 99S. Sacrificial portion 96 can be, for example germanium and component substrate 99S can be a polyimide. As shown in FIG. 41, after sacrificial portion 96 is etched to form gap 98, component substrate 99S can be curved due to gravity or surface material forces but is not in contact with component source wafer 88, for example due to stability provided by rigidity of component tether(s) 99T and can experience no or reduced stiction with component source wafer 88.

Therefore, in some embodiments of the present disclosure a method of making component source wafer 88 comprises providing a component source wafer 88 comprising a sacrificial layer 95 comprising sacrificial portions 96 separated (e.g., laterally separated) by anchors 94, disposing a component substrate 99S exclusively on and directly over each sacrificial portion 96, disposing a component element 90 on each component substrate 99S, component substrate 99S being equally flexible or more flexible than component element 90, and providing a component tether 99T connecting component substrate 99S to one of anchors 94. Component element 90 can comprise or be attached to component-element tether 92. Component substrate 99S can comprise an organic material. Component tether 99T can be more brittle than component substrate 99S. Some methods comprise disposing encapsulation layer 87 over component element 90 and component element 90. Component element 90 can be in a mechanically neutral stress plane 85 of component 99. Some embodiments comprise etching sacrificial portions 96 to release components 99 from component source wafer 88, leaving components 99 each attached by one or more component tethers 99T to one or more anchors 94. Some embodiments comprise transfer printing released component 99 to a system substrate 72 (e.g., a target substrate) with a stamp 89. Some embodiments comprise etching sacrificial portions 96 to release components 99 from component source wafer 88, leaving components 99 completely separated from and unattached to component source wafer 88. In some embodiments, system substrate 72 is no less flexible or is more flexible than component substrate 99S.

FIGS. 42A and 42B illustrate micro-transfer picking a component 99 from component source wafer 88. As shown in FIG. 42A, sacrificial portion 96 of component source wafer 88 (shown in FIG. 40) is etched to form gap 98 as in FIG. 41. A stamp 89, for example a soft and compliant stamp 89 (e.g., comprising an elastomer), contacts a top side of component 99 opposite gap 98 and adheres component 99 to stamp 89. Stamp 89 is removed from component source wafer 88 with component 99 adhered to stamp 89, as shown in FIG. 42B. Stamp 89 can then print removed component 99 to a destination target substrate. The pressure of stamp 89 can cause flexible component substrate 99S to bend but, at least in part because of component tethers 99T, physical and temporal contact and stiction between flexible component substrate 99S and component source wafer 88 is reduced or eliminated, improving the ability of stamp 89 to remove component 99 from component source wafer 88. Even if flexible component substrate 99S and component source wafer 88 come into contact during the stamp 89 picking process, the short contact time can be too brief and insufficiently intimate to counteract adhesion between stamp 89 and component 99. In contrast, a flexible component substrate 99S material such as a polyimide, e.g., without component tethers 99T according to embodiments of the present disclosure, that contacts component source wafer 88 for an extended length of time after sacrificial portion 96 is removed, can experience much stronger stiction to component source wafer 88. Component tethers 99T also reduce the area of any component substrate 99S contacting component source wafer 88 and provide multiple delamination fronts where component tethers 99T support component substrate 99S that aid in removing component 99 from component source wafer 88. Thus, methods of making a component 99 according to embodiments of the present disclosure can comprise providing a component source wafer 88, removing sacrificial portion 96, and removing component 99 from component source wafer 88 with stamp 89, thereby fracturing component tether 99T.

According to some embodiments of the present disclosure and as illustrated in FIGS. 43A-43C, sacrificial portion 96 (e.g., a peeling layer 96P) comprises a low-adhesion surface 96A on which component substrate 99S is at least partially disposed and from which component 99 is removed. In some embodiments, at least a portion of component tether 99T is also at least partially disposed on the low-adhesion surface 96A of sacrificial portion 96 (peeling layer 96P), for example as shown in FIG. 43A. In some such embodiments, because component substrate 99S is flexible (even if component element 90 and component tether(s) 99T are not) module micro-component 99 can be peeled from peeling layer 96P, bending component substrate 99S and breaking (e.g., fracturing) or separating component tether 99T from peeling layer 96P and anchors 94, as shown in FIG. 43B, for example by moving stamp 89 laterally (e.g., in a horizontal direction parallel to the surface of component source wafer 88 as shown with the arrow) as well as vertically upwards away from component source wafer 88 to remove component 99 from component source wafer 88, as shown in FIG. 43C. Thus, methods of making a component 99 according to embodiments of the present disclosure can comprise providing a component source wafer 88 and removing component 99 from component source wafer 88 with stamp 89 without etching sacrificial portion 96, thereby breaking (e.g., fracturing) component tether 99T. Some methods comprise providing a component source wafer 88 that comprises (i) a peeling layer 96P comprising peeling portions 96P laterally separated by anchors 94 disposed on component source wafer 88 or forming a layer of component source wafer 88 and (ii) a component substrate 99S and component element 90 disposed directly on and entirely over each peeling portion 96P and removing component 99 from component source wafer 88 with stamp 89 by peeling component substrate 99S off of peeling portion 96P from a corner or an edge of component substrate 99S.

Embodiments of the present disclosure have been constructed and micro-transfer printed. FIGS. 44-49 illustrate a component source wafer 88 with sacrificial portions 96, anchors 94, and components 99 having component tethers 99T at different magnifications. In some demonstrations, component source wafer 88 comprises silicon on which sacrificial portions 96 comprising 500-1500 nm (e.g., 550 nm) of germanium deposited by evaporation with openings for anchors 94, are patterned, for example by plasma dry etching. Silicon dioxide first component tether layers 99TA are deposited and patterned and first component substrate layers 99SA comprising 1-1.5 microns thick polyimide are spin coated and patterned, (e.g., using PI2600 series from HD MicroSystems). Thicker polyimide formulations, multiple spin coats, or both can be used to increase component substrate layer 99SA, 99SB thickness. Intermediate coats of polyimide can be used as a planarization layer and can also enable the formation of cavities or component wells to assist and facilitate subsequent heterogenous device integration.

Component elements 90 (e.g., silicon integrated circuits from a silicon component source wafer) are deposited on component substrate 99S (e.g., into component cavities 15 or component wells) by micro-transfer printing, optionally with a thin adhesive layer such as Intervia, followed by $O_2$ plasma field etch after printing to remove exposed adhesive. A four-micron thick second layer of a polyimide (e.g., component substrate layer 99SC) can be coated and patterned to planarize component elements 90, electrical connections between component elements 90 are formed on the planarization layer using photolithography, and a 1-1.5 micron thick third layer of polyimide is deposited to encapsulate component elements 90 (e.g., component substrate layer 99SB), for example as shown in FIG. 37F. Five microns of silicon dioxide are deposited and patterned over third component substrate layer 99SB to form second component tether layers 99TB and form anchors 94. Sacrificial portions 96 can be etched with $H_2O_2$ and components 99 can be picked up from component source wafer 88 with a PDMS stamp 89 or laminated against thin adhesive films and removed. FIGS. 44-49 correspond, for example, to the structures and methods illustrated in FIGS. 37F and FIGS. 40-42B.

Embodiments of the present disclosure are operable by providing power to interconnections 14 connected to component elements 90 and thereby energizing component elements 90 to perform a desired function. In some embodiments, component structures 18 absorb or transmute power (e.g., electromagnetic, mechanical, or electrical or magnetic field power) and provide the power to interconnections 14 to energize component elements 90. In some embodiments, component system 93 is mechanically perturbed or stressed without functionally damaging component 99 or component system 93.

According to embodiments of the present disclosure, sacrificial portions 96 comprise a sacrificial material that is an anisotropically etchable material, the sacrificial material is a same material as a material of component source wafer 88, or sacrificial portions 96 comprise a sacrificial material that is a different material that is differentially etchable from a material of component source wafer 88 and component substrate 99S. According to some embodiments, sacrificial material of sacrificial portions 96 comprises germanium. According to some embodiments component source wafer 88 comprises silicon, e.g., crystalline silicon, glass, polymer, ceramic, sapphire, quartz, or metal.

Micro-transfer printing enables the heterogeneous micro-assembly of component elements 90 (such as electrical, optical, acousto-optic, and electro-optic components and integrated circuits, for example compound semiconductor micro-lasers, silicon control circuits, and piezo-electric devices and electrically active or passive devices) into a common electronic, optical, acousto-optic, or electro-optic system, for example on a common system substrate 72 in an electronic, photonic, or radio frequency integrated system. In some embodiments, micro-component elements 90 are formed as coupons on sacrificial portions 96 laterally separated by anchors 94 disposed in a sacrificial layer 95 of a native component element 90 source wafer and can be micro-transfer printed from the native component element 90 source wafer with a stamp 89 (e.g., comprising a viscoelastic elastomer such as PDMS) using methods similar to those for micro-assembling components 99 onto system substrates 72 so that micro-component elements 90 can comprise broken (e.g., fractured) or separated component-element tethers 92. This process can be performed multiple times with different component elements 90 from different native component element 90 source substrates (wafers) to form a heterogeneous micro-assembly on component substrate 99S. Micro-component elements 90 can be disposed in desired spatial positions on component substrate 99S and electrically (or optically) connected using conventional photolithographic methods and materials, e.g., with patterned dielectric structures 28 and electrically conducting wires or light pipes 32 such as interconnections 14. For example, a compound semiconductor micro-laser, a light-emitting diode, or an optical micro-sensor can be printed on a component substrate 99S in close spatial proximity to a light-pipe or other optical micro-device and electrically connected to control circuits disposed in a silicon integrated circuit all micro-assembled on a common component substrate 99S. Similarly, a plurality of components 99 can be assembled on system substrate 72 with a variety of different components 99 comprising different materials, circuits, and functionalities to form a system.

A component source wafer 88 or substrate can be any of a wide variety of relatively flat, stable materials suitable for photolithographic or integrated circuit processing, for example glass, plastic, a crystalline semiconductor such as silicon, a compound semiconductor that comprises materials such as indium phosphide, gallium nitride or gallium arsenide, quartz, or sapphire, or any suitable substrate or wafer material.

Component elements 90 can be any useful structure that can be printed (e.g., micro-transfer printed) as part of printable component 99. Component element 90 can comprise any material or structure useful for the intended purpose of component elements 90. Component elements 90 can be electronic, mechanical, optical, or electro-optical structures, can be passive or active, or can be integrated circuits, electronic devices, optical devices, or optoelectronic devices. It is contemplated that there is no inherent limit to the type, function, or materials of component elements 90. Component elements 90 can be integrated circuits, lasers, light-emitting diodes, optical sensors, or light pipes 32, for example, or other light emitting, sensing, or controlling devices. In some embodiments, component elements 90 are, individually or together, electronic, optoelectronic, optical, processing, electromechanical, or piezoelectric devices or one or more components thereof. In some embodiments, active component elements 90, separately or when operated together, perform a desired electronic, optical, thermal, mechanical, magnetic, electric field, photonic, or opto-electronic function when provided with power (e.g., from a power source 60, such as a piezoelectric power source). Component elements 90 can be any one or more of, for example, integrated devices, integrated circuits (such as CMOS circuits), light-emitting diodes, photodiodes, sensors, electrical or electronic devices, optical devices, optoelectronic devices, magnetic devices, magneto-optic devices, magneto-electronic devices, transduction devices, and piezo-electric devices, or materials or structures thereof. Components 99 can comprise electronic component circuits that operate component elements 90. Component elements 90 can be micro-components, for example having a length or width, or both length and width less than 1 mm, no greater than 500 microns, no greater than 200 microns, no greater than 100 microns, no greater than 50 microns, no greater than 20 microns, or no greater than 10 microns. Component elements 90 can be micro-components with a thickness no greater than 5 microns, 10 microns, 20 microns, 50 microns, or 100 microns.

U.S. Pat. No. 7,799,699 describes methods of making micro-transfer-printable inorganic component elements 90, the disclosure of which is hereby incorporated by reference. Structures and elements in accordance with certain embodiments of the present disclosure can be made and assembled using micro-transfer printing methods and materials. For a discussion of micro-transfer printing techniques applicable to (e.g., adaptable to or combinable with) methods disclosed herein see U.S. Pat. Nos. 8,722,458, 7,622,367 and 8,506,867, the disclosure of each of which is hereby incorporated by reference. Methods of forming micro-transfer printable structures are described, for example, in the paper *AMOLED Displays using Transfer-Printed Integrated Circuits* (Journal of the Society for Information Display, 2011, DOI #10.1889/JSID19.4.335, 1071-0922/11/1904-0335, pages 335-341) and U.S. Pat. No. 8,889,485. Micro-transfer printing using compound micro-assembly structures and methods can also be used with certain embodiments of the present disclosure, for example, as described in U.S. patent application Ser. No. 14/822,868, filed Aug. 10, 2015, entitled Compound Micro-Assembly Strategies and Devices, the disclosure of which is hereby incorporated by reference in its entirety. Additional details useful in understanding and performing certain embodiments of the present disclosure are described in U.S. patent application Ser. No. 14/743,981, filed Jun. 18, 2015, entitled Micro Assembled LED Displays and Lighting Elements, the disclosure of which is hereby incorporated by reference in its entirety.

FIG. 50 shows a hybrid sheet 10 that is a hybrid document 10 such as a banknote 20. Hybrid document 10 includes a flexible substrate 10S. A non-native component 99 is disposed on flexible document 10. Component 99 includes a flexible component substrate 99S on which a controller 40, two inorganic light-emitting diodes (LEDs) 30, and a power source 60 that includes three individual piezoelectric power-source elements 62 are disposed. Controller 40, LEDs 30, and power source 60 (e.g., component elements 90) are non-native to component substrate 99S.

FIG. 51A illustrates component elements 90 from FIG. 50 in more detail. Component elements 90 can be printed using micro-transfer printing and can therefore each include a broken (e.g., fractured) or separated tether as a consequence of micro-transfer printing. For example, controller 40 can comprise a fractured (e.g., broken) or separated controller tether 40T as a consequence of micro-transfer printing controller 40 from a controller source wafer to component substrate 99S. LEDs 30 can comprise a fractured (e.g., broken) or separated iLED tether 30T as a consequence of micro-transfer printing LEDs 30 from an LED source wafer to component substrate 99S. Individual power-source elements 62 of power source 60 can each comprise a fractured (e.g., broken) or separated individual power-source-element tether 62T as a consequence of micro-transfer printing individual power-source elements 62 from a power-source-element source wafer to component substrate 99S.

FIG. 51B illustrates a generic source wafer 36 having sacrificial portions 96 spaced apart by anchors 94. A component element 90 (e.g., any of iLEDs 30, controllers 40, individual power-source elements 62) or component 99 with component substrate 99S is disposed entirely and directly over sacrificial portion 96 and physically connected to anchor 94 with a tether 38 (e.g., any of iLED tether 30T, controller tether 40T, individual power-source-element tether 62T, and component tether 99T as shown in FIG. 51A). In general, component elements 90 or components 99 can be formed in or on source wafer 36 directly and entirely over sacrificial portion 96 using photolithographic methods and materials that, when etched, forms a patterned tether 38 connecting the micro-transfer printable component element 90 or component 99 to an anchor 94. When transferred by a printing stamp 89 from source wafer 36 to a target substrate, such as ribbon 70 or document substrate 10S, tether 38 is fractured so that a micro-transfer printed component element 90 or component 99 has a fractured tether 38, as illustrated in FIG. 51B.

FIG. 52 shows a plan view of the hybrid sheet 10 shown in FIG. 50 with component 99. Electrical connections between controller 40, LEDs 30, and power source 60 are shown by wires 52. LEDs 30 are connected in parallel. The nine individual power-source elements 62 that are included in power source 60 are disposed in a 3×3 array and are electrically connected in series (e.g., with wires 52). FIG. 53 is a flow diagram illustrating a method of making a hybrid sheet 10, such as the one illustrated in FIGS. 50 and 52.

As shown in FIG. 53, a document 20 with a document substrate 10S with markings is provided in step 400. A power source wafer with individual power-source elements 62 is provided in step 410, a controller source wafer with controllers 40 is provided in step 420, an iLED source wafer with iLEDs 30 is provided in step 430, and a component source wafer 88 with component substrates 99S is provided in step 440. In step 450, each of individual power-source elements 62, iLEDs 30, and controller 40 are disposed (e.g., by micro-transfer printing) onto each component substrate 99S from their respective source wafers 36 and electrically connected in step 460, e.g., using wires 52 patterned using redistribution layer methods and materials such as copper, to form component 99. In step 470, component 99 is disposed (e.g., by micro-transfer printing or pick-and-place assembly methods) from component source wafer 88 to a ribbon 70 (or thread) that is subsequently integrated into document substrate 10S of document 20 (e.g., a banknote 20 or other security document 20). In some embodiments component 99 is directly integrated into document 20. In other embodiments, component 99 is integrated into a ribbon 70 and the ribbon integrated in document substrate 10S in step 480. As shown in step 490, individual power-source elements 62 of power source 60 can be squeezed or pressed, e.g., between fingers or with a finger against a hard surface such as a table or desk, to generate power provided by controller 40 to LEDs 30 to cause LEDs 30 to emit light, optionally with the assistance of power converter 64. Power converter 64 can convert a signal with a relatively high current and low voltage to a signal with a relatively high voltage and low current.

Referring to FIG. 54, in some embodiments of the present disclosure, a hybrid banknote 10 can be constructed by first providing a roll of film, for example Mylar® or polyimide. Components 99 are micro-transfer printed onto separated portions of the film. Alternatively, the different components 99 are micro-transfer printed onto the roll of film itself and processed photolithographically to complete components 99 so that the film serves as the component substrate 99S (not shown) and can be a common substrate for components 99. The roll of film is sprayed with a protective layer and an adhesive layer and slit into strips. Each strip is then cut into portions suitable for each banknote 20, applied to the banknote 20, and heated to complete the hybrid banknote 10.

In some embodiments, a component source wafer 88 with components 99 is diced to separate components 99, for example on a dicing tape, and components 99 are assembled onto document substrate 10S or ribbon 70.

As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between.

In this application, unless otherwise clear from context or otherwise explicitly stated, (i) the term "a" may be understood to mean "at least one"; (ii) the term "or" may be understood to mean "and/or"; and (iii) the terms "comprising" and "including" may be understood to encompass itemized components or steps whether presented by themselves or together with one or more additional components or steps.

Having described certain embodiments, it will now become apparent to one of skill in the art that other embodiments incorporating the concepts of the disclosure may be used. Therefore, the disclosure should not be limited to the described embodiments, but rather should be limited only by the spirit and scope of the following claims.

Certain embodiments of the present disclosure were described above. It is, however, expressly noted that the present disclosure is not limited to those embodiments, but rather the intention is that additions and modifications to what was expressly described in the present disclosure are also included within the scope of the disclosure. Moreover, it is to be understood that the features of the various embodiments described in the present disclosure were not mutually exclusive and can exist in various combinations and permutations, even if such combinations or permutations were not made express, without departing from the spirit and scope of the disclosure. The disclosure has been described in detail with particular reference to certain embodiments thereof, but it will be understood that variations and modifications can be effected within the spirit and scope of the claimed disclosure.

It should be understood that the order of steps or order for performing certain action is immaterial so long as operability is not lost. Moreover, two or more steps or actions can be conducted simultaneously. As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between.

PARTS LIST 10 hybrid currency banknote/hybrid banknote/hybrid document/hybrid sheet/flexible document
10S flexible substrate/document substrate
13 internal component tether
14 interconnection
14C component-element interconnection
14M component-element interconnection
15 component cavity
16 interconnection via
18 component structure
20 banknote/document
22 visible markings
24 component element contact pads
26 electrode
28 dielectric structure
30 light-controlling element/inorganic light-emitting diode/iLED/LED 30T iLED tether
32 light pipe
34 light leak/diffuser
36 source wafer
38 tether
40 controller
40T controller tether
42 circuit
44 memory
46 shield
48 opening
49 forms
50 power connection
52 wire
54 first electrode
55 internal anchor
56 second electrode
58 piezoelectric material
60 power source
62 individual power-source element
62T power-source-element tether
64 power converter
64T power-converter tether
67 capacitor
69 spike/connection post
70 ribbon
72 system substrate
78 spike/anti-stiction spikes
79 anti-stiction structures
80 display
82 red inorganic light-emitting diode
84 green inorganic light-emitting diode
85 mechanically neutral stress plane
86 blue inorganic light-emitting diode
87 encapsulation layer
87A organic encapsulation layer
87B inorganic encapsulation layer
87L lower encapsulation sublayer
87U upper encapsulation sublayer
88 component source wafer
89 stamp
90 component element
92 component-element tether
93 component system
94 anchor
95 sacrificial layer
96 sacrificial portion
96A low-adhesion surface
96P peeling portion/peeling layer
98 gap
99 component
99S component substrate
99SA component substrate layer/organic component substrate layer
99SB component substrate layer/inorganic component substrate layer
99SC component substrate layer
99ST component substrate top side
99SM component substrate bottom side
99T component tether
99TA component tether layer
99TB component tether layer
99TF component-tether fracture area
100 provide banknote with markings step
110 provide iLED wafer step
120 provide controller source wafer step 130 provide individual power-source element source wafer step
140 provide component source wafer step
150 micro-transfer print onto component substrate step
160 form wires on component substrate step
170 micro-transfer print component onto banknote step
200 receive banknote step
210 provide power to banknote step
220 view emitted light step
300 provide component source substrate step
305 dispose sacrificial layer step
310 optional pattern sacrificial layer step
315 dispose component substrate step
320 optional pattern component-element interconnections step
325 optional pattern component substrate step
330 provide component element source substrate step
335 micro-transfer print component elements step
340 dispose lower encapsulation layer step
345 optional pattern component-element interconnections step
350 dispose upper encapsulation layer step
355 pattern encapsulation layers step
360 dispose component tethers step
365 etch sacrificial portions step
370 provide system substrate step
375 micro-transfer print modules step
400 provide document with markings step
410 provide power source wafer step
420 provide controller source wafer step
430 provide iLED source wafer step
440 provide component substrate step
450 print onto component step
460 electrically connect component elements step
470 dispose component on ribbon step
480 integrate ribbon into bill step
490 squeeze power source step

What is claimed is:

1. A hybrid document, comprising:

a flexible document comprising a flexible document substrate having visible markings; and a component comprising:

a component substrate different from the flexible document substrate;

one or more inorganic light-emitting diodes disposed on the component substrate;

a controller disposed on or in the component substrate and electrically connected to the one or more inorganic light-emitting diodes for controlling the one or more inorganic light-emitting diodes;

a plurality of electrically connected individual piezoelectric power-source elements disposed on the component substrate, wherein the plurality of electrically connected individual piezoelectric power-source elements comprise a piezoelectric power source operable to provide electrical power and is electrically connected to the controller, the one or more inorganic light-emitting diodes, or both;

wherein (i) each of the one or more inorganic light-emitting diodes comprises a broken tether, (ii) the controller comprises a broken tether, (iii) the component substrate comprises a broken or separated tether, (iv) each of the plurality of electrically connected individual piezoelectric power-source elements comprises a broken tether, or (v) any one or combination of (i), (ii), (iii), and (iv); and wherein the component substrate is a flexible substrate that is more flexible than any one of the inorganic light-emitting diodes, the controller, and the individual piezoelectric power-source elements, wherein the component substrate is disposed on the flexible document substrate.

2. The hybrid document of claim 1, wherein the flexible document is more flexible than the component substrate.

3. The hybrid document of claim 1, further comprising electrically conductive wires disposed at least partly on the component substrate that electrically connect the piezoelectric power source to one or more of the inorganic light-emitting diodes and the controller.

4. The hybrid document of claim 3, wherein the electrically conductive wires are disposed exclusively on the component substrate and any one combination of the piezoelectric power source, the inorganic light-emitting diodes, and the controller.

5. The hybrid document of claim 1, wherein the component comprises a power converter disposed on the component substrate connected to the piezoelectric power source and connected to at least one of the controller and the one or more inorganic light-emitting diodes, wherein the power converter converts the electrical power provided from the piezoelectric power source to a form that is used by at least one of the controller and the inorganic light-emitting diodes.

6. The hybrid document of claim 5, wherein the power converter comprises (i) a unitary capacitor, (ii) a disaggregated capacitor comprising multiple capacitors electrically connected in parallel, (iii) a diode, or (iv) any one or combination of (i), (ii), and (iii).

7. The hybrid document of claim 1, wherein the flexible document substrate comprises paper, plastic, or impregnated paper.

8. The hybrid document of claim 1, wherein the plurality of electrically connected individual piezoelectric power-source elements are adjacent to each other on the component substrate.

9. The hybrid document of claim 1, wherein the plurality of electrically connected individual piezoelectric power-source elements are disposed on the component substrate within an area of from 0.1 cm$^2$ to 4.0 cm$^2$.

10. The hybrid document of claim 1, further comprising one or more light pipes located in association with the one or more inorganic light-emitting diodes to transmit light emitted by the inorganic light-emitting diode into the one or more light pipes and emit the transmitted light from the one or more light pipes.

11. The hybrid document of claim 1, wherein the one or more inorganic light-emitting diodes forms a display or a two-dimensional array.

12. The hybrid document of claim 1, wherein the component substrate comprises polyimide.

13. The hybrid document of claim 1, comprising a plurality of components, wherein each of the components comprises:

a respective component substrate different from the flexible document substrate;

one or more respective inorganic light-emitting diodes disposed on the respective component substrate;

a respective controller disposed on or in the respective component substrate and electrically connected to the one or more respective inorganic light-emitting diodes for controlling the one or more respective inorganic light-emitting diodes;

a plurality of electrically connected individual respective piezoelectric power-source elements disposed on the respective component substrate, wherein the plurality of electrically connected individual piezoelectric respective power-source elements comprise a respective piezoelectric power source operable to provide electrical power and is electrically connected to the respective controller, the one or more respective inorganic light-emitting diodes, or both;

wherein (i) each of the one or more respective inorganic light-emitting diodes comprises a respective broken tether, (ii) the respective controller comprises a respective broken tether, (iii) the respective component substrate comprises a respective broken or separated tether, (iv) each of the plurality of electrically connected individual piezoelectric respective power-source elements comprises a respective broken tether, or (v) any one or combination of (i), (ii), (iii), and (iv); and wherein the respective component substrate is a flexible substrate that is more flexible than any one of the respective inorganic light-emitting diodes, the respective controller, and the individual piezoelectric respective power-source elements, wherein the respective component substrate is disposed on the flexible document substrate.

14. The hybrid document of claim 13, wherein the plurality of components are arranged to form a pattern or graphic.

15. The hybrid document of claim 1, wherein the one or more light-emitting diodes comprises a plurality of light-emitting diodes that are arranged to form a pattern or graphic or wherein the one or more light-emitting diodes are in optical communication with a plurality of light pipes that are arranged to form a pattern or graphic.

16. The hybrid document of claim 1, wherein the component comprises a protective layer disposed over the one or more inorganic light-emitting diodes, the controller, and the power source.

17. The hybrid document of claim 16, comprising an adhesive disposed on the protective layer, wherein the adhesive adheres the component substrate to the flexible document substrate.

18. The hybrid document of claim 16, wherein the one or more light-emitting diodes are disposed to emit light through the protective layer.

19. The hybrid document of claim 16, wherein the one or more light-emitting diodes are disposed to emit light through the component substrate.

20. The hybrid document of claim 1, wherein at least the one or more light-emitting diodes are disposed between the flexible document and the component substrate.

21. The hybrid document of claim 1, comprising a component tether in physical contact with and extending from the component substrate.

* * * * *